United States Patent
Huitema et al.

(10) Patent No.: US 9,560,751 B2
(45) Date of Patent: Jan. 31, 2017

(54) SUPPORT STRUCTURES FOR AN ATTACHABLE, TWO-DIMENSIONAL FLEXIBLE ELECTRONIC DEVICE

(71) Applicant: POLYERA CORPORATION, Skokie, IL (US)

(72) Inventors: Hjalmar Edzer Ayco Huitema, Belmont, CA (US); Philippe Inagaki, Skokie, IL (US)

(73) Assignee: Polyera Corporation, Skokie, IL (US)

(*) Notice: Subject to any disclaimer, the term of this patent is extended or adjusted under 35 U.S.C. 154(b) by 0 days.

(21) Appl. No.: 14/850,327

(22) Filed: Sep. 10, 2015

(65) Prior Publication Data

US 2016/0037625 A1 Feb. 4, 2016

Related U.S. Application Data

(63) Continuation of application No. PCT/US2014/072172, filed on Dec. 23, 2014.
(Continued)

(51) Int. Cl.
*H05K 1/14* (2006.01)
*H05K 1/02* (2006.01)
(Continued)

(52) U.S. Cl.
CPC .............. *H05K 1/028* (2013.01); *G09F 9/301* (2013.01); *G09F 21/02* (2013.01); *G09F 21/026* (2013.01);
(Continued)

(58) Field of Classification Search
CPC .......... H05K 1/14; H05K 1/142; H05K 1/145; H05K 1/147; H05K 5/0291; H05K 1/144; H05K 2201/041; H05K 2201/042; H05K 2201/043; H05K 2201/045; H05K 2203/167; H05K 7/1454; H01R 23/7042; H01R 23/7047; H01R 12/71
(Continued)

(56) References Cited

U.S. PATENT DOCUMENTS

| 4,834,376 A | 5/1989 | Steinberg |
| 5,065,376 A | 11/1991 | Choulat |

(Continued)

FOREIGN PATENT DOCUMENTS

| CN | 101180669 A | 5/2008 |
| CN | 101180864 A | 5/2008 |

(Continued)

OTHER PUBLICATIONS

"3M Flexible Transparent Touchscreen Concepts" video located on the Internet at <http://www.youtube.com/watch?v=kCZz4jFok_o> (uploaded Jan. 6, 2011).

(Continued)

*Primary Examiner* — Binh Tran
(74) *Attorney, Agent, or Firm* — Karen K. Chan

(57) ABSTRACT

A dynamically flexible article or device, such as an armband, includes a flexible electronic component, such as a flexible electronic display, and a flexible support structure coupled to the flexible electronic component, wherein the flexible support and the flexible electronic component are flexible along two dimensions to thereby be able to conform to a complex curved surface. The flexible support includes bending limiting structure that constrains bending of the flexible electronic component to prevent undesirable bending.

18 Claims, 36 Drawing Sheets

Related U.S. Application Data

(60) Provisional application No. 62/089,115, filed on Dec. 8, 2014, provisional application No. 62/006,714, filed on Jun. 2, 2014, provisional application No. 62/003,549, filed on May 28, 2014, provisional application No. 61/979,668, filed on Apr. 15, 2014, provisional application No. 61/969,531, filed on Mar. 24, 2014, provisional application No. 61/920,705, filed on Dec. 24, 2013.

(51) Int. Cl.
| | | |
|---|---|---|
| *G09F 9/30* | (2006.01) | |
| *G09F 21/02* | (2006.01) | |
| *H05K 5/00* | (2006.01) | |
| *H05K 7/18* | (2006.01) | |
| *H05K 1/11* | (2006.01) | |
| *H01R 12/50* | (2011.01) | |
| *H05K 5/02* | (2006.01) | |

(52) U.S. Cl.
CPC .......... *H05K 1/0281* (2013.01); *H05K 5/0017* (2013.01); *H01R 23/7042* (2013.01); *H05K 1/14* (2013.01); *H05K 5/0291* (2013.01); *H05K 2201/029* (2013.01); *H05K 2201/041* (2013.01); *H05K 2203/167* (2013.01)

(58) Field of Classification Search
USPC .............. 361/679.21, 679.27, 749, 784, 785, 790,361/791, 801, 802, 803
See application file for complete search history.

(56) References Cited

U.S. PATENT DOCUMENTS

| | | |
|---|---|---|
| 5,438,488 A | 8/1995 | Dion |
| 5,438,851 A | 8/1995 | Geissbuhler |
| 5,644,858 A | 7/1997 | Bemis |
| 5,707,745 A | 1/1998 | Forrest et al. |
| 5,844,363 A | 12/1998 | Gu et al. |
| 5,930,026 A | 7/1999 | Jacobson et al. |
| 5,930,921 A | 8/1999 | Sorofman et al. |
| 6,097,147 A | 8/2000 | Baldo et al. |
| 6,134,965 A | 10/2000 | Somville |
| 6,196,932 B1 | 3/2001 | Marsh et al. |
| 6,212,133 B1 | 4/2001 | McCoy et al. |
| 6,303,238 B1 | 10/2001 | Thompson et al. |
| 6,369,865 B2 | 4/2002 | Hinata |
| 6,503,188 B1 | 1/2003 | August |
| 6,577,496 B1 | 6/2003 | Gioscia et al. |
| 6,585,914 B2 | 7/2003 | Marks et al. |
| 6,608,323 B2 | 8/2003 | Marks et al. |
| 6,750,607 B2 | 6/2004 | Huitema et al. |
| 6,831,769 B2 | 12/2004 | Holman et al. |
| 6,837,590 B2 | 1/2005 | Marston |
| 6,839,158 B2 | 1/2005 | Albert et al. |
| 6,991,749 B2 | 1/2006 | Marks et al. |
| 7,170,670 B2 | 1/2007 | Webber |
| 7,180,665 B2 | 2/2007 | Daniel et al. |
| 7,209,114 B2 | 4/2007 | Radley-Smith |
| 7,278,093 B2 | 10/2007 | Jablonski et al. |
| 7,374,702 B2 | 5/2008 | Marks et al. |
| 7,384,814 B2 | 6/2008 | Huitema et al. |
| 7,446,945 B2 | 11/2008 | Kuiper et al. |
| 7,453,452 B2 | 11/2008 | Huitema et al. |
| 7,528,176 B2 | 5/2009 | Marks et al. |
| 7,564,436 B2 | 7/2009 | Huitema et al. |
| 7,569,693 B2 | 8/2009 | Marks et al. |
| 7,605,225 B2 | 10/2009 | Marks et al. |
| 7,667,962 B2 | 2/2010 | Mullen |
| 7,671,202 B2 | 3/2010 | Marks et al. |
| 7,714,801 B2 | 5/2010 | Kimmel |
| 7,755,605 B2 | 7/2010 | Daniel et al. |
| 7,786,951 B2 | 8/2010 | Huitema et al. |
| 7,787,097 B2 | 8/2010 | Satoh |
| 7,787,917 B2 | 8/2010 | Aoki et al. |
| 7,816,480 B2 | 10/2010 | Marks et al. |
| 7,842,198 B2 | 11/2010 | Marks et al. |
| 7,892,454 B2 | 2/2011 | Facchetti et al. |
| 7,893,265 B2 | 2/2011 | Facchetti et al. |
| 7,902,363 B2 | 3/2011 | Facchetti et al. |
| 7,947,837 B2 | 5/2011 | Marks et al. |
| 7,956,820 B2 | 6/2011 | Huitema et al. |
| 7,965,258 B2 | 6/2011 | Aoki |
| 7,982,039 B2 | 7/2011 | Marks et al. |
| 8,017,458 B2 | 9/2011 | Marks et al. |
| 8,022,214 B2 | 9/2011 | Facchetti et al. |
| 8,077,283 B2 | 12/2011 | Van Veenendaal et al. |
| 8,097,877 B2 | 1/2012 | Marks et al. |
| 8,111,465 B2 | 2/2012 | Heikenfeld et al. |
| 8,117,903 B2 | 2/2012 | Golden et al. |
| 8,125,434 B2 | 2/2012 | Huitema et al. |
| 8,151,501 B2 | 4/2012 | Bemelmans et al. |
| 8,199,471 B2 | 6/2012 | Bemelmans et al. |
| 8,237,909 B2 | 8/2012 | Ostreko et al. |
| 8,279,166 B2 | 10/2012 | Huitema et al. |
| 8,325,143 B2 | 12/2012 | Destura et al. |
| 8,329,855 B2 | 12/2012 | Usta et al. |
| 8,334,545 B2 | 12/2012 | Levermore et al. |
| 8,358,275 B2 | 1/2013 | Huitema |
| 8,380,327 B2 | 2/2013 | Park |
| 8,395,150 B2 | 3/2013 | Marks et al. |
| 8,404,844 B2 | 3/2013 | Kastler et al. |
| 8,414,411 B2 | 4/2013 | Stites et al. |
| 8,440,828 B2 | 5/2013 | Quinn et al. |
| 8,446,549 B2 | 5/2013 | Huitema et al. |
| 8,466,851 B2 | 6/2013 | Huitema et al. |
| D686,217 S | 7/2013 | Andre |
| 8,474,146 B2 | 7/2013 | Hartford et al. |
| 8,477,250 B2 | 7/2013 | Schellingerhout et al. |
| 8,482,909 B2 | 7/2013 | Douglas |
| 8,493,714 B2 | 7/2013 | Visser et al. |
| 8,502,788 B2 | 8/2013 | Cho |
| 8,508,468 B2 | 8/2013 | Huitema |
| 8,508,920 B2 | 8/2013 | Huitema et al. |
| 8,514,213 B2 | 8/2013 | van Veenendaal et al. |
| 8,536,579 B2 | 9/2013 | Sele et al. |
| 8,537,104 B2 | 9/2013 | Markvoort et al. |
| 8,547,293 B2 | 10/2013 | Van Lieshout et al. |
| 8,547,325 B2 | 10/2013 | Huitema |
| 8,618,448 B2 | 12/2013 | Alexander |
| 2001/0004808 A1 | 6/2001 | Hurwitz |
| 2003/0197597 A1 | 10/2003 | Bahl et al. |
| 2004/0052044 A1 | 3/2004 | Mochizuki et al. |
| 2004/0189605 A1 | 9/2004 | Shih |
| 2004/0212968 A1 | 10/2004 | Lin |
| 2005/0110785 A1 | 5/2005 | Ochiai et al. |
| 2006/0020469 A1 | 1/2006 | Rast |
| 2006/0077127 A1 | 4/2006 | Sampsell et al. |
| 2006/0096392 A1 | 5/2006 | Inkster et al. |
| 2006/0132025 A1 | 6/2006 | Gao et al. |
| 2006/0204675 A1 | 9/2006 | Gao et al. |
| 2006/0209218 A1 | 9/2006 | Lee et al. |
| 2006/0238494 A1 | 10/2006 | Narayanaswami et al. |
| 2006/0262098 A1 | 11/2006 | Okamoto |
| 2006/0273304 A1 | 12/2006 | Cok |
| 2007/0120813 A1 | 5/2007 | Huitema et al. |
| 2007/0195067 A1 | 8/2007 | Zotov et al. |
| 2007/0205997 A1 | 9/2007 | Lieshout et al. |
| 2007/0279852 A1 | 12/2007 | Daniel et al. |
| 2008/0094314 A1 | 4/2008 | Huitema et al. |
| 2008/0100636 A1 | 5/2008 | Lai et al. |
| 2008/0150928 A1 | 6/2008 | Van Der Hoef et al. |
| 2008/0198184 A1 | 8/2008 | Schellingerhout et al. |
| 2008/0204367 A1 | 8/2008 | Lafarre et al. |
| 2008/0218369 A1 | 9/2008 | Krans et al. |
| 2008/0223746 A1 | 9/2008 | Van Rens et al. |
| 2008/0278472 A1 | 11/2008 | Huitema et al. |
| 2008/0291225 A1 | 11/2008 | Arneson |
| 2008/0316580 A1 | 12/2008 | Gillies et al. |
| 2009/0067123 A1 | 3/2009 | Huitema et al. |
| 2009/0122007 A1 | 5/2009 | Tsuzaki et al. |
| 2009/0189878 A1 | 7/2009 | Goertz et al. |

(56) References Cited

U.S. PATENT DOCUMENTS

| | | |
|---|---|---|
| 2009/0219225 A1 | 9/2009 | Cope |
| 2009/0251888 A1 | 10/2009 | Douglas |
| 2009/0267969 A1 | 10/2009 | Sakamoto |
| 2009/0296249 A1 | 12/2009 | van Lieshout et al. |
| 2010/0033435 A1 | 2/2010 | Huitema |
| 2010/0045705 A1 | 2/2010 | Vertegaal et al. |
| 2010/0050133 A1 | 2/2010 | Nishihara et al. |
| 2010/0117975 A1 | 5/2010 | Cho |
| 2010/0127965 A1 | 5/2010 | Park |
| 2010/0164973 A1 | 7/2010 | Huitema et al. |
| 2010/0194785 A1 | 8/2010 | Huitema et al. |
| 2010/0238612 A1 | 9/2010 | Hsiao et al. |
| 2010/0252112 A1 | 10/2010 | Watson |
| 2010/0259524 A1 | 10/2010 | Markvoort et al. |
| 2010/0283047 A1 | 11/2010 | Facchetti et al. |
| 2010/0295761 A1 | 11/2010 | van Lieshout et al. |
| 2010/0315225 A1 | 12/2010 | Teague |
| 2010/0320448 A1 | 12/2010 | Sele et al. |
| 2010/0326527 A1 | 12/2010 | Facchetti et al. |
| 2011/0043976 A1 | 2/2011 | Visser et al. |
| 2011/0048619 A1 | 3/2011 | Meinders et al. |
| 2011/0090155 A1 | 4/2011 | Caskey et al. |
| 2011/0109654 A1 | 5/2011 | Van Veenendaal et al. |
| 2011/0120558 A1 | 5/2011 | Facchetti et al. |
| 2011/0122593 A1 | 5/2011 | van Lieshout et al. |
| 2011/0124375 A1 | 5/2011 | Stuivenwold |
| 2011/0128260 A1 | 6/2011 | Huitema et al. |
| 2011/0128266 A1 | 6/2011 | Chiu et al. |
| 2011/0136333 A1 | 6/2011 | Facchetti et al. |
| 2011/0148797 A1 | 6/2011 | Huitema et al. |
| 2011/0187681 A1 | 8/2011 | Kim et al. |
| 2011/0227855 A1 | 9/2011 | Kim et al. |
| 2011/0256649 A1 | 10/2011 | Huitema et al. |
| 2011/0279442 A1 | 11/2011 | Hage et al. |
| 2012/0007796 A1 | 1/2012 | Jokinen et al. |
| 2012/0038861 A1 | 2/2012 | van Lieshout et al. |
| 2012/0083705 A1 | 4/2012 | Yuen et al. |
| 2012/0086691 A1 | 4/2012 | van Lieshout et al. |
| 2012/0105333 A1 | 5/2012 | Maschmeyer et al. |
| 2012/0122519 A1 | 5/2012 | Jochheim |
| 2012/0162088 A1 | 6/2012 | van Lieshout et al. |
| 2012/0182282 A1 | 7/2012 | van Veenendaal et al. |
| 2012/0188750 A1 | 7/2012 | Marston |
| 2012/0194448 A1 | 8/2012 | Rothkopf |
| 2012/0194478 A1 | 8/2012 | Liu et al. |
| 2012/0212433 A1 | 8/2012 | Lee et al. |
| 2012/0223314 A1 | 9/2012 | Marks et al. |
| 2012/0242599 A1 | 9/2012 | Seo et al. |
| 2012/0264489 A1 | 10/2012 | Choi et al. |
| 2012/0283799 A1 | 11/2012 | Fan |
| 2012/0314546 A1 | 12/2012 | Brewer et al. |
| 2012/0327048 A1 | 12/2012 | Ramrattan et al. |
| 2013/0005404 A1 | 1/2013 | Bremer |
| 2013/0010405 A1 | 1/2013 | Rothkopf et al. |
| 2013/0025647 A1 | 1/2013 | Bouten et al. |
| 2013/0027853 A1 | 1/2013 | Chen et al. |
| 2013/0038622 A1 | 2/2013 | Yang |
| 2013/0044215 A1 | 2/2013 | Rothkopf et al. |
| 2013/0054997 A1 | 2/2013 | Wyatt et al. |
| 2013/0058063 A1 | 3/2013 | O'Brien |
| 2013/0062598 A1 | 3/2013 | Usta et al. |
| 2013/0070431 A1 | 3/2013 | Fukuma et al. |
| 2013/0076612 A1 | 3/2013 | Myers et al. |
| 2013/0076649 A1 | 3/2013 | Myers et al. |
| 2013/0083496 A1 | 4/2013 | Franklin et al. |
| 2013/0106603 A1* | 5/2013 | Weast .............. G06F 1/163 340/539.11 |
| 2013/0113761 A1 | 5/2013 | van Lieshout et al. |
| 2013/0120106 A1 | 5/2013 | Cauwels et al. |
| 2013/0127690 A1 | 5/2013 | Tsai |
| 2013/0127748 A1 | 5/2013 | Vertegaal et al. |
| 2013/0127765 A1 | 5/2013 | Behdasht et al. |
| 2013/0128439 A1 | 5/2013 | Walters et al. |
| 2013/0131887 A1 | 5/2013 | Park |
| 2013/0141405 A1 | 6/2013 | Huitema et al. |
| 2013/0172068 A1 | 7/2013 | Zhou et al. |
| 2013/0197680 A1 | 8/2013 | Cobbett et al. |
| 2013/0219332 A1 | 8/2013 | Woley et al. |
| 2013/0222208 A1 | 8/2013 | Gorilovsky et al. |
| 2013/0222270 A1 | 8/2013 | Winkler et al. |
| 2013/0229373 A1 | 9/2013 | Eriksson et al. |
| 2013/0235008 A1 | 9/2013 | Kwon |
| 2013/0265257 A1 | 10/2013 | Jung et al. |
| 2013/0286466 A1 | 10/2013 | Lieshout et al. |
| 2013/0300779 A1 | 11/2013 | Van Baarsen et al. |
| 2013/0326790 A1 | 12/2013 | Cauwels et al. |
| 2013/0335929 A1 | 12/2013 | Cavallaro |
| 2014/0042406 A1 | 2/2014 | Degner et al. |
| 2014/0123436 A1 | 5/2014 | Griffin et al. |
| 2014/0138637 A1 | 5/2014 | Yang et al. |
| 2014/0226275 A1 | 8/2014 | Ko et al. |
| 2014/0257050 A1 | 9/2014 | Kuroda et al. |
| 2015/0084892 A1 | 3/2015 | Shirota et al. |
| 2015/0089974 A1 | 4/2015 | Seo et al. |
| 2015/0227245 A1 | 8/2015 | Inagaki et al. |

FOREIGN PATENT DOCUMENTS

| | | |
|---|---|---|
| DE | 202006012076 U1 | 10/2006 |
| EP | 1599110 A1 | 11/2005 |
| EP | 2551110 A1 | 1/2013 |
| FR | 2284149 A1 | 4/1976 |
| KR | 1256109 | 4/2013 |
| KR | 1278604 | 6/2013 |
| KR | 1301561 | 9/2013 |
| KR | 20150035232 A | 4/2015 |
| TW | M258364 U | 3/2005 |
| TW | M265636 U | 5/2005 |
| TW | 200815886 A | 4/2008 |
| WO | WO-2006027727 A1 | 3/2006 |
| WO | WO-2006/085271 A2 | 8/2006 |
| WO | WO-2007/023406 A2 | 3/2007 |
| WO | WO-2007/042987 A1 | 4/2007 |
| WO | WO-2008/054206 A2 | 5/2008 |
| WO | WO-2012/156804 A1 | 11/2012 |
| WO | WO-2013/138003 A1 | 9/2013 |

OTHER PUBLICATIONS

"Amazin Concept Holo Computer Elodie Delassus", Art, Concepts, Design, Gadgets, downloaded from the Internet at: <http://designskings.com/amazin-concept-holo-computer-elodie-delassus/> (Jan. 18, 2012).

"Athletics and their supporters", Enlightened®: Illuminated Clothing by Janet Hansen, downloaded from the Internet at <http://enlighted.com/pages/athletics.shtml> (Aug. 8, 2013).

"E-Clock", Tokyoflash Japn Product Design Studio, downloaded from the Internet at <http://blog.tokyoflash.com/2010/03/e-clock/> (Mar. 10, 2010).

"Features", SEG Sports Entertainment Gear, downloaded from the Internet at <http://www.segshirts.com/features> (Aug. 8, 2013).

"Flex Mobile, a Flexible Phone That Becomes a Bracelet, Some Other Wearable Piece of Gear", Concept Phones, downloaded from the Internet at <http://www.concept-phones.com/tag/carolina-rebelo/> (Apr. 19, 2011).

"Flexible Smart Phone Fluid Presented by Philips", YouTube, downloaded from the Internet at <http://www.youtube.com/watch?v=Wq9montNgbM&feature=player_detailpage> (Apr. 2, 2012).

"iPING Putter App Cradle Attachment Case for iPhone 5", Carlsbad Golf Center, downloaded from the Internet at <https://www.cgcgolfshop.com/p-50-iping-putter-app-cradle-attachment-case-for-iphone-5.aspx> (Aug. 8, 2013).

"Moment Smartwatch: World's First Wrap Around Smart Watch," Momentum Labs LLC, 28 pp. (Jun. 24, 2014).

"outEDGE iPhone 5 External 2800 mAH Battery Extender Case w/ Flip Screen Cover", outEDGEPOWER Products, downloaded from the Internet at <http://www.outedgepower.com/outedge-iphone-5-external-2800-mah-battery-extender-case-w-flip-screen-cover/> (Aug. 8, 2013).

(56) References Cited

OTHER PUBLICATIONS

"Philips unveils world's first 'Rollable Display' pocket e-Reader concept READIUS", PHYS.org website(Sep. 1, 2005).
"Rohm shows a flexible-OLED wristband", OLED-Info.com, downloaded from the Internet at <http://www.oled-info.com/rohm-shows-flexible-oled-wristband> (Oct. 5, 2009).
"Samsung concept video for wearables and phones", YouTube screenshot, downloaded from the Internet at <http://www.youtube.com/watch?v=ezriwGwJGOs> (Jul. 15, 2013).
"Samsung Galaxy X Concept Packs the Same Specs of teh Galaxy S II Plus a 12 MP Camera", Concept Phones website (May 15, 2011).
"Samsung Smart Watch Trademarks Filed, Wearable Internet Nearing Debut", Fox News Latino, downloaded from the Internet at <http://latino.foxnews.com/latino/money/2013/08/07/samsung-smart-watch-trademarks-filed-wearable-internet-nearing-debut/> (Aug. 7, 2013).
"Sony Smartwatch 2 goes official: water-resistant, open API", phoneArena.com, downloaded from the Internet at <http://www.phonearena.com/news/Sony-Smartwatch-2-goes-official-water-resistant-open-API_id44469> (Jun. 25, 2013).
"Taiwan Company to Begin Production of Large Format Flexible Electronic Paper Display Technology", Over the Wire, downloaded from the Internet at <http://www.naylornetwork.com/ppi-otw/articles/?aid=219054&issueID=29119> (Aug. 8, 2013).
"Thermal Image Athletic Apparel", Trendhunter Lifestyle, downloaded from the Internet at <http://www.trendhunter.com/trends/high-tech-athletic-apparel> (Mar. 16, 2013).
"Wearable Concept Phone is Not Nokia 888", Concept Phones, downloaded from the Internet at <http://www.concept-phones.com/tag/hyun-sung-lee/> (Jul. 18, 2008).
"What Will You Pop?", popSLATE, downloaded from the Internet at <http://www.popslate.com> (2012).
"Yuno Concept", TechPin, downloaded from the Internet at <http://www.techpin.com/yuno-concept/> (May 8, 2008).
Catacchio, "New OLED panel to bring bendable cell phones closer to reality?", TNW, downloaded from the Internet at <http://thenextweb.com/asia/2010/10/04/new-oled-panel-to-bring-bendable-cell-phones-closer-to-reality/> (Oct. 4, 2010).
Cochrane et al., "Flexible displays for smart clothing: Part I—Overview", Indian Journal of Fibre & Textile Research, 36:422-8 (Dec. 2011).
Cooper, "Hands-on with Polymer Vision's e-ink Readius", engadget, downloaded from the Internet at <http://www.engadget.com/2008/02/14/hands-on-with-polymer-visions-e-ink-readius/> (Feb. 14, 2008).
Crisp, "Rafael Nadal demonstrates Babolat Play & Connect interactive tennis racquet", gizmag, downloaded from the Internet at <http://www.gizmag.com/rafael-nadal-demonstrates-babolat-play-connect-interactive-tennis-racquet/22699/> (May 26, 2012).
Eaton, "Nokia Morph Cellphone Rolls Up, Stretches, Cleans Itself", GIZMODO, downloaded from the Internet at <http://gizmodo.com/360260/nokia-morph-cellphone-rolls-up-stretches-cleans-itself> (Feb. 25, 2008).
Fingas, "Tentative Samsung smartwatch design unearthed in Korean patents", engadget, downloaded from the Internet at <http://www.engadget.com/2013/08/03/tentative-samsung-smartwatch-designs-unearthed-in-korean-patents/> (Aug. 3, 2013).
Honig, "Pebble smartwatch review", engadget, downloaded from the Internet at <http://www.engadget.com/2013/01/25/pebble-smartwatch-review/> (Jan. 25, 2013).
Inofuentes, "Officially announced: LG G Flex and a healing factor", ars technica, downloaded from the Internet at <http://arstechnica.com/gadgets/2013/10/officially-announced-lg-g-flex-and-a-healing-factor/> (Oct. 28, 2013).
International Search Report and Written Opinion, International Application No. PCT/US14/50972, mailed Jan. 14, 2015.
International Search Report and Written Opinion, International Application No. PCT/US14/52814, mailed Dec. 11, 2014.
International Search Report and Written Opinion, International Application No. PCT/US14/52957, mailed Dec. 9, 2014.
International Search Report and Written Opinion, International Application No. PCT/US14/71859, dated Mar. 20, 2015.
International Search Report and Written Opinion, International Application No. PCT/US14/72172, mailed Mar. 18, 2015.
International Search Report and Written Opinion, International Application No. PCT/US2014/055043, mailed Jan. 27, 2015.
International Search Report and Written Opinion, International Application No. PCT/US2014/072313, mailed Apr. 22, 2015.
International Search Report and Written Opinion, International Application No. PCT/US2014/072328, dated Apr. 22, 2015.
International Search Report and Written Opinion, International Application No. PCT/US2015/014964, mailed May 14, 2015.
International Search Report and Written Opinion, International Application No. PCT/US2015/022691, mailed Jul. 8, 2015.
International Search Report and Written Opinion, International Application No. PCT/US2015/026163, mailed Jul. 20, 2015.
International Search Report and Written Opinion, International Application No. PCT/US2015/030254, mailed Aug. 10, 2015.
International Search Report and Written Opinion, International Application No. PCT/US2015/030724, mailed Aug. 14, 2015.
International Search Report and Written Opinion, International Application No. PCT/US2015/032799, mailed Aug. 31, 2015.
Johan, "ASUS Waveface Ultra", techfresh.net, downloaded from the Internet at <http://www.techfresh.net/asus-waveface-ultra/> (Jan. 19, 2010).
Kahn, "Is Apple's iWatch a slap wrist band with a flexible display?", 9to5Mac Apple Intelligence, downloaded from the Internet at <http://9to5mac.com/2013/02/21/is-apples-iwatch-a-slap-wrist-band-with-a-flexible-display/> (Feb. 21, 2013).
Kaki, "10 Beautiful Nokia Concept Phones for Future Generations", DreamsRain website, downloaded from the Internet at <http://www.dreamsrain.com/2011/09/18/10-beautiful-nokia-concept-phones-for-future-genrations/> (Sep. 18, 2011).
Kelvin, "Apple iBand Envisioned by T3: Health Features, Fitness and Watch Functions (Video)", Concept Phones, downloaded from the Internet at <http://www.concept-phones.com/apple/apple-iband-envisioned-t3-health-features-fitness-watch-functions-video/> (Feb. 18, 2014).
Kelvin, "Apple iWatch 2 Concept by Jermaine Smit Lets You Change the Watch Bracelet Easily (Video)", Concept Phones, downloaded from the Internet at <http://www.concept-phones.com/apple/apple-iwatch-2-concept-jermaine-smit-lets-change-watch-bracelet-easily-video/> (Mar. 5, 2014).
Kelvin, "Apple iWatch Concept Goes Back to Basics, Looks Like Nike Fuelband", Concept Phones, downloaded from the Internet at <http://www.concept-phones.com/apple/apple-iwatch-concept-basics-nike-fuelband/> (Oct. 22, 2013).
Kelvin, "Apple iWatch Glass Hologram is an Overpowered Smartwatch (Video)", Concept Phones, downloaded from the Internet at <http://www.concept-phones.com/apple/apple-iwatch-glass-hologram-overpowered-smartwatch-video/> (Apr. 19, 2014).
Kelvin, "Apple iWatch Goes Back to the Idea of an iPod Nano With a Belt", Concept Phones, downloaded from the Internet at <http://www.concept-phones.com/apple/apple-iwatch-idea-ipod-nano-belt/> (Mar. 2, 2014).
Kelvin, "Finally, a HTC Smartwatch! We Needed Those!", Concept Phones, downloaded from the Internet at <http://www.concept-phones.com/htc/finally-htc-smartwatch-needed/> (Feb. 4, 2014).
Kelvin, "Flexible Screen X Phone Becomes a Bracelet", Concept Phones, downloaded from the Internet at <http://www.concept-phones.com/cool-concepts/flexible-screen-phone-bracelet/> (Oct. 28, 2013).
Kelvin, "HTC One Watch Render Seems Taken out of Tron", Concept Phones, downloaded from the Internet at <http://www.concept-phones.com/htc/htc-watch-render-tron/> (Oct. 14, 2013).
Kelvin, "iPhone 6 and iWatch Pro Get Designed by Dani Yako", Concept Phones, downloaded from the Internet at <http://www.concept-phones.com/apple/iphone-6-iwatch-pro-designed-dani-yako/> (Jun. 6, 2014).

(56) References Cited

OTHER PUBLICATIONS

Kelvin, "iWatch Concept is a Curved Bracelet, Runs Flappy Bird", Concept Phones, downloaded from the Internet at <http://www.concept-phones.com/apple/iwatch-concept-curved-bracelet-runs-flappy-bird/> ( Feb. 13, 2014).

Kelvin, "iWatch Goliath is a Giant on Your Wrist (Video)", Concept Phones, downloaded from the Internet at <http://www.concept-phones.com/apple/iwatch-goliath-giant-wrist-video/> (May 23, 2014).

Kelvin, "iWatch Render Goes the Way of the Nike FuelBand", Concept Phones, downloaded from the Internet at <http://www.concept-phones.com/apple/iwatch-render-nike-fuelband/> (Jan. 21, 2014).

Kelvin, "Meizu MWatch Render is Exactly What Smartwatches Need", Concept Phones, downloaded from the Internet at <http://www.concept-phones.com/cool-concepts/meizu-mwatch-render-smartwatches/> (Feb. 12, 2014).

Kelvin, "MWC 2014: Kyocera Showcases Flexible Phone That Turns Into Bracelet", Concept Phones, downloaded from the Internet at <http://www.concept-phones.com/kyocera/mwc-2014-kyocera-showcases-flexible-phone-turns-bracelet/> (Feb. 27, 2014).

Kelvin, "New Apple iWatch Render Shows us an Ultrathin Bracelet", Concept Phones, downloaded from the Internet at <http://www.concept-phones.com/apple/apple-iwatch-render-shows-ultrathin-bracelet/> (Oct. 16, 2013).

Kelvin, "New iWatch Design Brings Us Back the Basics of a Watch", Concept Phones, downloaded from the Internet at <http://www.concept-phones.com/apple/iwatch-design-brings-basics-watch/> (Apr. 29, 2014).

Kelvin, "Nokia Lumia 101 Smartwatch is a Nice Little, Elegant Bracelet", Concept Phones, downloaded from the Internet at <http://www.concept-phones.com/nokia/nokia-lumia-101-smartwatch-nice-elegant-bracelet/> (Dec. 3, 2013).

Kelvin, "Superb Google Smartwatch Render Created in Cinema 4D", Concept Phones, downloaded from the Internet at <http://www.concept-phones.com/google/superb-google-smartwatch-render-created-cinema-4d/> (Jan. 31, 2014).

Kim,"Analysis of iWatch-related Patents from RitFast", IHS Technology, downloaded from the Internet at <http://www.displaybank.com/letter/letter_contents.php?nm=&email=prakash%40polyera.com&mail_id=8995> (Jul. 19, 2013).

Lilienthal, "Book? Accordian? Nope. Lumino is a Gorgeous LED Lamp the Goes Wherever You Do," Digital Trends, 6 pp. (Apr. 27, 2014).

Rastogi, "Nokia Lumia 1080: The Concept Phone", 91 mobiles, downloaded from the Internet at <http://www.91mobiles.com/blog/nokia-lumia-1080-the-concept-phone.html> (Jun. 27, 2013).

Ridden, "Emopulse Smile SmartWatch goes up for pre-order," Gizmag,downloaded from the Internet at <http://www.gizmag.com/emopulse-smile-smartwatch/27984/> (Jun. 19, 2013).

Seth, "In 2020 We Can Wear Sony Computers on Our Wrist", Yanko Design Form Beyond Function, downloaded from the Internet at <http://www.yankodesign.com/2010/05/25/in-2020-we-can-wear-sony-computers-on-our-wrist/> (May 25, 2010).

Seth, "Love This iWatch!", Yanko Design Form Beyond Function, downloaded from the Internet at <http://www.yankodesign.com/2013/07/26/love-this-iwatch/> (Jul. 26, 2013).

Seth, "My Latest Fashion Accessory", Yanko Design Form Beyond Function, downloaded from the Internet at <http://www.yankodesign.com/2009/08/11/my-latest-fashion-accessory/> (Aug. 11, 2009).

Seth, "Super Sexy Roll", Yanko Design Form Beyond Function, downloaded from the Internet at <http://www.yankodesign.com/2011/03/21/super-sexy-roll/> (Mar. 21, 2011).

Smith, "Flexi E Ink screen finds home in curved world time watch", The Register, downloaded from the Internet at <http://www.theregister.co.uk/2010/10/11/phosphor_watches_world_time/> (Oct. 11, 2010).

Smith, "Samsung smartwatch concept shown in patent hints at flexible display use", Android Authority (Aug. 3, 2013).

Smith, "Samsung's curved smartphone is the Galaxy Round, launches in Korea tomorrow (video)", engadget, downloaded from the Internet at <http://www.engadget.com/2013/10/08/samsung-galaxy-round/> (Oct. 8, 2013).

Thrystan, "Apple iWatch 2 Design Appears, More Elegant Than Ever", Concept Phones, downloaded from the Internet at <http://www.concept-phones.com/apple/apple-iwatch-2-design-appears-elegant/> (Feb. 9, 2012).

Thrystan, "BenQ Siemens Snake Concept Phone is Yet Another Bracelet-Handset", Concept Phones, downloaded from the Internet at <http://www.concept-phones.com/benq-siemens/benq-siemens-snake-concept-phone-bracelethandset/> (Feb. 9, 2009).

Thrystan, "Bracelet Phone Concept Incorporates an MP3 Player, Shines Like a Diamond", Concept Phones, downloaded from the Internet at <http://www.concept-phones.com/fashion-phones/bracelet-phone-concept-incorporates-mp3-player-shines-diamond/> (Sep. 8, 2008).

Thrystan, "CEATEC 2010 Hosts TDK's Flexible OLED Displays; Hands-on Photos Here!", Concept Phones, downloaded from the Internet at <http://www.concept-phones.com/news/ceatec-2010-hosts-tdks-flexible-oled-displays-handson-photos/> (Oct. 5, 2010).

Thrystan, "Dyson Concept Phone Charger Turns Temperature Differences Into Electricity", Concept Phones, downloaded from the Internet at <http://www.concept-phones.com/cool-concepts/dyson-concept-phone-charger-turns-temperature-differences-electricity/> (Jul. 24, 2009).

Thrystan, "Email Beeper Watch is Hip, Restarts a Trend", Concept Phones, downloaded from the Internet <http://www.concept-phones.com/cool-concepts/email-beeper-watch-hip-restarts-trend/> (Mar. 3, 2009).

Thrystan, "Flux, Portable and Wearable PC Concept", Concept Phones, downloaded from the Internet at <http://www.concept-phones.com/eco-friendly/flux-portable-and-wearable-pc-concept/> (May 5, 2008).

Thrystan, "Fujitsu Concept Phones Part 2: Judge-Dredd-Like Curvy Handset", Concept Phones, downloaded from the Internet <http://www.concept-phones.com/fujitsu/fujitsu-concept-phones-part-2-judgedreddlike-curvy-handset/> (Oct. 10, 2009).

Thrystan, "iPhone 5 Bracelet Looks Out of this World", Concept Phones, downloaded from the Internet at <http://www.concept-phones.com/apple/iphone-5-bracelet-world/> (Jul. 6, 2012).

Thrystan, "iPhone Holographic Display Concept is Surreal, Could Work", Concept Phones, downloaded from the Internet at <http://www.concept-phones.com/apple/iphone-holographic-display-concept-surreal-work/> (Aug. 22, 2009).

Thrystan, "iWatch Design Created by James Ivaldi is All Metal", Concept Phones, downloaded from the Internet at <http://www.concept-phones.com/apple/iwatch-design-created-james-ivaldi-metal/> (Jul. 29, 2013).

Thrystan, "iWatch Render in the Vision of the Ciccarese Design Team: Simply Stunning (Video)", Concept Phones, downloaded from the Internet at <http://www.concept-phones.com/apple/iwatch-render-vision-ciccarese-design-team-simply-stunning-video/> (Aug. 21, 2013).

Thrystan, "Leaf Phone Features an Organic Structure, is Made of Eco-Friendly Plastic," Concept Phones, downloaded from the Internet at <http://www.concept-phones.com/eco-friendly/leaf-phone-features-organic-structure-ecofriendly-plastic/> (Nov. 4, 2009).

Thrystan, "LG Auki Bracelet Phone Is Colorful and Elegant", Concept Phones, downloaded from the Internet at <http://www.concept-phones.com/lg/lg-auki-bracelet-phone-colorful-elegant/> (Aug. 26, 2011).

Thrystan, "LG Helix Cellphone is Also a Slap Bracelet", Concept Phones, downloaded from the Internet at <http://www.concept-phones.com/lg/lg-helix-cellphone-slap-bracelet/> (Oct. 9, 2009).

Thrystan, "LG Oyster, a Bracelet-Like Mobile Phone Design", Concept Phones, downloaded from the Internet at <http://www.concept-phones.com/lg/lg-oyster-braceletlike-mobile-phone-design/> (Jul. 26, 2009).

(56) References Cited

OTHER PUBLICATIONS

Thrystan, "New iWatch Render by Tolga Tuncer is Fancy and Classy", Concept Phones, downloaded from the Internet at <http://www.concept-phones.com/apple/iwatch-render-tolga-tuncer-fancy-classy/> (Mar. 3, 2013).

Thrystan, "Nokia Mixed Reality Concept, Future Technology Demoed at Nokia World (Video)", Concept Phones, downloaded from the Internet at <http://www.concept-phones.com/nokia/nokia-mixed-reality-concept-future-technology-demoed-nokia-world-video/> (Sep. 9, 2009).

Thrystan, "Nokia Open Bracelet Shows Incoming Calls of the Ones You Love", Concept Phones, downloaded from the Internet at <http://www.concept-phones.com/nokia/nokia-open-bracelet-shows-incoming-calls-love/> (Dec. 13, 2008).

Thrystan, "Nokia Smart Watch Concept Looks Interesting", Concept Phones, downloaded from the Internet at <http://www.concept-phones.com/uncategorized/nokia-smart-watch-concept-interesting/> (Oct. 22, 2011).

Thrystan, "Purse Bracelet Fancy Concept Phone, Designed by Yw Li", Concept Phones, downloaded from the Internet at <http://www.concept-phones.com/fashion-phones/purse-bracelet-fancy-concept-phone-designed-yw-li/> (Oct. 19, 2008).

Thrystan, "Quartz Tele Concept Should be in a Final Fantasy Game, Because Its All About Crystals", Concept Phones, downloaded from the Internet at <http://www.concept-phones.com/fashion-phones/quartz-tele-concept-final-fantasy-game-crystals/> (Sep. 8, 2008).

Thrystan, "Samsung Finger Touching Cellphone Concept Comes in Handy", Concept Phones, downloaded from the Internet at <http://www.concept-phones.com/samsung/samsung-finger-touching-cell-phone-concept-handy/> (Jan. 31, 2009).

Thrystan, "Samsung Futuristic Technology Relies on Health and Flexibility (Video)", Concept Phones, downloaded from the Internet at <http://www.concept-phones.com/samsung/samsung-futuristic-technology-relies-health-flexibility-video/> (Jul. 10, 2013).

Thrystan, "Samsung S-Health Bracelet Render is Based on Tizen OS", Concept Phones, downloaded from the Internet at <http://www.concept-phones.com/samsung/samsung-shealth-bracelet-render-based-tizen-os/> (Jun. 17, 2013).

Thrystan, "Sony Ericsson Bracelet Phone, a Design That Won't Make it into Production", Concept Phones, downloaded from the Internet at <http://www.concept-phones.com/sony-ericsson/sony-ericsson-bracelet-phone-design-production/> (Jun. 19, 2009).

Thrystan, "Sony Ericsson Ring Phone Concept by Tao Ma Will Always Be a Winner", Concept Phones, downloaded from the Internet at <http://www.concept-phones.com/sony-ericsson/sony-ericsson-ring-phone-concept-tao-ma-winner/> (Sep. 15, 2008).

Thrystan, "Speak to Me Concept Watch Phone is Hot, a Must-Have Fashion Accessory", Concept Phones, downloaded from the Internet at <http://www.concept-phones.com/fashion-phones/speak-concept-watch-phone-hot-musthave-fashion-accessory/> (Jan. 27, 2009).

Thrystan, "The Hook Bracelet Phone Concept Runs Windows Phone in a New Format", Concept Phones, downloaded from the Internet at <http://www.concept-phones.com/cool-concepts/hook-bracelet-phone-concept-runs-windows-phone-format/> (Jun. 21, 2013).

Thrystan, "The New iPod is iBangle . . . iLike iT", Concept Phones, downloaded from the Internet at <http://www.concept-phones.com/apple/ipod-ibangle-ilike/> (Oct. 23, 2008).

Thrystan, "Xbox 720 Concept is a Pyramid With Two Kinect "Eyes"", Concept Phones, downloaded from the Internet at <http://www.concept-phones.com/microsoft/xbox-720-concept-pyramid-kinect-eyes/> (Jul. 8, 2013).

Thrystan, "Yuxa is a Wearable Cellphone Made From Eco-Friendly Materials", Concept Phones, downloaded from the Internet at <http://www.concept-phones.com/eco-friendly/yuxa-wearable-cell-phone-ecofriendly-materials/> (Jun. 24, 2010).

Thrystan, "ZTE Cube Phone, Another Mobile World Congress Concept", Concept Phones, downloaded from the Internet at <http://www.concept-phones.com/cool-concepts/zte-cube-phone-another-mobile-world-congress-concept/> (Feb. 14, 2008).

Vertegaal et al., "Organic User Interfaces have non-planar displays that may actively or passively change shape via analog physical inputs", Organic User Interfaces—Communications of the ACM (May 31, 2008).

Wei et al., Shape memory materials and hybrid composites for smart systems, Part II: Shape-memory hybrid composites, J. Mater. Sci., 33:3763-83 (1998).

Non-Final Office Action from U.S. Appl. No. 14/188,440 dated Aug. 14, 2015.

\* cited by examiner

SUPPORT STRUCTURES FOR AN ATTACHABLE, TWO-DIMENSIONAL FLEXIBLE ELECTRONIC DEVICE

RELATED APPLICATIONS

This application is a continuation of International Patent No. PCT/US14/72172 filed Dec. 23, 2014, which claims priority to and the benefit of the filing dates of: U.S. Provisional Patent Application Ser. No. 61/920,705, entitled "Dynamically Flexible, Attachable Device Having an Integral Flexible Display" which was filed on Dec. 24, 2013 (Ref. No.: 32187-48118P); U.S. Provisional Patent Application Ser. No. 61/969,531, entitled "Dynamically Flexible, Attachable Device Having a Flexible Electronic Display" which was filed on Mar. 24, 2014 (Ref. No.: 32187-47794P2); U.S. Patent Provisional Application Ser. No. 61/979,668, entitled "Support Structure for a Flexible Electronic Component," which was filed on Apr. 15, 2014 (Ref. No.: 32187-48292P); U.S. Patent Provisional Application Ser. No. 62/003,549, entitled "Flexible Electronic Component Movably Coupled to a Flexible Support," which was filed on May 28, 2014 (Ref. No.: 32187-48467P); U.S. Patent Provisional Application Ser. No. 62/006,714, entitled "Attachable, Two-Dimensional Flexible Electronic Device," which was filed on Jun. 2, 2014 (Ref. No.: 32187-48483P); and U.S. Patent Provisional Application Ser. No. 62/089,115, entitled "Support Structures for an Attachable, Two-Dimensional Flexible Electronic Device," which was filed on Dec. 8, 2014 (Ref. No.: 32187-48483P1). The entire disclosure of each of these applications is hereby expressly incorporated by reference herein for all uses and purposes.

TECHNICAL FIELD

This patent application relates generally to dynamically flexible articles, and more particularly to various support structures for flexible electronic components (e.g., flexible electronic displays, flexible OLED lighting, roll-out screens, flexible electronic circuits, flexible sensors) incorporated into a dynamically flexible article that can be attached to various complex curved surfaces, such as an arm, a torso, skin, packaging, a curved armature or wall, etc.

BACKGROUND

Electronic components such as electronic displays are commonly installed within flat, hard surfaces of electronic devices, such as computer screens, television sets, smart phones, tablet computers, etc., and in many cases are installed on accessories for the electronic devices, such as removable monitors. Many electronic devices having an electronic display are portable, and have thus become very useful in implementing mobile applications. This fact is particularly true with smart phones which have become ubiquitous. However, unfortunately, typical mobile devices such as smart phones have electronic displays that are flat and/or rigid in nature. Thus, while these displays are useful in implementing many different applications, the device on which the display is present must still typically be held in a hand, or must be stored in a pocket, a purse, a briefcase or other container, which makes the electronic device less accessible in many situations, such as when a person is carrying other items, undertaking an athletic activity such as running, walking, etc. Moreover, in many cases these traditional electronic devices require two free hands to hold and operate, making these devices cumbersome or difficult to use or to view in situations in which, for example, a person has only one or no free hands or is otherwise occupied.

While flexible displays are generally known and are starting to come into more common usage, flexible displays have not been widely incorporated into easily portable items such as items of clothing, wristbands, jewelry, etc., or on items that are easily attached to other items, much less in a manner that makes the display more useable and visible to the user in many different scenarios.

A flexible electronic component, such as a flexible electronic circuit, a sensor tag, a flexible OLED light, or a flexible display, is a multi-layered stack typically formed of both brittle and organic layers. In some cases, the flexible electronic component may include built-in strains that exist in one or more layers of the component due to the processing conditions of the component (e.g., temperature induced strain). In any case, as a flexible electronic component is typically produced on a flat surface, a curvature or bending of the flexible electronic component creates a certain strain profile in the layers of the component. The strain profile created by the curvature of bending of the component, as well as any built-in strains that may exist within the component, may, in turn, cause one or more of the layers of the flexible electronic component to buckle, delaminate, crack, or otherwise become damaged. The organic layers in a flexible electronic component can typically withstand strains up to 8% before breaking or deforming in a non-elastic way. The brittle, inorganic layers in a flexible electronic component can, however, only typically withstand strains of approximately 1% before buckling or cracking, depending of course on the processing conditions of the component. As such, the brittle layers of the flexible electronic component generally buckle or crack first in response to excess strain.

When a flexible electronic component is bent or curved, the outer radius of the component will be under tension, while the inner radius will be under compression. At some point in the layer stack of the component, the neutral plane, where there is no tension or compression upon bending, can be found. The layer stacking, the layer thickness, and the layer properties, such as the Young's modulus, determine the position of the neutral plane. For a symmetrical stack of layers, the neutral plane is generally located near a middle of the stack. Based on the exact location of the neutral plane and the maximum tolerable strain value (e.g., 1%), the minimum bending radius can be determined for each of the layers in the component. Because, as noted above, the brittle, inorganic layers in the component can typically withstand less strain than the organic layers, the brittle layers typically have a greater minimum bending radius than the organic layers. In turn, the greater minimum bending radius of these brittle layers governs or controls the amount of bending or curvature that the flexible electronic component can undergo before the component is damaged (i.e., the bending range of the component or the minimum critical bending radius).

To provide support to the flexible electronic component and to prevent a user of the flexible electronic component from bending or flexing the component beyond such a minimum critical bending radius, and, thus, prevent damage to the component, the component can be fixedly attached to a mechanical support structure. International Patent Application Publication No. WO 2006/085271, for example, describes attaching a metal leaf spring to a flexible display. The problem with attaching a flexible electronic display to a mechanical support structure, such as, for example, a metal leaf spring, is that the attachment of the mechanical support structure to the display typically causes the neutral plane to shift from its initial position (in the display) to a position within the mechanical support structure. Because of the relationship between the location of the neutral plane and the minimum bending radius, shifting the neutral plane in this way significantly increases the minimum bending radius of the layers in the display, particularly the brittle layers in the display. In doing so, the mechanical support structure can serve to significantly reduce, if not effectively destroy, the bending or flexing ability of the flexible electronic display. This fact is generally true for other flexible electronic components as well.

Moreover, to the extent that flexible electronic components, such as flexible electronic displays, have been placed onto bendable surfaces or substrates, these components have generally been formed to be of small size, or the displays have been placed on substrates that generally are bendable in one dimension. For example, the flexible display disposed on the metal leaf spring device of International Patent Application Publication No. WO 2006/085271 flexes primarily in the direction around a user's wrist, while not flexing much if at all in the direction along a user's wrist. This functionality limits the size of the flexible display, and is not very suitable for placing or mounting flexible electronic components on complex surfaces which bend or flex in two dimensions, such as along an arm or a leg, or on another surface of a body, or on packaging, a curved armature, wall, or pillar.

SUMMARY

A dynamically flexible article or device, such as an armband device, includes a flexible electronic component (e.g., a flexible display, a flexible OLED light, a flexible electronic circuit, a sensor tag, etc.) that flexes in or along two dimensions, and includes a flexible support structure coupled to the flexible electronic component in a manner that allows the flexible electronic component to flex in or along the two dimensions while limiting the flexing to movement that is within the tolerance range of the electronics on the flexible electronic component. This may, in some cases, involve or include preventing the formation of bending axes (in or along the various dimensions) that intersect or cross within a reference area defined by the flexible electronic component.

The flexible support structure may be configured to be attached to a further element, such as to any part of a person's body, to clothing, etc. to enable the flexible electronic component to be mounted on and to bend with surfaces that have complex curvatures or that move between different complex curvatures. The flexible support structure may include an attachment structure in the form of Velcro® or any other hook and loop structure, adhesive, snaps, etc. If desired, the flexible electronic component may be able to be attached to a sleeve that encompasses the flexible support structure to enable the flexible electronic component to move relative to or independently from the flexible support structure, e.g., when the local bending state of the article is changed. In this latter case, because the flexible electronic component and the flexible support structure are movable independently of one another, the amount of strain that the flexible support structure places on the flexible electronic component when the article is being bent or curved is minimized. In particular, by movably coupling the flexible support structure to or with the flexible electronic component, the flexible support structure does not alter or only minimally alters the neutral plane of the flexible electronic component. This feature, in turn, minimizes the critical bending radius of the flexible electronic component when coupled to the flexible support structure while still providing bending limiting functionality for the flexible electronic component. As such, the flexible support structure provides support to the flexible electronic component while substantially maintaining the bending ability (e.g., the bending range) of the flexible electronic component (i.e., the bending ability of the article is substantially similar to the bending ability of the flexible electronic component itself) and while limiting the bending ability of the flexible electronic component in two dimensions to be within the tolerable range of bending (e.g., without allowing bending beyond the minimum critical bending radius of the component, without allowing bending axes that intersect or cross within a reference area defined by the component).

In some cases, the dynamically flexible article may be attached to a further connection member that connects or attaches the dynamically flexible article onto a further structure, such as an arm, a leg, etc. The further connection member may be in the form of a sleeve, such as a sleeve made of flexible and/or stretchable material, such a neoprene, and may include an attachment structure for attaching the flexible support structure to the sleeve. Such connection structure may include one part of a hook and loop material (either the hook or the loop material) that mates with the other part of the hook and loop material disposed on the flexible support structure. This connection structure may also or instead include magnets and/or magnetically permeable materials disposed on the connection member and the flexible support structure. The connection member may instead include a pocket in which the flexible attachable article may be disposed, with the flexible electronic component facing outwards and visible through the pocket.

Moreover, in some cases, the sleeve or other connection member may made of a continuous material that wraps around the user's arm, or may be a flat material having a connection structure such as a zipper, a hook and loop material, snaps, ties, etc., disposed on the ends thereof to enable the ends of the material to be connected together around a user's arm, leg, torso, etc.

Preferably, the sleeve or other connection member is made of a material that is washable so that the sleeve or other connection member may be cleaned with the flexible attachable article removed therefrom. In some cases, the sleeve or other connection member may include metal disks, strips, flex cables, perforated flexes, or other types of material sewn or otherwise disposed therein, so that opposite sides of the metal disks, strips, flex cables, perforated flexes are exposed on inner and outer sides of the sleeve or other connection member. Still further, the metal disks, strips, flex cables; perforated flexes may be disposed to come into contact (e.g., physical or electrical contact) with sensors, probes or electrical contacts within the flexible support structure and/or within or attached to the flexible electronic component or other processing electronics associated with the flexible electronic component. This structure enables the flexible attachable article to have electrical, optical or other contact or interaction with a user's skin, when the sleeve or other connection member is being worn on a body, such as on an arm or a leg, to make measurements, such as temperature, stress, resistivity, capacitive, heart rate, blood pressure, etc., measurements. Likewise, these metal or other types of material disks, strips, or bands may propagate vibrations made by a vibrational device on the flexible attachable article to the user's skin in a more robust manner.

The article, by the nature of the flexible substrate and flexible electronic component, such as a flexible electronic display, is dynamically bendable or conformable to a user's arm, leg, torso, or other curved surface, and enables various images to be displayed on a flexible electronic display in a manner that is easily viewable to a user or wearer of the article. The dynamically flexible, attachable article with such a flexible electronic display may be attached to or worn on a user's body, such as in the form of an armband, for example, and may bend in two dimensions (e.g., both longitudinally and laterally or transversely) to fit the various contours or body surfaces on which the electronic display (or other flexible electronic component) is located. Such a two dimensional bending enables the display to conform to and ride with a user's skin in a manner that feels more natural. The dynamically flexible, attachable article is also easily attached to other items having complex curved surfaces (i.e., ones that bend or curve in more than one direction), such as computers, automobile dashboards, motorcycle tanks, etc., that enable the flexible display to be viewed when not being held in one's hands or on one's body. Still further, the dynamically flexible attachable article may be laid out flat and may be displayed on or attached to a surface in a manner that enables the electronic display to be viewable to a user. In one case, the dynamically flexible, attachable article may be placed on a flat stand having a charging contact in a manner that enables the device to be charged while also orienting the display of the device to be visible to those looking at the stand.

In any event, the electronic display or other flexible electronic component of the attachable article is viewable to a user and is capable of being manipulated or actuated by the user without having to be held in one or both of the user's hands, making the electronic device useable while the user is engaged in or performing other activities, such as running, biking, golfing, driving, etc.

In one case, the dynamically flexible, attachable electronic device includes a flexible electronic display disposed on a flexible, e.g., bendable, support in the form of a generally rectangular shape, with one, two, or more fasteners or clasping members attached to the support that allow the attachable device to be removably attached to other members, such as arm sleeves, leg sleeves, clothing, shoes, etc. Control and communication electronics of the device are disposed in one or more electronic modules that may be within, for example, the flexible substrate. For ease of reading, the one or more electronics modules are referred to herein in the singular (i.e., "electronics module"), although it is understood that a dynamically flexible, attachable electronic device may include more than one electronics module.

The electronics module includes a processor for implementing applications or programming, such as an application or program to communicate with a display driver to drive the electronic display (or other flexible electronic component) to display fixed or changeable messages, artwork, pictures, etc., to emit light, to perform sensing, etc. The electronic module also includes a memory for storing data, for example, pictures, images, messages, videos, etc., to be displayed on the electronic display at various times, as well as for storing applications and application data, such as configuration data, to be used by applications for performing various display tasks at different times. The electronics module, which may be rigid in nature, may also include a battery for powering the electronic display, the processor, the display driver, and other electronic elements, a battery charging device for charging the battery either in a wireless or a wired manner, and a communications module that enables other computer devices to communicate with the processor, the display driver and the memory to provide new or different images or messages to be displayed on the electronic display, to configure the operation of the electronic display of the attachable electronic device, etc.

The flexible electronic component may be a flexible electronic display that may be fabricated using any desired flexible electronic display material, such as any of various suitable plastics. If desired, the flexible electronic display may be manufactured as a display having pixel elements disposed on separate frontplane and backplane substrates formed of the same or different flexible material. In some cases, such as the case in which e-paper is used as the flexible display, a separate layer of material may be disposed between the frontplane and the backplane materials to form pixel elements. In any case, these substrate materials may be placed together to form the flexible electronic display, which may then be disposed on the flexible support, such as a leather support, a bendable metal support, a rubber support, etc., the combination of which can be flexed or curved in various manners to conform to the shape of a portion of a wearer's body, such as an arm, a leg, a torso, etc., or to conform to the shape of other items to which the attachable article may be attached. In another case, the attachable electronic device may include a flexible, for example, transparent, touch screen interface disposed over or on top of the flexible electronic display to enable a user to input data or take input actions with respect to the flexible electronic display. If desired, the inputs may be in the form of gestures or other inputs that are detected by other sensors included in the dynamically flexible, attachable device, and the gestures detected by the sensors may cause the electronic device to operate in a predetermined manner, such as to change modes of operation, etc.

The electronic display device so formed may, for example, enable a user to have a single type or multiple different types of digital media depicted or displayed on the electronic display at the same time, including, for example, photographs, digital artwork created by the user or others, messages sent to or created by the user, reminders, notes that provide instructive, educational or inspirational messages, e-cards, advertisements, personalized agendas, calendars, such as a personalized Outlook® calendar, etc.

More particularly, the display driver may be configurable to drive the electronic display by displaying thereon one or more images, messages, digital artwork, videos, etc., stored in the memory. In some cases, the display driver is connected to a set of electrodes or connectors that, in turn, are connected to the pixel elements of the flexible display, and the display driver provides respective content to each electrode or connector to produce the image displayed on the flexible display. The display driver may display a fixed image via the flexible electronic display, may change the image being displayed on the flexible electronic display from time to time, such as by accessing the memory and providing a new image to the display, may display videos, such as real time videos, and/or may display other types of digital media. Likewise, the display driver may cause various interfaces associated with many different applications at different times or in different modes of the attachable electronic device to be presented on the flexible display. For example, the display driver may be driven by various different applications executed in the processor to display a calendar interface, an e-mail in-box interface, an alarm clock interface, a keyboard interface, a step-counter interface, etc. Of course, any other special purpose application may be implemented on the processor to drive the display to provide other types of interfaces on the display. These interfaces may be located on the same place on the flexible display and displayed at different times and may be located at different places on the flexible display and displayed at the same or at different times.

Still further, a battery charger unit may be connected to the battery and may operate to charge the battery using, for example, an inductively coupled charging technique or a directly coupled charging technique. The battery charger unit may be, for example, a part of an inductively coupled charging system and may respond to electromagnetic waves produced by an exterior charging unit to charge the battery when the attachable article is disposed near the external charging unit. In another case, the battery charger may be a kinetic energy charger unit that converts motion of the device (such as that associated with movement of an arm when the attachable electronic device is in the form of a wristband) into electrical energy which is then used to charge the battery.

Still further, a communications module may enable the processor, the driver, the memory and/or the flexible electronic display to communicate with external sources or devices, such as a computer, a mobile phone, a tablet device, a remote control unit, etc., using, for example, wireless communications associated with a Wi-Fi network, a cellular network, a Bluetooth connection, a near-field communications (NFC) connection, an infrared communication technique, a radio frequency identification (RFID) device or tag, etc. The communications module may operate to enable the driver to receive new images or other digital media for storage in the memory and ultimate display on the flexible electronic display, new applications for execution by the processor or driver to perform control of the electronic display in various manners and new configuration information for configuring the manner in which the display driver controls the flexible electronic display to operate to display images and other information. In this manner, a user may reprogram the attachable article via, for example, a wireless communication network to display different pictures, images, messages, etc., at different times, to execute different applications at different times or in different locations. The communications module operates to eliminate the need for the attachable device to be plugged into a computer, or otherwise to have wires connected thereto for writing information to the memory of the device.

Still further, the memory may store, and the processor may execute, one or more applications provided or downloaded to the attachable electronic device by the user. These applications may enable the user to direct or program the operational features of the attachable device with the flexible electronic display, such as the particular digital media or images to display at any given time, the order in which images are to be displayed, the speed at which images will change, display features, such as background colors, borders, visual effects, etc. Moreover, the applications may enable or perform communications via the communications module to obtain information that may be displayed on the flexible electronic display, such as e-cards, advertising or promotional information, etc., provided via, for example, a Wi-Fi connection, a cellular connection, a Bluetooth or NFC connection, or any other wireless communications network or connection.

In one case, the processor, which may be a generally purpose micro-processor type of controller or a special purpose controller, the battery, the battery charger unit, the computer readable memory and the communications module may be integrated within, for example, a side wall of the attachable article or in a separate rigid module, and these components may be sealed or otherwise protected from water, air, dirt, etc. to which the exterior of the device is exposed. Any or all of these electronic components may be encapsulated in a hermetically sealed manner to prevent any direct exposure of these components to exterior forces and environmental hazards.

Still further, the flexible support of the attachable article may incorporate various types of structure to protect the flexible display by, for example, limiting the possible types of motion that the flexible display can undergo. These types of structures can, for example, include a one or more sets of transverse and/or longitudinal bars, stays or stints disposed in or on the flexible support, a mesh of rigid but hinged material, etc., to limit the motion of the flexible support in two dimensions, to thereby prevent damage to the flexible display due to bending of the flexible display in each of the two dimensions. In a similar manner one or more longitudinal and/or transverse members may be configured within the flexible support to limit the bending motion of the flexible support around either or both of a longitudinal axis of the device and/or a transverse axis of the device. This structure thus prevents or limits flexing of the flexible display in one or more directions so as to prevent damage to the flexible display from bending motions that might crack, buckle, delaminate or otherwise damage the various layers of the flexible electronic display. Still further, the flexible support may include a hinged sheet of material that operates to limit bending of the support (and thereby the display mounted on the support) in two dimensions. In most cases, the flexible substrate includes bending limiting structure elements that operate together to limit the bending radius of the flexible substrate in two dimensions to a range within a bending tolerance of the flexible electronic display in each of the two dimensions. The flexible substrate may, however, enable different amounts or ranges of bending in each of the two dimensions. If desired, the electronics module may be rigid, and may be coupled to the flexible substrate at, for example, an end of the flexible substrate or at any point between two ends of the flexible substrate. Likewise, the flexible support may include an edge or ridge formed of, for example, a metal wire or other material that is disposed along the edges of the flexible display to prevent or limit damage to the flexible electronic display by impacts at the edge or side of the flexible electronic display.

In another embodiment, an attachable article includes a generally rectangular shaped substrate having first and second longitudinal sides and first and second transverse sides extending between the first and second longitudinal ends, the flexible substrate having a multiplicity of interconnected pieces that each extend between the first and second transverse sides and the first and second longitudinal sides of the substrate that operate together to limit the bending motion of the flexible substrate to a particular minimum bending radius in each dimension. The attachable article may also include a flexible electronic display disposed on the flexible substrate, the flexible electronic display having a minimum critical bending radius at which the flexible electronic display can be bent without impairing electronic functionality of the flexible electronic display. Such a minimum critical bending radius may be the bending radius past which the electronic functionality of the flexible display becomes impaired upon a single or a low number of bendings (e.g., bending the flexible display past the minimum critical bending radius the first, second, third, etc., time results in impaired functionality), or may be the bending radius past which the electronic functionality of the flexible display is not reliable or may become impaired upon a significant number of bending motions (e.g., the minimum critical bending radius may be the largest minimum radius at which the electronic display may be reliably bent a significant number of times without becoming impaired). Still further, an electronics module is electronically connected to the flexible electronic display and includes a display driver coupled to the flexible electronic display and a processor coupled to the display driver. In this case, the particular minimal bending radius of the flexible substrate in the longitudinal direction of the substrate may be greater than or equal to the minimal critical bending radius of the flexible electronic display in the transverse direction of the substrate. Moreover, these bending radii may be different (or the same) along each direction when the display or other flexible electronic component is bent to be concave and convex.

If desired, in one embodiment, the flexible substrate may include a series of rigid pieces of material interconnected with hinges, wherein the hinges limit bending of the flexible electronic display when disposed on the flexible substrate within the bending tolerance of the flexible electronic display. The rigid pieces of material may be disposed longitudinally and transversely along the substrate and the hinges may include protrusions that interact to limit the range of bending motion of the hinge. Likewise, the flexible substrate may include a flexible material with rigid elements spaced longitudinally and transversely apart along the flexible material and the rigid elements may operate to limit bending of the flexible substrate in the transverse direction of the band more than in the longitudinal direction of the band or vice-versa. In a still further embodiment, the flexible substrate may include a pliable material having a first uninterrupted section disposed closest to the flexible electronic display and having a second section disposed adjacent the first section and having grooves disposed therein, wherein the grooves extend from one side of the flexible substrate to the other side of the flexible substrate. If desired, the second section may further include one or more longitudinal grooves disposed therein, wherein the longitudinal grooves extend at least partially from one longitudinal end of the flexible substrate to the other longitudinal end of the flexible substrate. Additionally, the flexible substrate may have two portions disposed longitudinally or transversely adjacent to one another, wherein the first portion can be bent to a minimum radius of curvature that is different than the minimum radius of curvature to which the second portion can be bent. Also, the flexible substrate may have a plurality of sections disposed longitudinally or transversely with respect to one another along the substrate, wherein each section can be bent to one of a multiplicity of minimum radii of curvature, and wherein at least two of the sections can be bent to a minimum radius of curvature that is less than the minimum radius of curvature of one of the other sections. In a still further case, the flexible substrate may have an edge piece that extends above the flexible electronic display at each transverse and/or longitudinal side (i.e., the sides disposed at the edges in the transverse direction, or the sides extending in the longitudinal direction between the longitudinal ends) of the flexible electronic display and the edge pieces may include a first bendable piece of material disposed inside of a soft pliable material. In this case, the first bendable piece of material may be harder than the soft pliable material.

Still further, the flexible electronic display may be configured to present the maximal useable display area on the upper surface of the attachable article by being formed such that the edges of the flexible display on which lead lines that are used to energize a display area of the flexible display are bent or folded down or under the display. Such a configuration limits or reduces the need to have an area on the upper or outer surface of the attachable article at which no display pixels are located.

DETAILED DESCRIPTION

Figure 1:
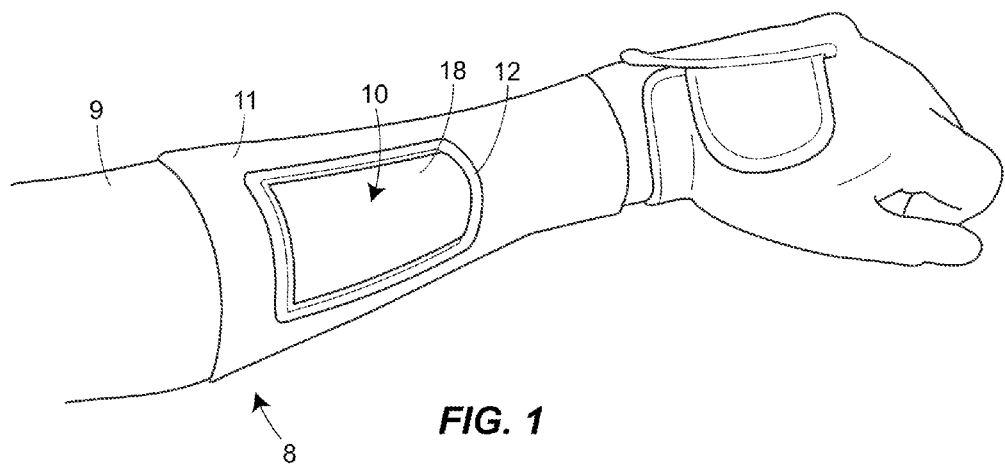
FIG. 1 is a perspective view of an example dynamically flexible, attachable article in the form of an armband device having a flexible electronic component having a flexible display disposed on a flexible substrate, and a sleeve on which the flexible electronic component is mounted.
Figure 2:
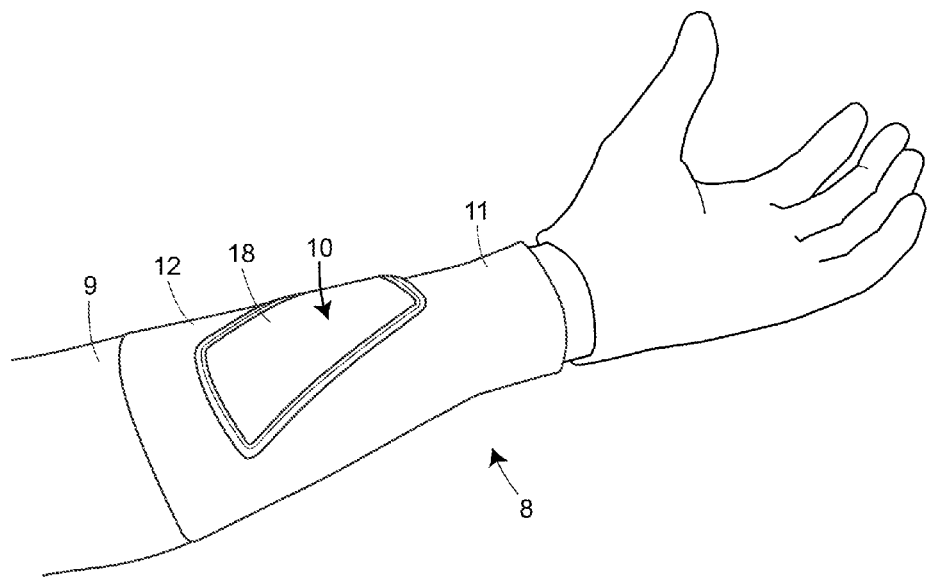
FIG. 2 is further perspective view of the example armband device of FIG. 1 when the user's arm is in a different position to illustrate two-dimensional flexible movement of the flexible electronic component.

Referring now to FIG. 1, an armband device 8, which is disposed on a user's arm 9, includes a dynamically flexible electronic, attachable component or article 10 attached to a sleeve member 11. While the sleeve member 11 is illustrated as being mounted on a user's arm 9, the sleeve member 11 could instead be mounted on a user's leg, torso or other body part or could alternatively be mounted on other structural members besides body parts. During use, the flexible electronic article 10 flexes or bends along two dimensions (e.g., along the length of the arm 9 and around the arm 9 in FIG. 1) to generally conform to the complex curvature of the arm 9 at various different locations and during movement of the arm 9 through various different movements. FIG. 2 illustrates the armband device 8 disposed on the user's arm 9 when bent in a different manner to illustrate that the flexible attachable article 10 flexes or bend with the arm 9 along two dimensions to conform the user's arm 9.

It will nonetheless be appreciated that the attachable component or article 10 need not be attached to the sleeve member 11. Instead, the attachable component or article 10 may be attached to a different object (e.g., a belt, a shoe, a shirt) attached to or worn on a user's body or directly attached to or worn on a portion of the user's body (e.g., a wrist, a leg, an arm). Alternatively, the attachable component or article 10 may instead be attached to mugs, cups, computers, phone covers, bike handles, automobile dashboards, stands, or other objects or surfaces that enable the component or article 10 to be viewed when not being held in the user's hands or on one's body. Of course, it is possible the attachable component or article 10 need not be attached to anything at all; instead, the attachable component or article 10 may be held by the user or rest on some surface (e.g., a countertop). In these alternative cases, the flexible electronic article 10 may be flexed or bent, by the user or surface upon which it rests, along two directions (e.g., along the transverse direction and along the longitudinal direction) or may flex or bend along two directions to generally conform to the complex curvature of the object to which the article 10 is attached at various different locations and during movement of the object through various different movements.

Figure 3:
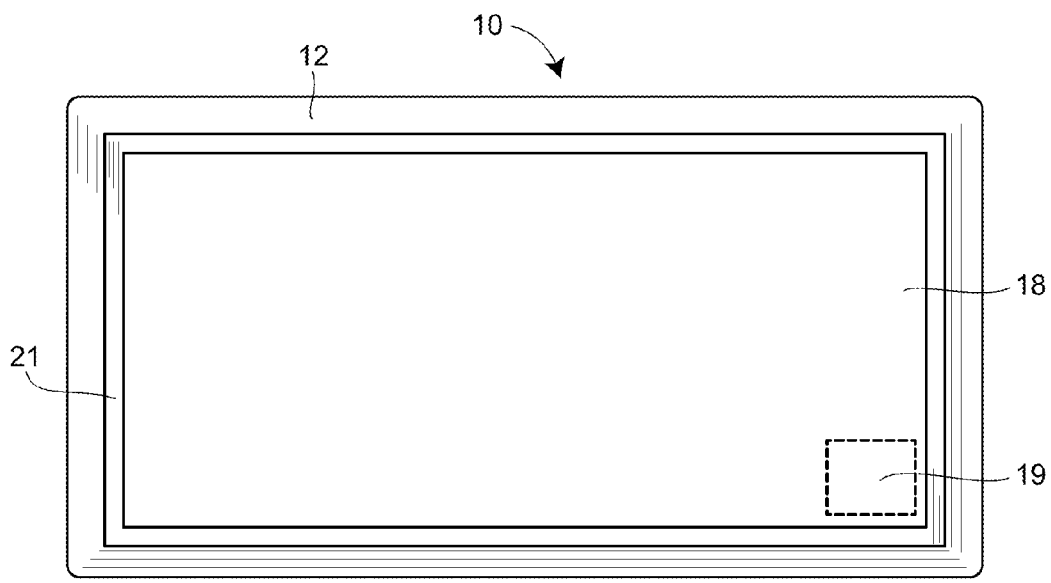
FIG. 3 is a top view of the flexible electronic component of FIGS. 1 and 2 with the flexible substrate laid out on a flat surface.
Figure 4:
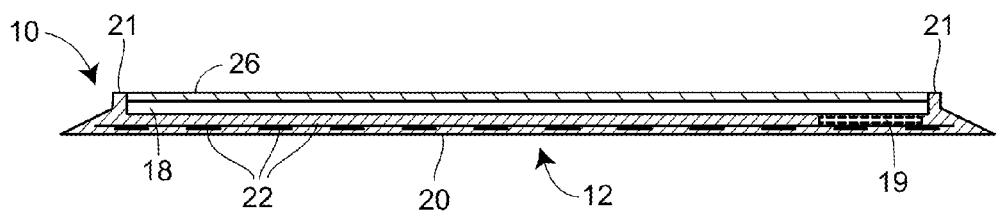
FIG. 4 is a cut-away side view of the flexible electronic component of FIGS. 1-3.

As more generally illustrated in FIGS. 3 and 4, the flexible attachable article 10 includes a flexible substrate or support component 12, which is generally rectangular in shape and configuration (although this need not be the case), and a flexible electronic display 18 coupled to the substrate 12. As will be understood, the flexible electronic display 18 has a generally two dimensional, rectangular shape. In FIGS. 3 and 4, the flexible electronic display 18 is disposed or mounted on the substrate 12 so as to be viewable from the top of the substrate 12, as illustrated in FIGS. 1-3. As will be described herein, the flexible electronic display 18 can instead be coupled to the flexible support 12 in a different manner (e.g., movably coupled or connected) or coupled to a different portion of the substrate 12 (e.g., coupled near the top of the substrate 12). Additionally, one or more various electronic components used to drive the display 18 may be disposed in one or more electronic modules 19 that are coupled to (e.g., disposed within or on the substrate 12) and that are connected or coupled to the electronic display 18 to drive the electronic display 18.

As noted above, the substrate 12 may include an electronics module 19 that holds electronics, such as processors, memories, sensors, batteries, etc., that are used to power and drive the flexible electronic display 18 and to provide other communication functionality for the device 10. The electronics module 19 may be even with the bottom of the substrate 12, or may be disposed within the substrate 12 or may even stick out from the bottom or the top of the substrate 12. If desired, the components of the electronics module 19 may be sealed or otherwise protected from water, air, dirt, etc., to which the exterior of the device 10 is exposed. For example, any or all of these electronic components may be encapsulated in a hermetically sealed manner to prevent any direct exposure of these components to exterior forces and environmental hazards. Still further, all of the components of the flexible electronic component 10 itself may be sealed or otherwise protected from water, air, dirt, etc., to which the exterior of the device 10 is exposed.

If desired, as illustrated in FIG. 4, the dynamically flexible, attachable article 10 may be configured to include a touch screen interface 26 disposed over the flexible display 18. In this case, the touch screen interface 26 can be a capacitive touch screen, in infrared touch screen, or any other type of touch screen interface that is transparent in nature, and thus that can be laid over the top of or be disposed on or near the top of the flexible display 18 to allow the flexible display 18 to be viewable there-through. As will be understood, the touch screen interface 26 is powered by and controlled by electronics disposed within one or more of the electronics modules 19 to perform various different types of touch detection functionality associated with a typical touch screen display.

Still further, the device 10 may include one or more sensors, probes, etc. disposed in or on the substrate 12 and connected to one or more of the electronic modules 19 to perform any of various types of sensor or probe measurements. The sensors may be, for example, temperature sensors, pressure sensors, capacitive sensors, resistive sensors, vibration or impact sensors, gyroscopes, piezoelectric sensors, strain gauges, accelerometers, magnetic sensors, etc., used to, for example, detect temperature, pressure, electrical or magnetic properties (like current, resistance, capacitance, voltage, magnetic fields, etc.), orientation, impacts, vibrations, acceleration, force, etc.

Of course, any desired number of sensors may be used and these sensors may be spaced apart from one another any suitable distance along the length or the width of the support 12. Likewise, the sensors may be disposed in the center of the support 12 (from side to side) or offset from the center. Also, more than one sensor may be located at any longitudinal or transverse location along the support 12.

The flexible substrate 12 may be made of any suitable flexible material such as, for example, cloth, leather, plastic, metal, rubber, or other material, while the flexible display 18 is disposed on the substrate 12. As best illustrated in FIG. 4, the substrate 12 of the attachable article 10 includes a continuous bottom portion 20 that is disposed beneath the flexible electronic display 18 to provide support to and to limit the bending motion of the flexible electronic display 18, and additionally includes side portions 21 that are disposed around the edges of display 18 to provide support and to protect the edges of the display 18 from damage due to side impacts, etc. Any or all of the support structure 12 may be made of a flexible material, such as rubber, plastic, etc. that is configured to allow some bending, but to limit the bending thereof within a specific range or tolerance. Additionally, the support structure 12 may include bending limiting components 22, such as stints or bars (e.g., made of metal, plastic or other suitable material) to provide some rigidity or bending limiting motion to the flexible support 12.

In particular, it may be important to limit in the manner in which the flexible support 12 can bend or flex so as to protect the flexible display 18 and/or the touch screen interface 26, as well as to provide or protect the edges of those devices, which might be subject to impact if the dynamically flexible article or device 10 is hit from a transverse or longitudinal side. For example, the edges 21 of the substrate 12 extend out towards the sides of the device 10 beyond the flexible display 18 at least a little bit. This additional area of material of the support 12 may be used to protect the flexible display 18 from being bent or torn in the case of a side impact to the device 10, as this material will operate to blunt or absorb some of that impact. The flexible support 12 can be thicker in the area at the edges of the device 10 and may extend upward to be even with or disposed above the longitudinal or transverse sides of the flexible display 18, to provide additional side impact protection for the flexible display 18. In this case, the display 18 is seated in a space or crevice formed within the center of the support 12, wherein the support 12 has sidewalls that extend above or up against the edges of the flexible display 18, in order to provide side impact protection to the display 18. In some cases, the edge or side walls of the support 12 that extend upward to protect the edges of the flexible display 18 and/or the touch screen interface 26 (if present) may be formed with stitching when the support 12 is made of leather for example. In another embodiment, additional side impact protection is provided by a wire or other harder, rigid or semi-rigid material (having a density greater than that of the flexible support material 12, but that is still flexible) disposed within or along the flexible support 12 along the edges of the flexible display 18 near or adjacent to the sides of the flexible display 18. Of course, other types of edge protections can be used to protect the edges of the flexible display 18.

Additionally, the support 12 may include structures that can be used to protect the flexible display 18 and the touch screen interface 26 (if it exists) by limiting the certain flexing, bending and/or torsional movement of the flexible support 12, and thus the display 18 disposed thereon, to certain predefined bending motions or ranges. In particular, because the flexible display 18 is formed as a set of separate layers of material having different electronic components formed or etched thereon, as described herein, certain types of movement or bending motions may cause damage to the flexible display 18 by causing these layers to delaminate or come apart from one another. In particular, while it is generally possible to flex or bend the display 18 in one or more directions (e.g. around an arm such as that shown in FIGS. 1 and 2) without delaminating the separate layers of the flexible display 18, it is typically not generally desirable or possible to be able to flex or bend the display 18 in multiple different directions, in or along different bending radii in the same direction, or beyond its minimum bending radius, as doing may cause the layers of the flexible display to delaminate from one other and thus stop functioning.

More particularly, while it may be desirable to permit bending of the flexible display 18 in or along different bending radii in the same direction or in multiple dimensions or directions (e.g., in a longitudinal direction and in a transverse direction) at different times or at the same time, such that the flexible display 18 is viewable in a number of different positions (e.g., in a substantially flat position and when bent along one or multiple dimensions), it would be undesirable to allow too much of this type of bending. In particular, it would be undesirable, and potentially destructive to the flexible display 18, to allow the flexible display 18 to be simultaneously bent along a first bending axis and along a second bending axis such that the first and second bending axes, when projected onto a reference plane, intersect at a virtual point within a reference area in the reference plane defined by the flexible display 18. As used herein, the reference area refers to a two-dimensional area that is defined in the reference plane by the display 18 when the display 18 is laid in a substantially flat position. The reference plane may be co-planar with the plane in which the display 18, when laid in the substantially flat position, lies, or may be disposed above or below the plane in which the display 18, when laid in the substantially flat position, lies. In any event, when the flexible display 18 is simultaneously bent along two or more bending axes in this manner, singularities are created in the flexible display 18. Stretching of the display 18 is localized at these singularities, resulting in a local strain level that is higher than the maximum strain level for the critical layers in the display, and thereby damaging the flexible display 18.

To prevent this potentially destructive movement, the support 12 can be formed to include various mechanisms for limiting the bending or flexing motion of the flexible support 12 of the device 10 to the desired bending motions, while limiting undesirable bending motion such as, for example, bending in multiple directions that creates bending axes that, when projected onto the display 18, intersect within the display 18. In particular, these or other mechanical structures can be used to limit the bending motion of the flexible substrate to a minimal radius of curvature (to be greater than or equal to the minimum critical bending radius of the flexible electronic display at any particular point). Here, the minimum critical bending radius of the flexible electronic display 18 is the minimal or smallest bending radius at which further bending will impair or destroy the functionality of the flexible electronic display 18 by, for example, breaking the electronic connections or other components in the flexible electronic display, by inducing a buckle or a crack in a layer due to a tensile or compressive strain level that exceeds the maximum strain that the layer can handle or by inducing a buckle (i.e. local delamination in a straight line) in a layer as a stress relieve mechanism after creep in a layer has resulted in a local strain level that has exceeded the maximum. Such a minimal critical bending radius may be defined by a single bend or by multiple repeated bends. Moreover, these or other mechanical structures can be used to constrain or limit simultaneous bending (i.e., bending in multiple directions at once) of the device 10, particularly the display 18, by preventing any simultaneous bending of the flexible support 12 that would create bending axes that intersect or cross within the reference area defined by the flexible display 18. Instead, these or other mechanical structures can be used to only permit bending of the flexible support 12 in multiple directions when the bending axes, when projected onto the reference plane, do not intersect at all (e.g., are parallel to one another) or intersect or cross at a point outside of the reference area in the reference plane defined by flexible display 18 (such that singularities are not created). In some cases, the support 12 may substantially prevent any simultaneous bending whatsoever (while permitting bending in different directions at different times or bending along different bending radii in the same direction, whether at different times or at the same time). In other cases, the support 12 may only prevent undesirable simultaneous bending and permit other simultaneous bending.

Figure 5:
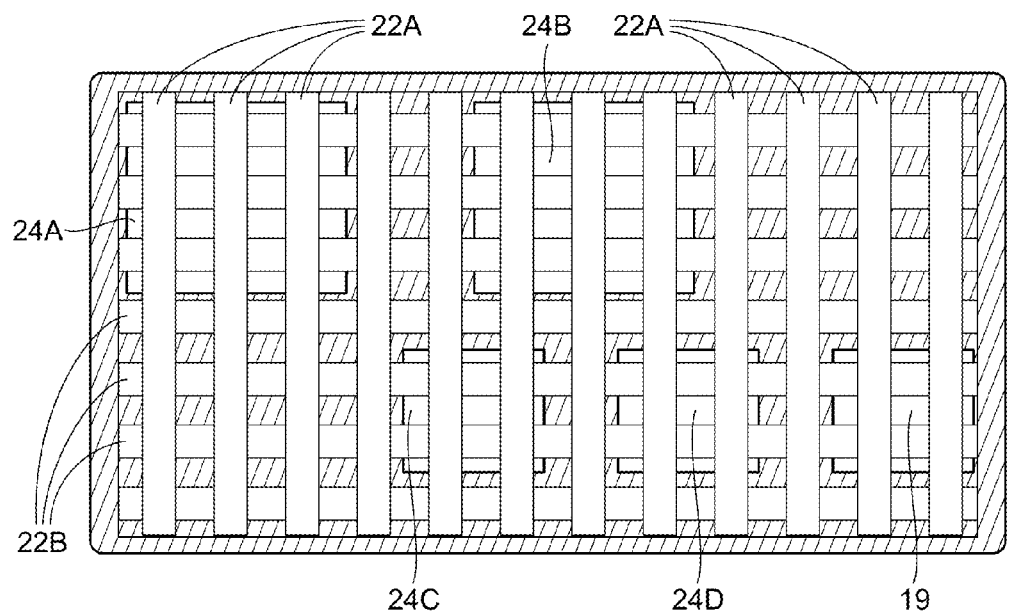
FIG. 5 illustrates a first flexible substrate of a flexible electronic component having stints disposed along two dimensions that operate to limit the bending range of the flexible substrate.

One such example bending limiting structure is illustrated in FIG. 5, which depicts a cut-away view of the flexible support 12 having bars or stints located transversely and longitudinally across the support 12 (i.e., with bars 22A extending from one transverse side to the other transverse side and bars 22B extending from one longitudinal side to the other longitudinal side of the support 12). The set of the bars 22A and 22B may be configured to limit the bending motion of the support or substrate 12 in the different dimensions (i.e., the transverse and the longitudinal dimensions) and preferably are configured to limit the bending motion of the support or substrate 12 to the minimal critical bending radius of the flexible electronic display 18 in each dimension. The rigidity, thickness, number, and spacing of the bars 22A and 22B in each direction or dimension may be configured to provide more or less bending limiting structure. The spacing, thickness, number, or rigidity of the bars 22A may be, for example, different than the spacing, thickness, number, or rigidity of the bars 22B to allow for more or less bending in one of the longitudinal or transverse dimensions. Moreover, the spacing, thickness, number, or rigidity of the bars in one dimension (e.g., of the bars 22A or 22B) may be varied to provide for more or less bending limiting action at different places along one of the transverse or longitudinal dimensions. To this end, the spacers or bars 22A and 22B may be made of a material, such as a rigid or semi-rigid material like hard plastic or metal that is stiffer or more inflexible than the material from which the support 12 is generally made. In other embodiments, the bars 22A and 22B of the support 12 can be made of the same material, but the bars 22A and 22B may comprise a thicker or denser configuration of that material. In yet other embodiments, the support 12 may be made of a bendable metal that bends easily at large radii of curvatures (i.e., small bending angles) but that increases in stiffness or non-elasticity at smaller radii of curvatures (i.e., larger bending angles). The bars 22A and 22B may be separately formed and then disposed within or on the support 12 or may be manufactured as part of the support 12. For example, the bars 22A and 22B can be molded on the underside of the support 12. The bars 22A and 22B may be evenly spaced across the support 12, such that all portions of the support 12 are subject to the same bending or flexing limit. Alternatively, one or more of the bars 22A and 22B can be spaced at different distances from one another across the support 12. In this later case, different portions of the device 10 can be bent or flexed more than other portions of the device 10. The bars 22A and 22B may also be interwoven such that at alternate crossings the bar 22A or 22B are on the top side. This can also be varied to give different flexibility to different regions or to make the whole support more or less flexible. The bars 22A and 22B may also operate to absorb side impacts to the support 12. For example, the support 12 can have a width that is at least slightly larger than the width of the flexible display 18, such that the bars 22 also act as side impact protection structure.

Additionally or alternatively, the material that forms the substrate 12 and that surrounds or encompasses the bars or stints 22A and 22B may have varying degrees of rigidity (e.g., varying or different Young's moduli) to change the bending limiting motion at different places along the substrate 12 in either or both directions or dimensions. For example, the blocks or sections of materials forming the blocks 24A, 24B, 24C and 24D may be configured differently to have different rigidity, and thus to change the bending limiting characteristics of the support 12 at those locations.

Figure 6:
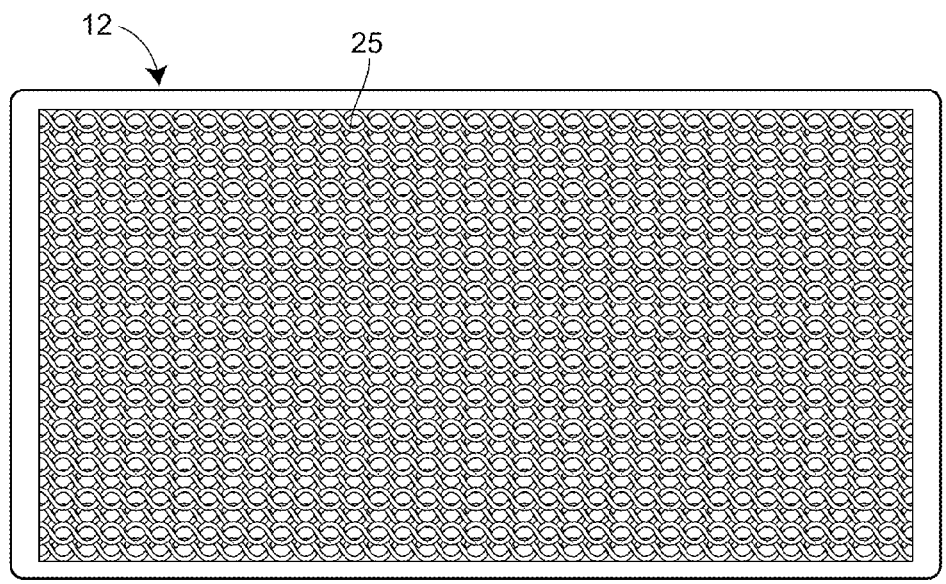
FIG. 6 illustrates a second flexible substrate of a flexible electronic component having rigid hinged material disposed along two dimensions that operate to limit the bending range of the flexible substrate.

FIG. 6 illustrates another example bending limiting structure that may be used in the substrate 12 to provide bending limiting motion thereto. In particular, as illustrated in FIG. 6, a series of rigid but interconnected links 25 (such as a wire mesh of material) may be connected to one another in one or two dimensions (as illustrated in FIG. 6) to form a hinged structure that enables some bending in or along both the longitudinal and the transverse directions of the support 12. As illustrated in FIG. 6, the interconnected, hinged or linked materials 25 may form a continuous sheet within the support 12 that may be surrounded by other more flexible or elastic materials, such as rubber, cloth, plastic, etc.

Figure 7:
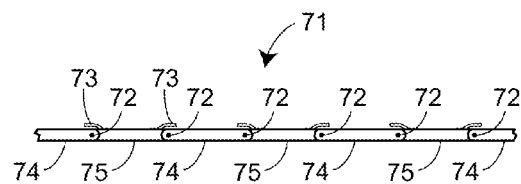
FIGS. 7-14 illustrate various examples of rigid hinged material configurations that can be used in the flexible substrate of FIG. 6 to provide bending limiting motion in two dimensions.

As one example of the hinged or linked rigid materials 25, FIG. 7 illustrates a cut-through section of various flat and rigid members that form interconnected slats or plates have alternating members 74 and members 75 with wings or protrusions 73 on the edges thereof, wherein the wings 73 are disposed above the adjacent flat members 74. The flat members 74 are pivotally connected to the flat members 75 so that the wings 73, when disposed above a flat member 74, prevent or at least limit rotation about the pivot point 72 in one direction while allowing such rotation in the opposite direction.

Of course, if desired, the shape and/or curvature of the wings 73 can be varied to permit more or less rotation about the pivot point 72. In some cases, it may be desirable to vary the shape and/or curvature of only some of the wings 73. For example, wings 73 that permit greater bending can be used at or along sections of the support 12 (e.g., the sections disposed along the potions of the substrate 12 where more curvature is desirable) and other wings 73 that permit less bending be used at or along sections of the support 12 at which less bending is desired.

Figure 8:
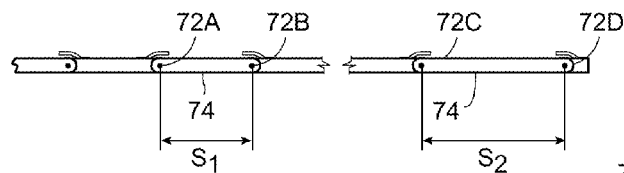
Figure 9:
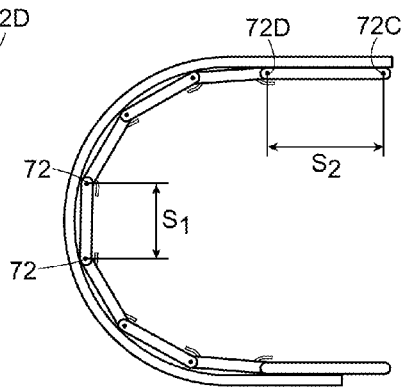

In some cases, the spacing between the pivot points 72 may be adjusted to control (e.g., adjust) the minimum radius of curvature at which the support 12 can be bent at that point, and, in turn, provide a more comfortably shaped support 12 when worn as part of, for example, the armband 8 of FIG. 1. As shown in FIG. 8, the spacing between the pivot points 72 can be different at different points along one or both of the dimensions of the support 12. In other words, the pivot points 72 in one section of the support 12 may be a distance of d1 apart from one another, while the pivot points 72 in another section of the support 12 may be a distance of d2 apart from one another, d2 being greater or less than d1. For example, the spacing between pivot point 72A and 72B (S1 in FIGS. 8 and 9) is less than the spacing between pivot point 72C and 72D (S2 in FIGS. 8 and 9). As such, different sections of the support 12 can be bent or flexed more than other portions of the band 12, as illustrated in FIG. 9.

Figure 10:
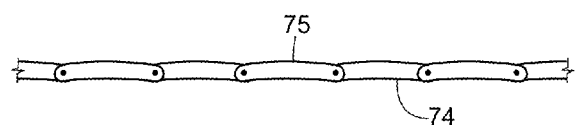
Figure 11:
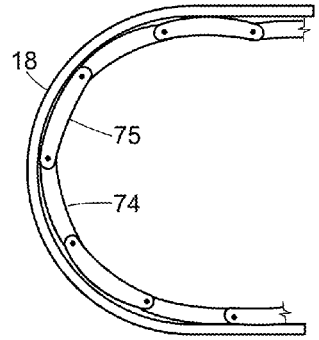

As illustrated in FIG. 10, the interconnected members 74 and 75 can be arched or curved. As illustrated in FIG. 11, such a configuration serves to reduce, or even eliminate, the sharpness of the bending at the pivot points 72, thereby providing a more continuous shape when the support 12 is bent. In some cases, it may be desirable to arch the members 74 and 75 so that the local display bending radii at the pivot points 72 are equal and opposite when the support 12 is both flat and bent (e.g., disposed around the arm).

Figure 12:
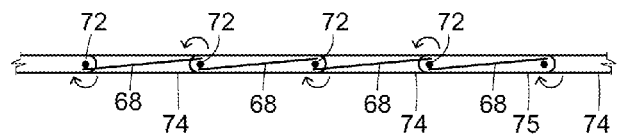

In some instances, it may be desirable to limit the number of configurations that the device 10 can take on, such as to for example, reduce cheap-looking configurations, configurations that provide a confusing user experience, or configurations in which the device 10 is likely to be damaged. To this end, one or more of the pivot 72 points can be connected together with or using an interconnecting wire. As shown in FIG. 12, the pivot points 72 are connected together with or using an interconnecting wire 68. In some cases, several interconnecting wires 68 may be needed to connect different groups of pivot points 72. For example, one wire 68 may be utilized to interconnect pivot points 72 disposed along one side of the support 12, while another wire 68 may be utilized to interconnect pivot points 72 disposed along the opposite side of the support 12. Wires 68 may be used in either or both of the longitudinal and transverse directions of the support 12. In any event, the interconnecting wire(s) 68 serve(s) to synchronize the movement of the pivot points 72 that are connected to one another, which, in turn, fixes the angle between interconnected bars 74 and 75 for those pivot points 72 that are connected together.

Figure 13:
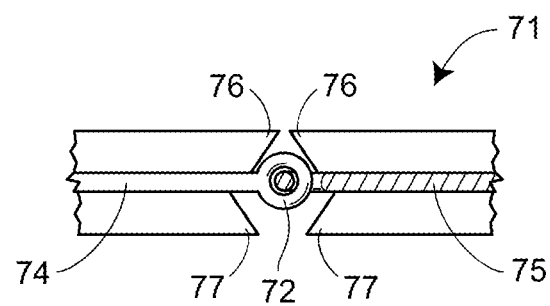

In FIG. 13, the interconnected members 74 and 75 are connected at pivot points 72 and each member includes a protrusion 76 that extends at least partially above the pivot point 72. In this case, the protrusions of adjacent members 74 and 75 contact each other very soon (in response to minimal rotation about the pivot point 72) when rotated in one direction, to thereby limit or prevent such rotation, and allow rotation in the opposite direction. Moreover, the interconnected rigid members 74 and 75 may additionally include protrusions 77 that extend below the pivot point 72 but that are spaced further apart and thus allow more rotation than the protrusions 76. The protrusions 77 will thus enable the member 71 to bend in one direction (i.e., the down direction in FIG. 13) more than in the other direction (i.e., the up direction in FIG. 13). However, the protrusions 77 will still prevent bending or flexing at large angles of curvature and the spacing and interaction of the protrusions 76 and 77 can be configured to limit the minimal bending radius of the support element 71 to be greater than or equal to the minimum critical bending radius of the flexible electronic display 18 disposed on the support 12, to thereby protect the flexible electronic display 18. In any event, the spacing and size of the protrusions 76 and 77 can be adjusted to obtain the desired amount of flexing in each direction.

Figure 14:
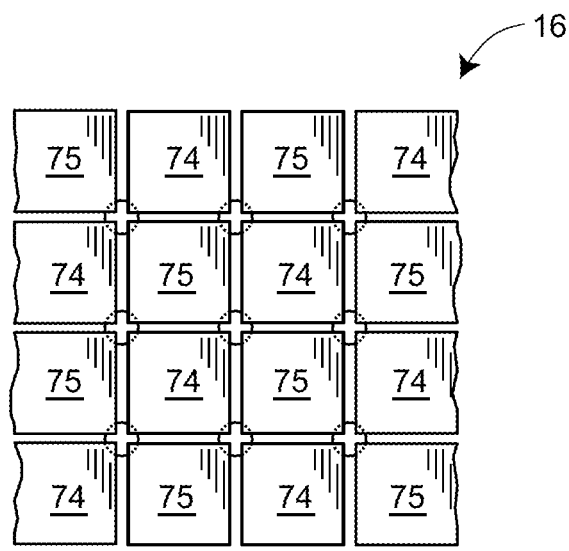

Of course, it will be understood that the illustrations of FIGS. 7-13 depict possible hinged connections in one dimension (e.g., the longitudinal dimension of the support 12) but that the same or similar structure could be used in the other dimension (e.g., the transverse dimension). FIG. 14 illustrates a top view of a set of flat members that are hinged or interconnected on all sides thereof in any of the manners described above to allow for flexing of the substrate along two dimensions while limiting that flexing to protect the flexible electronic display 18. Here, as will be understood, the pivot points 72 may be points that allow pivoting thereabout in both the transverse and longitudinal directions and may be formed as, for example, interconnected rings. The structure of FIG. 14 includes a set of flat members 74 and 75 that are connected at the corners thereof about pivot points 72. In this example, four adjacent flat members 74 and 75 are connected at one corner defining a pivot point 72. In this case, the pivot points 72 may comprise interconnected rings. As will be understood, the various sets of interconnected links, rigid members, loops, rings, etc., as described herein may be used as or may be part of the flexible support 12, and may operate to limit the bending motion of the flexible support 12 along each of the two orthogonal dimensions (e.g., the longitudinal and transverse dimensions of the support 12). Of course, the interconnected links or flat members illustrated in FIG. 14 could additionally have wings or protrusion structure such as that of FIGS. 7-13, or other structure that limits rotation of adjacent links about the pivot points 72 interconnecting the links, to provide superior bending or flexing limiting structure. In another embodiment, such as that illustrated in FIG. 6, the interconnected and hinged rigid elements may themselves be formed as sets of interconnected or intertwined rings, loops or wires which enable bending in two orthogonal dimensions.

Of course, FIGS. 7-13 illustrate the hinged connections in one direction of the support 12 (e.g., the longitudinal direction) and it will be understood that similar structure could be provided in the other of the directions (e.g., the transverse direction). As such, each link or portion of the bending limiting structure could be a small square or rectangle of material with hinges on all four sides thereof as illustrated in FIG. 14. Of course, the hinged pieces could take on other shapes as well, such a triangular shapes, octagonal shapes, etc. with hinges on multiple sides thereof. Still further, the hinged or winged structures of FIGS. 7-14 could be provided on two sides of the members 74 and 75 (using for example the double-sided wing structure of FIG. 13) to provide bending limiting motion both in the up direction (in which the display surface of the display 18 will be bent to be concave) and the down direction (in which the display surface of the display 18 will be bend to be convex).

In any event, the configurations of the members 71 of FIGS. 7-14 allow or enable movement of the adjacent slats or flat members 74, 75 with respect to one another in one direction, e.g., the down direction in FIGS. 7 and 8, limited to a particular minimum bending radius, while limiting the rotational movement of the slats or bars 74 and 75 in the opposite direction, such as the up direction in FIGS. 7 and 8, to the same or a different minimum bending radius. Moreover, this structure provides bending limiting action in both the longitudinal and transverse directions of the support 12.

Figure 15A:
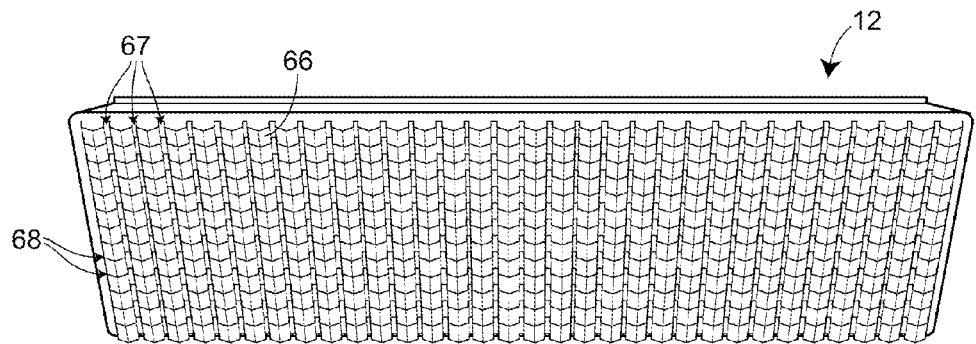
FIG. 15A illustrates a third flexible substrate having an integral material with grooves disposed along two dimensions that operate to limit the bending range of the flexible substrate in two dimensions.
Figure 15B:
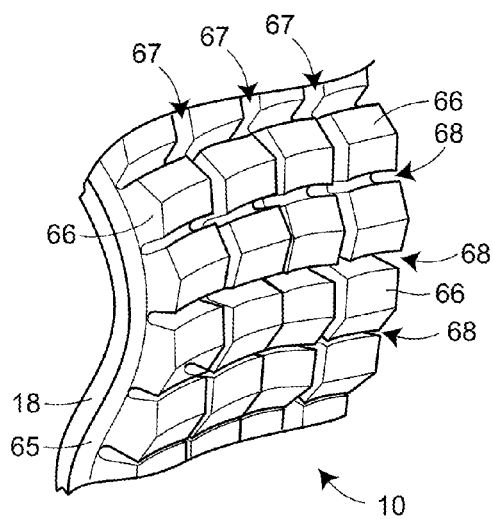
FIG. 15B depicts an expanded view of a portion of the flexible substrate of FIG. 15A bent in multiple directions to conform to a complex curved surface.

FIGS. 15A and 15B illustrate yet another bending limiting structure that can be used within the support 12. In this case, the material forming the support 12 may be used to effect the bending limiting motion. As illustrated in FIGS. 15A and 15B, the support 12 is made, at least partially, of an integrally formed sheet of material 66 having a plurality of grooves 67 and 68 being formed (e.g., molded) into the underside of the support 12 generally extending from one side of the support 12 to another side of the support 12 in both directions. The grooves 67 and 68 are, in this case, orthogonal to each other and the grooves 67 run from one transverse side to the other transverse side while the grooves 68 run from one longitudinal side to the other longitudinal side of the support 12. As illustrated best in FIG. 15B, each groove 67 and 68 extends through only a portion of the thickness of the support 12, such that the support 12 includes a continuous bottom layer of material 65 immediately adjacent an underside of the flexible display 18 and a plurality of sections or islands 66 that jut out or extend upward from the bottom layer 65 formed by the respective grooves 67 and 68. The grooves 67 and 68 illustrated herein each have a U-shape, but can, in other embodiments, have a different shape (e.g., a rectangular shape, a triangular or V-shape), could be more or less curved, could be flatter, could be wider, etc. So defined, each of the grooves 67 and 68 forms a sort of "living hinge" that operates to control (e.g., limit or reduce) the amount of bending between the sections 66 of the support 12 that are adjacent to that groove 67 or 68, as the sides of these grooves 67 and 68 (forming the islands 66) come into contact with each other at some point of flexing, to limit further flexing motion. FIG. 15B illustrates how the grooves 67 and 68 can, when the support 12 is being bent, operate to control the amount of bending between the sections or islands 66 of the support 12, and, in turn, control the amount of bending applied to the display 18 at any particular location. Because the grooves 67 and 68 are evenly spaced apart across the support 12, all of the sections 66 of the support 12 are subject to the same amount of bending or flexing limit in both directions. The material forming the bottom layer of material 65 and the material forming the islands 66 may be made of the same or different material and each may be made of either compressible material (such as foam, rubber, etc.) or non-compressible material (such as hard plastic, metal, etc.) In fact, both of the layers 65 and the islands 66 may be made of non-compressible materials, one of the layers 65 and the islands 66 may be made of a compressible material while the other layer or island may be made of a non-compressible material, or the layers 65 and the islands 66 may be both made of compressible materials with the same or different degree of compressibility. Of course, the spacing between the various grooves 67 and the various grooves 68 can be varied to provide for more or less flexing of the support 12 in the different directions or even at different locations of the support 12 in or along a single direction.

In other examples, the grooves 67 and 68 can alternatively or additionally be formed (e.g., molded) into the top side of the support 12. In this manner, the grooves 67 and 68 can, when the support 12 is being bent, operate to control the amount of bending applied to the display 18 in a different direction (e.g., up instead of or in addition to down). In the event that the grooves 67 and 68 are formed (e.g., molded) into the underside and the top side of the support 12, the grooves 67 and 68 can define the same or a different bending limit in the two different directions. Of course, the size (e.g., the width), the number, and/or the spacing of the grooves 67 and 68 and/or the compressibility of the material forming the islands 66 and the grooves 67 and 68 may be varied to define, and thus limit, the amount of bending motion that can be applied to the support 12 in each direction (e.g., the transverse direction and the longitudinal direction). For example, while the grooves 67 and 68 shown in FIGS. 15A and 15B only extend through a portion of the support 12, the grooves 67 and 68 may, in other embodiments, extend through more or less of (deeper or less deep into) the support 12, which would, in turn, affect the degree of curvature permitted by the grooves 67 and 68. As another example, the grooves 67 and 68 can be oriented differently relative to one another (i.e., so that the grooves 67 and 68 are not disposed orthogonal to one another). Moreover, the support 12 can include three sets of grooves angled with respect to one another (e.g., arranged at 60 degrees relative to one another), thereby forming a pattern of triangular grooves. As another example, the width of the grooves 67 and/or 68 illustrated in FIGS. 15A and 15B can be increased or decreased to increase or decrease the amount of bending permitted by the support 12. As noted above, the grooves 67 and 68 illustrated in FIGS. 15A and 15B are evenly spaced across the band portion 12, such that all portions of the band 12 are subject to the same bending or flexing limit. However, this spacing could be varied in any desired manner to vary the bending range or motion allowed by the grooves 67 and 68.

For example, sets of the grooves 67 and/or 68 can be spaced at different distances from each other across transverse or longitudinal length of the support 12, with the effect that different portions of the support 12 can be bent or flexed more than other portions of the support 12. For example, in an embodiment, the grooves 67 may be spaced at different distances from one another across the transverse span of the support 12 while the grooves 68 may be equally spaced apart. In one example, the distances between the grooves 67 near or at an end of the support 12 may be greater than the distance between the grooves 67 near or at a middle portion of the support 12. In another embodiment, the grooves 67 may be evenly spaced apart while the grooves 68 are spaced apart at different distances from one another across the longitudinal span of the support 12. In another embodiment, the grooves 67 and 68 may be unevenly spaced in both directions. Likewise, the spacing used for the grooves 67 may be the same or different than the spacing used for the grooves 68. As such, different portions of the support 12 can be bent or flexed more than other portions of the support 12.

Generally speaking, the flexible display 18 may be mounted onto the substrate or support 12 using a number of different techniques, such as using adhesive or other materials that cause the flexible display 18 to be attached to and to bend with the substrate 12 and thus be limited by the bending limiting structure of the substrate 12, which thus protects the flexible electronic display 18 by preventing the display 18 from bending past its minimum critical bending radius. The flexible display 18 may be selectively mounted to the substrate 12 or support 12 (e.g., adhesive may be selectively applied on or at certain locations between the display 18 and the support 12), or the entirety of the flexible display 18 may be mounted to the substrate or support 12. However in other cases, the flexible electronic display 18 may be coupled to the bending limiting structure of the substrate 12 in a moveable or slidable manner, which enables the flexible electronic display 18 to bend with its own neutral line that is positioned differently than the bending neutral line of the substrate 12, while the substrate 12 still limits the bending motion of the flexible electronic display 18.

In particular, to prevent the flexible electronic component (e.g., the display 18) from being bent or curved beyond its minimum critical bending radius, but at the same time substantially maintain the bending ability of the flexible electronic component, the article 10 can, in some cases, include a flexible support that is movably (e.g., slidably) coupled with or to the flexible electronic component in a manner that allows the flexible support and the flexible electronic display component to move (e.g., slide) relative to or independently of one another when the article 10 is moved between different positions (e.g., between a substantially flat position and a bent position). Three examples of such an arrangement are described in connection with FIGS. 16A-16D, FIGS. 16E-16H, and FIGS. 17A and 17B. While these arrangements are generally described as including a flexible display 18, it will be appreciated that any of them can instead include a different type of flexible electronic component (e.g., a flexible electronic circuit, a sensor tag, a flexible OLED light) instead of an electronic display.

FIGS. 16A-16D illustrate a dynamically flexible, attachable article 10, again in the form of a wristband, that includes a flexible and stretchable support structure 16 and a flexible electronic component in the form of a flexible electronic display 18 movably disposed within the flexible support structure 16. The article 10 also includes a horizontal or longitudinal axis 11 and a pair of spring elements 21A, 21B.

Figure 16A:
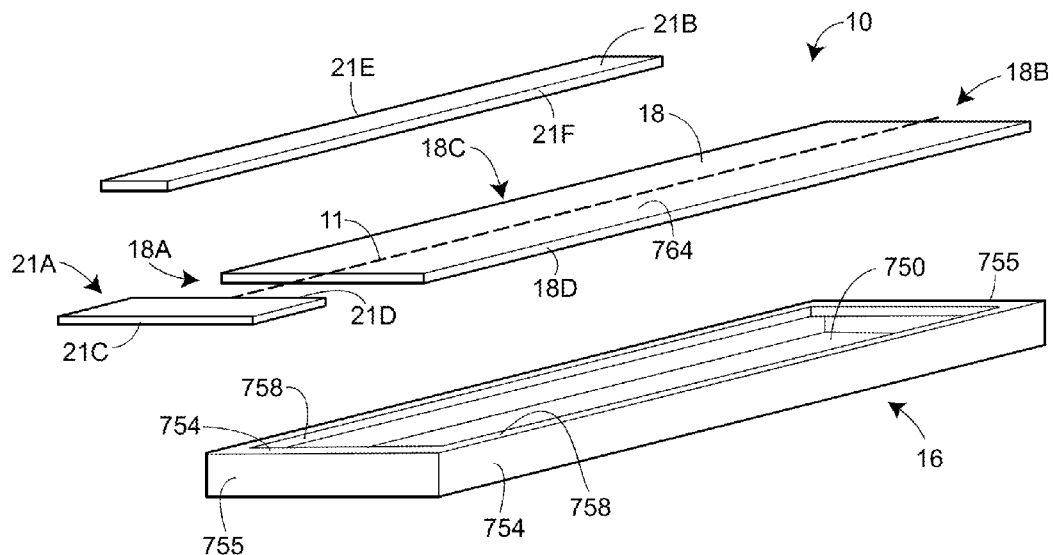
FIGS. 16A and 16B illustrate another example attachable article in the form of a wristband having a flexible electronic display slidably coupled to a flexible support in a manner that minimizes or reduces strain on the flexible display during bending.
Figure 16B:
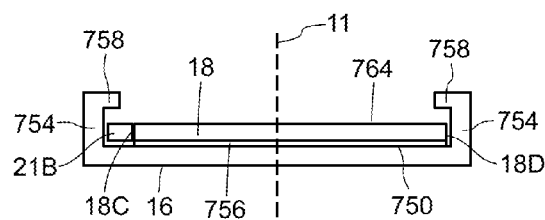

The flexible support structure 16 is generally configured to provide support to the flexible electronic display 18. The flexible support structure 16 can be made of any suitable flexible material such as, for example, cloth, leather, plastic, metal, or other material. As illustrated in FIGS. 16A and 16B, the flexible support structure 16 in this example has or is defined by a longitudinally-extending, elongate bottom wall 750, a pair of opposing sidewalls 754 that extend upward, at an angle substantially perpendicular to the longitudinal axis 11, from a longitudinally-extending perimeter edge of the bottom wall 750, and a pair of opposing end walls 755 that extend upward, at an angle substantially perpendicular to the longitudinal axis 11, from a transversely-extending perimeter edge of the bottom wall 750. In some cases, it may be necessary to attach (e.g., glue) one of the walls 754 and 755 to the bottom wall 750 after the display 18 has been seated in the flexible support structure 16. As illustrated in FIG. 16B, a lubricant 756 (e.g., oil, graphite, PTFE) can be disposed on (e.g., applied to) the bottom wall 750, or portions thereof, to facilitate movement between the support structure 16 and the flexible electronic display 18. The flexible support structure 16 further has a retaining portion 758 that extends laterally inward from a top portion of each of the opposing walls 754 and a top portion of each of the opposing walls 755, such that the retaining portions 758 hang over the bottom wall 750 of the support structure 16. Together, the bottom wall 750, the sidewalls 754, the end walls 755, and the retaining portions 758 define a cavity 762 sized to support and receive the flexible electronic display 18 therein. As illustrated in FIG. 16B, the cavity 762 has a substantially rectangular-shape in cross-section.

Figure 16C:
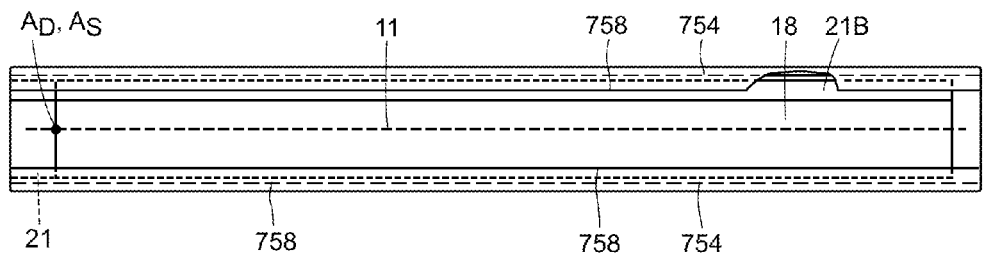
FIG. 16C illustrates a top view of the attachable article depicted in FIGS. 16A and 16B.

The flexible electronic display 18 can generally take the form of any of the displays 18 described herein or a different display 18 consistent with any of the embodiments described herein. Although not illustrated herein, the flexible electronic display 18 can, but need not, include an anti-reflective coating applied thereon in an effort to optimize the optical performance of the display 18. As illustrated in FIG. 16C, when the article 10 is in a substantially flat position, the flexible display 18 is shorter and narrower than the flexible support structure 16, though this need not be the case (e.g., the display 18 and the support 16 can have the same length and/or the same width).

The spring element 21A is provided to apply tension to one end of the flexible electronic display 18, while the other spring element 21B is provided to apply tension to one side of the flexible electronic display 18. This applied tension facilitates the sliding movement between the flexible support structure 16 and the flexible electronic display 18 and helps to keep the electronic display 18 taut (i.e., in a substantially flat configuration) at all times. In the illustrated example, the spring element 21A is a substantially flat spring having a first end 21C and a second end 21D opposite the first end 21C, while the spring element 21B is a substantially flat spring having a first side wall 21E and a second side wall 21F opposite the first side wall 21E. In this example, the first and second ends 21C and 21D have a width that is smaller than the width of the support 750 and approximately equal to the width of the display 18. The first and second sidewalls 21E and 21F have a length that is approximately the same as the length of the display 18 and shorter than the length of the support 750. In other examples, the spring elements 21A, 21B can be a different type of spring (e.g., a coil spring, a leaf spring) or take a different form and yet still be suited for the intended purpose. For example, the spring elements 21A, 21B can take the form of a small cylinder with an axle disposed therethrough. As another example, the spring elements 21A, 21B can take the form of a mechanical slider. In yet another example, the length and/or width of the spring elements 21A, 21B can vary from what is illustrated.

As illustrated in FIG. 16B, the flexible electronic display 18 can be seated or disposed in the cavity 762. In turn, the sidewalls 754 of the flexible support structure 16 extend upward adjacent and in some cases above the edges of the flexible display 18, such that the sidewalls 754 can provide side impact protection for the flexible display 18, and the end walls 755 of the flexible support structure 16 extend upward adjacent and in some cases above the ends of the flexible display 18, such that the end walls 755 can provide end impact protection for the display 18. In addition, the retaining portions 758, which extend inward of the edges of the flexible display 18, can contact a top surface 764 of the flexible display 18 to prevent the flexible display 18 from exiting the flexible support structure 16, thereby retaining the flexible display 18 within the flexible support structure 16.

Each spring element 21A, 21B is coupled to a portion of the flexible support structure 16 and coupled to a portion of the flexible electronic display 18. Specifically, as illustrated in FIGS. 16A and 16C, the end 21C of the spring element 21A is fixedly attached (e.g., adhered) to a portion of one of the end walls 755 of the support structure 16, and the end 21D is fixedly attached (e.g., adhered) to a bottom surface of the flexible display 18 at one end 18A of the flexible electronic display 18. As illustrated in FIG. 21B, the side wall 21E of the spring element 21B is fixedly attached (e.g., adhered) to a portion of one of the side walls 754 of the support structure 16, and the side wall 21F of the spring element 21B is fixedly attached (e.g., adhered) to a bottom surface of the flexible display 18 along one side 18C of the flexible electronic display 18. The spring elements 21A, 21B in this example are thus disposed between the flexible support structure 16 and the flexible electronic display 18. In other examples, the spring elements 21A, 21B can be coupled in a different manner. The spring element 21A, 21B can be coupled to a different portion of the flexible support structure 16 (e.g., to the bottom wall 750), can be coupled to a different portion of the flexible electronic display 18 (e.g., to the end 18A itself), and/or can be coupled at or along a different portion of the display 18 (e.g., at the other end 18B of the flexible electronic display 18). When, for example, the spring element 21A or 21B takes the form of a small cylinder with an axle disposed therethrough, the display 18 can be attached to the cylinder (e.g., to one or both ends of the cylinder) such that the display 18 can be rolled or unrolled when the article 10 is bent. In one case, the display 18 can be attached to the cylinder such that the display 18 can partially rotate (i.e., turn by a certain amount of degrees) when the article 10 is bent, thereby rolling or unrolling a part of the display that is attached to the cylinder. Alternatively, the cylinder can be coupled to or at one end or side of the display 18 and the axle can be movably coupled to the flexible support structure 16 (e.g., via a slot formed in the sidewalls 754) when the article 10 is bent. When, for example, the spring element 21A or 21B takes the form of a mechanical slider, the mechanical slider can be attached to or at one end or side of the display 18 and movably coupled to the flexible support structure 16 (e.g., via rails disposed on the bottom wall 750 of the support structure 16). It will be appreciated that the article 10 can also include additional spring element(s) 21, such as, for example, an additional spring element 21A such that tension is applied to each of the ends 18A, 18B of the flexible electronic display 18.

Figure 16D:
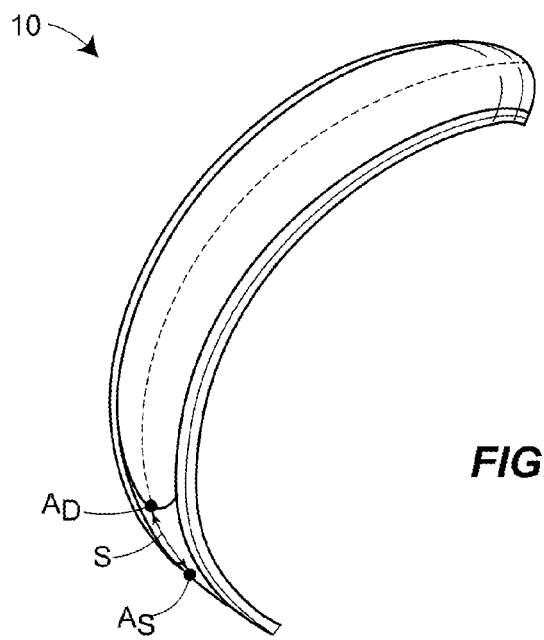
FIG. 16D illustrates the attachable article depicted in FIGS. 16A and 16B when bent or curved in two-dimensions.

In this manner, the flexible display 18 is slidably coupled with or to the flexible support structure 16 (and vice-versa), with the flexible display 18 being slidable independently of or relative to the flexible support structure 16 (and vice-versa). Accordingly, as the article 10 is bent in various two-dimensional manners, as illustrated in FIG. 16D, the flexible display 18 moves independently of or relative to corresponding portions of the flexible support structure 16 (and vice-versa). When, for example, the article 10 is bent to match a complex curved surface (i.e., is bent in or along two dimensions), as illustrated in FIG. 16D, the flexible display 18 bends (and may slide) within the cavity 762 of the support structure 12. At the same time, the spring element 21A applies a tension force to the end 18A of the flexible electronic display 18 and the spring element 21B applies a tension force to the side 18C of the display 18, thereby facilitating this movement and helping to keep the flexible electronic display 18 taut. Like the spring elements 21A, 21B, the lubricant 756 helps to facilitate the movement between the support structure 16 and the display 18. More specifically, when the article 10 is bent in these various two-dimensional manners, as illustrated in FIG. 16D, (i) the spring element 21A pulls on the end 18A of the flexible display 18 and the ends 18A, 18B of the flexible display 18 slide within the cavity 762, relative to the flexible support 16 and toward one another, thereby creating a small degree of separation between ends of the flexible display and ends of the bottom wall 750, and (ii) the spring element 21B pulls on the side 18C of the flexible display 18 and the sides 18C, 18D of the flexible display 18 slide within the cavity 762, relative to the flexible support 16 and toward or away from the sidewalls 754, respectively, depending on the nature of the two-dimensional bending. With reference to FIGS. 16C and 16D, when the article 10 is bent in various two-dimensional manners, point $A_D$ of the flexible display 18 slides, relative to point $A_S$ of the flexible support structure 16, thereby creating spacing S between point $A_D$ and $A_S$. At some point, the article 10 can be bent to such a degree that the retaining portions 758 contact corresponding portions of the top surface 764 of the display 18. However, the support structure in the bottom wall 750 may limit the bending motion of the bottom wall and thus the bending motion of the display 18 to a predetermined minimal bending radius. At this point, the article 10 has reached its pre-defined bending limit and any further bending of the article 10, particularly the flexible display 18, in one dimension (e.g., the outward direction) is prevented. Conversely, the article 10 can be returned to the substantially flat position, as illustrated in FIGS. 16A and 16B, in a similar manner.

At the same time, because the flexible support 16 is slidably coupled to or with the flexible electronic display 18, the arrangement illustrated in FIGS. 16A-16D does not alter the central bending or neutral plane of the flexible electronic display 18, thereby substantially maintaining the bending ability (e.g., the bending range) of the display 18. In other words, such an arrangement leaves the article 10 with a bending range that is substantially similar to the bending range of the flexible electronic display 18 itself.

In other examples, the article 10 can vary from the one illustrated in FIGS. 16A-D. The flexible support 16 illustrated in FIGS. 16A-D can vary in shape and/or size. The flexible support 16 can, for example, be wider, thereby creating more space between the flexible display 18 and the sidewalls 754. The sidewalls 754 and/or the end walls 755 can, for example, be angled more or less relative to the bottom wall 750. The retaining portions 758 can, for example, be constructed differently (e.g., can extend along only a portion of the length of the article 10, can be angled more or less relative to the sidewalls 754). The cavity 762 can be of a different size (e.g., smaller, larger) and/or can have a different shape in cross-section. As yet another example, the flexible support 16 need not include the retaining portions 758. Instead, the flexible support 16 can be slidably or otherwise movably coupled with the flexible display 18 in a different way (e.g., using angled sidewalls 754). The flexible electronic display 18 can also take the form of a different flexible electronic component, such as, for example, a sensor tag, a flexible OLED light, a flexible electronic circuit, or a collapsible e-reader.

FIGS. 16E-16H illustrate a dynamically flexible, attachable article 10, again in the form of a wristband, that is substantially similar to the article 10 illustrated in FIGS. 16A-16D. The article 10 in this case includes a flexible support structure 16 and a flexible electronic component in the form of a flexible electronic display 18 that is movably disposed within the flexible support structure 16. The article 10 also includes a horizontal or longitudinal axis 11 and a pair of spring elements, similar to the spring elements 21A, 21B illustrated in FIGS. 16A-16D, though the spring elements are not illustrated in FIGS. 16E-16H for clarity reasons. Unlike the article 10 illustrated in FIGS. 16A-16D, the article 10 illustrated in this example further includes a stretchable, flexible or bendable and transparent sheet of material 800 disposed on the support structure 16 and over the flexible electronic display 18.

Figure 16E:
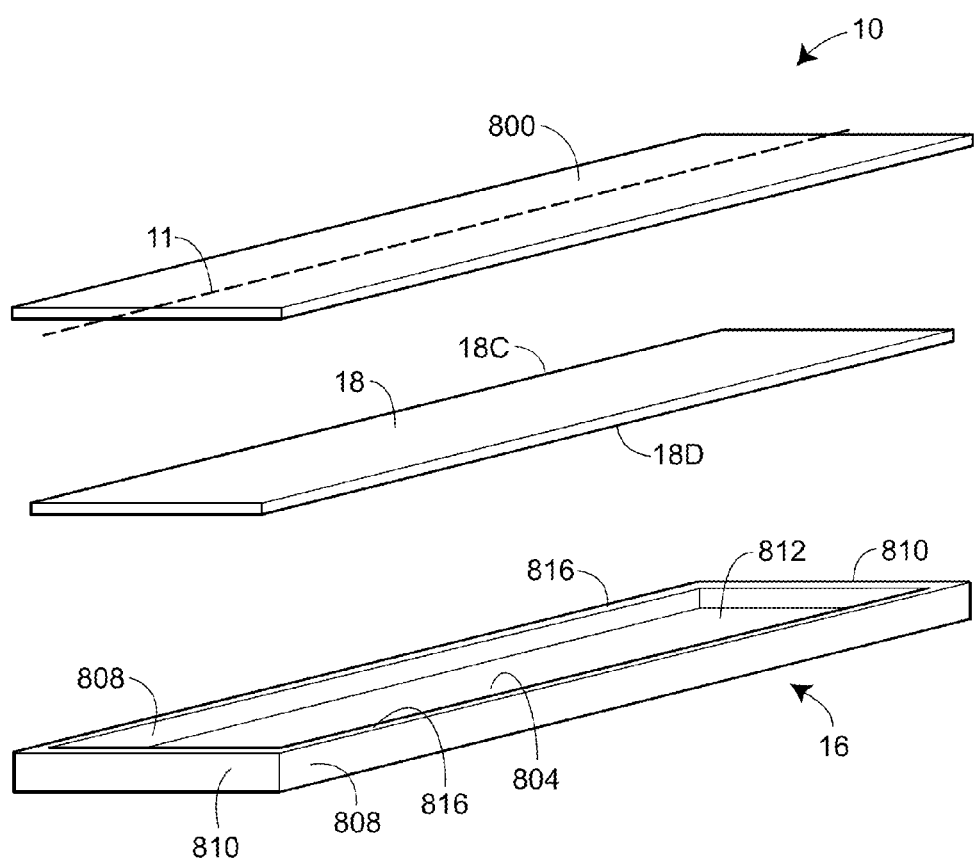
FIGS. 16E and 16F illustrate another example attachable article in the form of a wristband having a flexible electronic display slidably coupled to a flexible support having a transparent layer, in a manner that minimizes or reduces strain on the flexible display during bending.

The flexible sheet 800 illustrated in FIG. 16E has a substantially rectangular shape similar to the shape of the flexible support structure 16 and the display 18. The sheet 800 in this example has a width that is larger than a width of the display 18 and that is substantially equal to the width of the flexible support structure 16. The sheet 800 is a generally transparent layer, such that image content provided on the display 18 is viewable through the sheet 800. The sheet 800 can be made of any suitable flexible or bendable material, such as, for example, plastic (e.g., acrylic), glass (e.g., Plexiglass), and/or any other flexible material(s). Though not illustrated herein, an anti-reflective coating can, in some cases, be applied to the sheet 800 to optimize the optimal performance of the article 10.

Figure 16F:
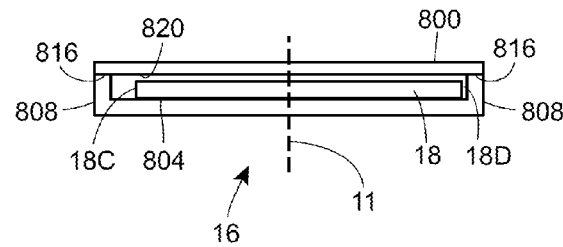

The flexible support structure 16 is generally configured to provide support to the flexible electronic display 18. The flexible support structure 16 can be made of any suitable flexible material such as, for example, cloth, leather, plastic, metal, or other material(s). As illustrated in FIGS. 16E and 16F, the flexible support structure 16 has or is defined by a longitudinally-extending, elongate bottom wall 804, a pair of opposing sidewalls 808 that extend upward from a longitudinally-extending perimeter edge of the bottom wall 804, and a pair of opposing end walls 810 that extend upward from a transversely-extending perimeter edge of the bottom wall 804. In some cases, it may be necessary to attach (e.g., glue) one of the walls 808 and 810 to the bottom wall 804 after the display 18 has been disposed in the flexible support structure 16. Though not illustrated herein, a lubricant (e.g., oil, graphite, PTFE) can be disposed on (e.g., applied to) the bottom wall 804, or portions thereof, to facilitate the movement described below between the support structure 16 and the flexible electronic display 18. Together, the bottom wall 804, the sidewalls 808, and the end walls 810 define a cavity 812 sized to support and receive the flexible electronic display 18 therein. As illustrated in FIG. 16F, the cavity 812 has a substantially rectangular-shape in cross-section. Each sidewall 808 and end wall 810 has an exposed portion 816 sized to support and receive a corresponding portion of the layer 800 thereon.

Figure 16G:
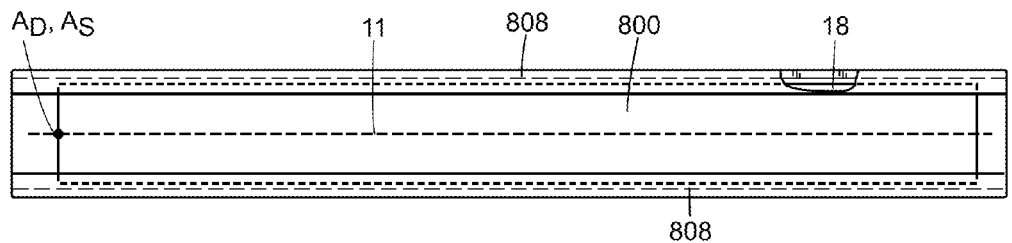
FIG. 16G illustrates a top view of the attachable article depicted in FIGS. 16E and 16F.

As illustrated in FIG. 16F, the flexible electronic display 18 can be seated or disposed in the cavity 812. As illustrated in FIG. 16G, when the article 10 is in a substantially flat position, the flexible display 18 is shorter and narrower than the flexible support structure 16, though this need not be the case (e.g., the display 18 and the support 16 can have the same length and/or the same width). With reference back to FIG. 16F, the sidewalls 808 of the flexible support structure 16 can extend upward above and circumscribe the edges of the flexible display 18, such that the sidewalls 808 can provide side impact protection for the flexible display 18. As illustrated in FIG. 16E, the end walls 810 can also extend upward above and circumscribe the edges of the flexible display 18, such that the end walls 810 can provide end impact protection for the flexible display 18. The flexible sheet 800 can, in turn, be disposed on the flexible support structure 16 and may be attached to the sidewalls 808 and the end walls 810 via, for example, adhesive. More particularly, portions of an underside 820 of the layer 800 can be disposed on the respective exposed portion 816 of the flexible support structure 16, as illustrated in FIG. 16F. The layer 800 can be secured (e.g., adhered) in this position in any known manner (e.g., using adhesive). So secured, the layer 800 is configured to retain (e.g., seal) the flexible display 18 within the support structure 16. In this manner, the flexible support structure 16 is slidably coupled with or to the flexible electronic display 18 (and vice-versa), with the flexible support structure 16 being slidable independently of or relative to the flexible electronic display 18 (and vice-versa).

Figure 16H:
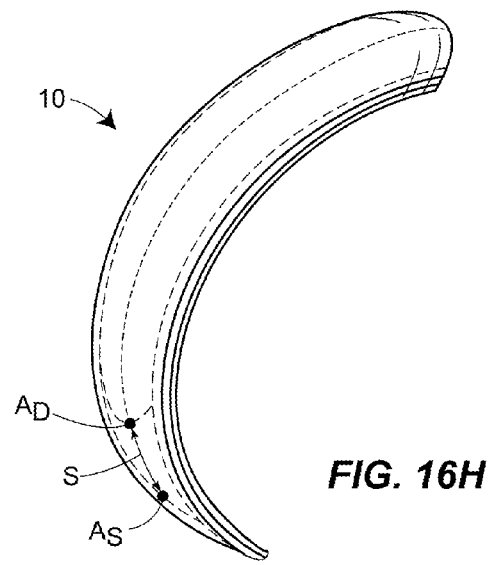
FIG. 16H illustrates the attachable article depicted in FIGS. 16E and 16F when bent or curved in two dimensions.

Accordingly, as the article 10 is bent in various two-dimensional manners, as illustrated in FIG. 16H, the flexible display 18 moves independently or relative to corresponding portions of the flexible support structure 16. When, for example, the article 10 is bent to match a complex curved surface (i.e., is bent in or along two dimensions), as illustrated in FIG. 16H, the flexible display 18 bends (and may slide) within the cavity 812. More specifically, when the article 10 is bent in various two-dimensional manners, as illustrated in FIG. 16H, end portions of the flexible display 18 slide within the cavity 812, relative to the flexible support structure 16 and toward one another, thereby creating a small degree of vertical separation between some portions of the flexible display 18 and the bottom wall 804. At the same time, edges 18C, 18D of the flexible display 18 move toward or away from the sidewalls 808, respectively, depending on the nature of the two-dimensional bending. Moreover, with reference to FIGS. 16G and 16H, when the article 10 is bent in two dimensions, point $A_D$ of the flexible display 18 slides, relative to point $A_S$ of the flexible support structure 16, thereby creating spacing S between point $A_D$ and $A_S$. At some point, the article 10 can be bent to such a degree that portions of the flexible display 18 contact corresponding portions of the underside 820 of the layer 800 or to the limits of the bending characteristics of the bottom wall 804. At this point, the article 10 has reached its pre-defined bending limit and any further bending of the article 10, particularly the flexible display 18, in this dimension (e.g., the outward direction) is prevented. Conversely, the article 10 can be returned to the substantially flat position, as illustrated in FIGS. 16E and 16F, in a similar manner.

At the same time, because the flexible support 16 is slidably coupled to or with the flexible electronic display 18, the arrangement illustrated in FIGS. 16E-16H does not alter the central bending or neutral plane of the flexible electronic display 18, thereby substantially maintaining the bending ability (e.g., the bending range) of the display 18. In other words, such an arrangement leaves the article 10 with a bending range that is substantially similar to the bending range of the flexible electronic display 18 itself.

In other examples, the article 10 can vary from the one illustrated in FIGS. 16E-16H. The flexible support 16 illustrated in FIGS. 16E-16H can vary in shape and/or size. The flexible support 16 can, for example, be wider, thereby creating more space between the flexible display 18 and the sidewalls 808. The sidewalls 808 and/or the end walls 810 can, for example, be angled more or less relative to the bottom wall 804. The flexible electronic display 18 can also take the form of a different flexible electronic component, such as, for example, a sensor tag, a flexible OLED light, a flexible electronic circuit, or a collapsible e-reader. The sheet 800 can also vary in shape and/or size. The sheet 800 can, for example, have a width that is smaller than support structure 16 and that is substantially equal to the display 18 (e.g., the sheet 800 can be securely disposed between the sidewalls 808 and over the display 18). The sheet 800 can also be coupled to the support structure 16 in a different manner (e.g., using mechanical connectors or slidably) and/or in a different location. In some cases, an index-matched material (e.g., an index-matched fluid) can be disposed between the display 18 and the sheet 800 to optimize the optical performance of the article 10. In any event, as will be understood, the sheet 800 provides protection to the display 18 and helps to retain the display in the cavity 812 during use. The bottom wall 804, the sidewalls 808, the end walls 810, and the sheet 800 further operate to prevent dirt and contaminants from entering the cavity 812.

Figure 17A:
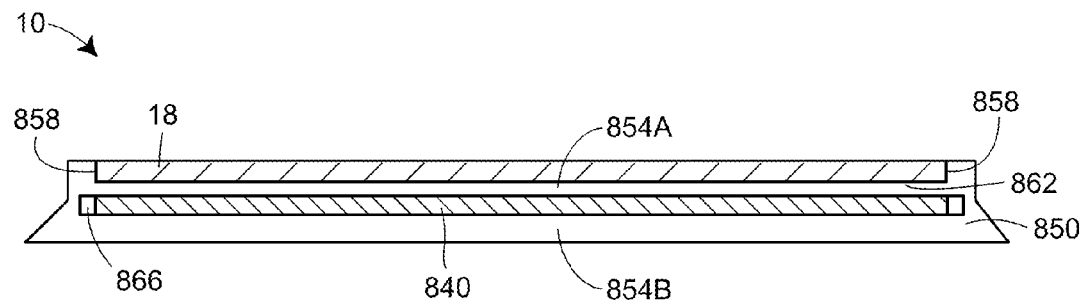
FIG. 17A illustrates a cut-away view of a flexible electronic component having a flexible electronic display mounted on a highly flexible and elastic support structure that is, in turn, slidably coupled to another flexible support structure in a manner that provides support to the flexible electronic display while minimizing or reducing strain on the flexible electronic display during bending.
Figure 17B:
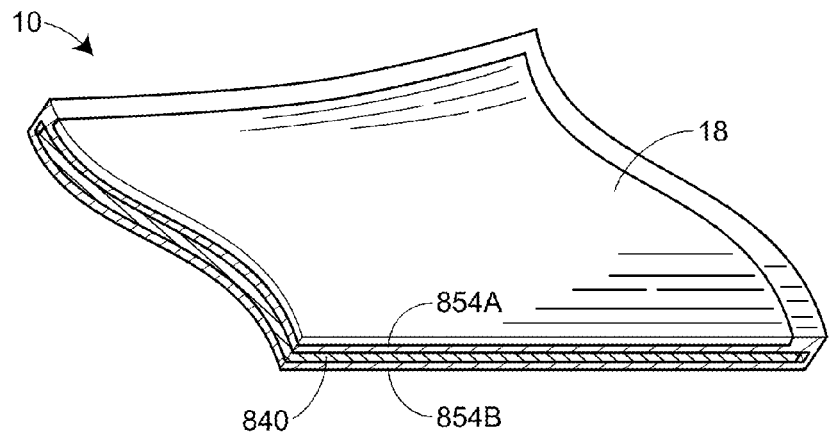
FIG. 17B illustrates a cut-away view of the flexible electronic component of FIG. 17A when bent or curved in two dimensions.

In the example illustrated in FIGS. 17A and 17B, the article 10 includes a flexible electronic component, again in the form of a flexible electronic display 18, and a pair of flexible support structures, including a first flexible support structure 840 and a second flexible support structure 850. The first flexible support 840 in this example can generally take the form of any of the flexible supports described herein with respect to FIGS. 5-15, etc., and is made of a first flexible or bendable material, such as, for example, cloth, leather, plastic, metal, and/or any other suitable flexible material. As illustrated in FIG. 17A, the second flexible support structure 850 has or is defined by a pair of longitudinally and transversely-extending, elongate support walls 854A and 854B and by pairs of opposing sidewalls 858 that extend upward, preferably at an angle perpendicular to a normal to the surface or wall 854. Together, the support walls 854 and the sidewalls 858 define a cavity 862 sized to support and receive the flexible electronic display 18 therein and define a further cavity 866. As best illustrated in FIG. 17A, the cavity 862 is substantially rectangular-shape in cross-section but could be other shapes as needed.

The second flexible support structure 850 thus has or includes a cavity in the form of a slot or a channel 866 formed therethrough. The slot 866 extends between pairs of ends of the support structure 850 (e.g., the longitudinal and transverse ends). The slot 866 is formed proximate to, but is spatially separate from, the cavity 862, as illustrated in FIG. 17A. The second flexible support structure 850 is, in this example, made of a second flexible material that has a lower Young's Modulus (i.e., is more elastic) than the material of the first flexible support 840. Moreover, preferably, the second flexible material also has a lower Young's Modulus (i.e., is more elastic) than the flexible display 18, although this need not be the case. The second flexible material can, for example, be cloth, rubber, leather, nylon, plastic (e.g., PTFE), and/or any other suitable flexible material. In one example, the second flexible material can be rubber having a Young's modulus of 0.02 G*Pa. In any event, the second flexible support structure 850 is generally more elastic, or less stiff, than the first flexible support structure 840. In some cases, the second flexible material can be significantly more elastic than the flexible material of the first support 840 and can be highly elastic or bendable.

As illustrated in FIG. 17A, the flexible electronic display 18 can be seated or disposed in the cavity 862 defined in the second flexible support structure 850. In this case, the flexible electronic display 18 may be adhered to the second flexible support structure 850 using any known adhesive, such as, for example, glue, although in other examples, the flexible electronic display 18 can be secured to the second flexible support structure 850 in a different manner (e.g., using mechanical connectors). Although not explicitly illustrated herein, the flexible electronic display 18 in this example is shorter than the flexible support structure 840 and the flexible support structure 850, although this need not be the case. In any event, the sidewalls 858 of the flexible support structure 850 extend upward adjacent to and circumscribe the edges of the flexible display 18, such that the sidewalls 858 can provide side impact protection for the flexible display 18. Although not illustrated herein, the flexible electronic display 18 can, but need not, include an anti-reflective coating applied thereon in an effort to optimize the optical performance of the display 18.

As also illustrated in FIG. 17A, the first flexible support structure 840 can be movably seated or disposed within the slot 866 of the second flexible support structure 850. The first flexible support structure 840 can be retained within the slot 866 (if desired) via friction, and may, if desired, be secured at, for example, one point in the slot 866, using adhesive (e.g., glue), or via some other manner. Although not illustrated herein, a lubricant (e.g., oil, graphite, PTFE) can be disposed between the second flexible support structure 850 and the slot 866, or portions thereof, to facilitate movement therebetween. As also not illustrated herein, the article 10 can include one or more spring elements for applying tension to one or both ends of the flexible support 840 so as to facilitate the movement between the second flexible support structure 850 and the first flexible support structure 840 and/or to help keep the flexible support 840 taut (i.e., in a substantially flat position) as the article 10 is being bent or curved. In any event, the first flexible support structure 840, by virtue of being made from stiffer material than the second flexible support structure 850, provides some rigidity to the overall support structure for the flexible electronic display 18, thereby providing some support and providing bending limiting function to the flexible display 18. Moreover, because the first flexible support structure 840 is movably coupled to or with the flexible display 18 (and vice-versa), the flexible display 18 is movable relative to or independently of the flexible support structure 840 (and vice-versa).

Accordingly, as the article 10 is bent in various two-dimensional manners, as illustrated in FIG. 17B, the flexible support structure 840 and the flexible display 18 move (e.g., bend) independently of one another. More specifically, when the article 10 is bent to match a complex curved surface (e.g., bent in or along two dimensions), as illustrated at least partially in FIG. 17B, the first flexible support structure 840 bends (and may slide) within the slot 866, while the flexible display 18 bends along with the cavity 862 of the second flexible support structure 850. The first flexible support structure 840 thus moves or slides in the cavity 866 and so moves with respect to the second support structure 850.

At the same time, because the flexible support 840 is movably coupled to or with the flexible electronic display 18, the arrangement illustrated in FIGS. 17A and 17B does not alter the central bending or neutral plane of the flexible electronic display 18, thereby substantially maintaining the bending ability (e.g., the bending range) of the display 18. In other words, such an arrangement leaves the article 10 with a bending range that is substantially similar to the bending range of the flexible electronic display 18 itself.

In other examples, the article 10 can vary from the one illustrated in FIGS. 17A and 17B. The flexible support structure 840 can, for example, vary in shape (e.g., the flexible support structure 840 need not have a substantially rectangular-shape) and/or vary in size (e.g., the flexible support structure 840 can be shorter than the flexible support 850 in one or both dimensions). Alternatively or additionally, the flexible support structure 850 can vary in shape and/or size. The sidewalls 858 can, for example, be angled more or less relative to the support walls 854A and 854B. The sidewalls 858 can, for example, include retaining portions that contact a top surface of the flexible display 18 to retain the flexible display 18 within or on the flexible support 850. The slot 866 can, for example, have a differently shaped cross-section, be formed through a different portion of the flexible support structure 850, and/or only extend through a portion of the flexible support structure 850. The flexible electronic display 18 can also take the form of a different (non-display type of) flexible electronic component, such as, for example, a sensor tag, a flexible OLED light, a flexible electronic circuit, or a collapsible e-reader. Still further, while the embodiment of FIGS. 17A and 17B illustrate a wall of flexible material 854A within the support 850 disposed between the display 18 and the support member 840, this wall may be removed so the display 18 slides against the support 840 directly. In this case, a lubricant or low friction surface treatment may be applied to the back of the display 18 and/or a top surface of the support 840 to decrease friction between these two elements. Still further, when the bending limiting structure of FIGS. 15A and 15B is used as the support 840, this structure may be modified to include islands 66 (formed by grooves 67 and 68) on both (e.g., opposite) sides of the support layer 65 (instead of just on one side of the layer 65 as illustrated in FIGS. 15A and 15B) to enable bending limiting of the display 18 in both a convex and a concave manner.

Figure 18A:
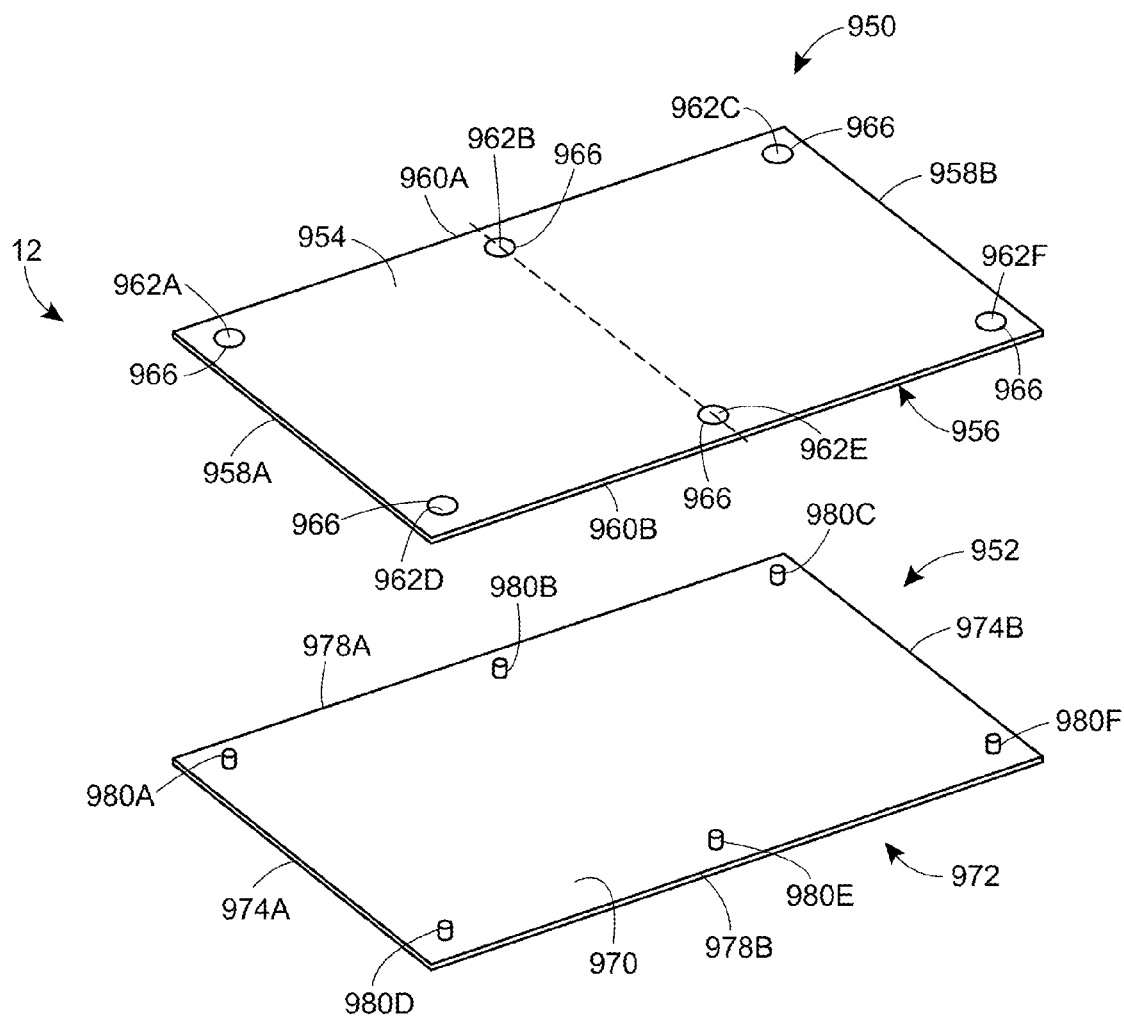
FIGS. 18A and 18B illustrate an example of a flexible support that can be coupled to the flexible electronic component to constrain bending of the flexible electronic component.
Figure 18B:
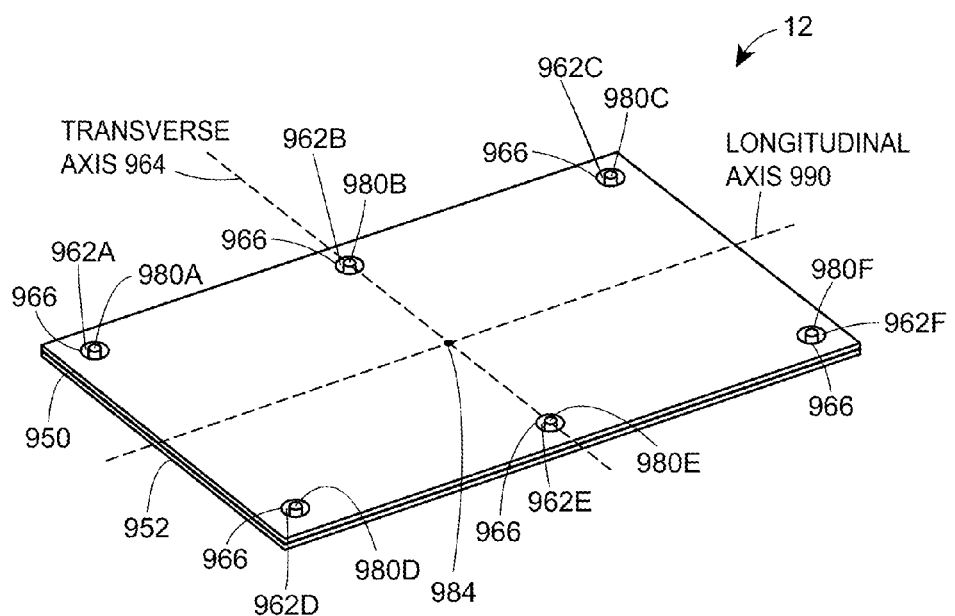

FIGS. 18A and 18B illustrate yet another bending limiting structure that can be used within or to form the support 12. The support 12 illustrated in FIGS. 18A and 18B includes a first substrate 950 and a second substrate 952 movably connected or coupled to the first substrate 950. The first and second substrates 950, 952 cooperate or interact with one another to limit or constrain bending of the support 12 to a minimal radius of curvature that is less than or equal to the minimum critical bending radius of the flexible display 18. The first substrate 950 and the second substrate 952 in this example are substantially rectangular metal (e.g., brass, aluminum, copper, steel, tin, nickel) plates or sheets, though the first substrate 950 and/or the second substrate 952 can have a different shape and/or be made of a different material (e.g., cloth, leather, plastic).

As illustrated in FIG. 18A, the first substrate 950 has a top side 954, a bottom side 956, a pair of opposing ends 958A, 958B, and a pair of opposing edges 960A, 960B disposed between the ends 958A, 958B. Six (6) circular apertures 962A-962F are formed in the first substrate 950 between the ends 958A, 958B. Apertures 962A-962C are formed in the first substrate 950 proximate to the edge 960A and apertures 962D-962F are formed in the first substrate 950 proximate to the edge 960B and opposite the apertures 962-962C, respectively. Apertures 962A and 962D are transversely aligned with one another proximate to the end 958A. Apertures 962B and 962E are transversely aligned with one another along or proximate to a central transverse axis 964 of the first substrate 950. Apertures 962C and 962F are transversely aligned with one another proximate to the end 958B. With reference still to FIG. 18A, each aperture 962A-962F is defined or formed by an inner wall 966. The inner wall 966 of each aperture 962A-962F is generally configured to constrain bending of the flexible support 12, and thus the flexible display 18, in both the longitudinal direction and in the transverse direction, as will be described in greater detail below.

As further illustrated in FIG. 18A, the second substrate 952 has a top side 970, a bottom side 972, a pair of opposing ends 974A, 974B, and a pair of opposing edges 978A, 978B disposed between the ends 974A, 974B. The second substrate 954 further includes six (6) pins 980A-980F coupled to and extending (e.g., projecting) outward from the top side 970 of the second substrate 952. The positioning of the pins 980A-980F generally corresponds to the positioning of the apertures 962A-962F, respectively, with the pins 980A-980C disposed proximate to the edge 978A and the pins 980D-980F disposed proximate to the edge 978B and opposite the pins 980A-980C. The pins 980A-980F are aligned with one another in a similar manner as the apertures 962A-962F, as discussed above.

The first and second substrates 950, 952 are aligned with and movably connected to one another in the manner illustrated in FIG. 18B to form the support 12. As the first and second substrates 950, 952 have a substantially similar shape and size, it will be appreciated that when the assembled support 12 is viewed from the top, the second substrate 952 is substantially not visible (with the exception of the pins 980A-980F), while when the assembled support 12 is viewed from the bottom, the first substrate 950 is substantially not visible. As illustrated in FIG. 18B, a central portion of the first substrate 950 is locally fixedly connected (e.g., welded, adhered, etc.) to a corresponding central portion of the second substrate 952 at a fixation point 984 centrally located between the ends 958A, 974A and the ends 958B, 974B.

When the first and second substrates 950, 952 are aligned with and movably connected to one another as illustrated in FIG. 18B, the pins 980A-980F are disposed within the apertures 962A-962F, respectively. The pins 980A-980F can, in some cases, protrude upward from or out of the top side 954 of the first substrate 950, can, in some cases, protrude downward from or out of the top side 954, or can, in other cases, be flush with the top side 954 of the first substrate 950. At least initially, and when the device 10 is in a substantially flat position (illustrated in FIG. 18B), the pins 980A-980F will be disposed at a center point of the apertures 962A-962F, respectively.

Although not explicitly illustrated herein, the support 12 can be coupled to the flexible display 18 in any number of different ways. In some cases, the flexible display 18 may be (locally) mounted or disposed on the support 12 via adhesive, welding, fastening, or some other means that cause the flexible display 18 to be attached to and to bend with the support 12 and thus be limited by the bending limiting structure of the support 12. In one case, the first substrate 950 or the second substrate 954 can be integrally formed with or integrated into the flexible display 18. To fully assemble the device 10, the other substrate 950 or 952 can be connected to the substrate 952 or 950 integrated into the display 18 (e.g., by disposing the pins 980A-980F in the apertures 962A-962F). In other cases, the flexible electronic display 18 may be coupled to the bending limiting structure of the support 12 in a moveable or slidable manner. For example, the display 18 or the support 12 can be attached to a flexible housing (e.g., a nylon or leather pocket assembly) configured to receive and retain the other component (e.g., the display 18 when the support 12 is attached to the flexible housing). In yet other cases, the flexible display 18 can be disposed between the first and second substrates 950, 952.

So constructed, the support 12, and more generally the device 10, can be bent in multiple different directions, whether at different times or at the same time. The support 12, and more generally the device 10, can, for example, be bent in a longitudinal direction (e.g., along a longitudinal axis 990) and/or in a transverse direction (e.g., along the transverse axis 964). However, the support 12 can, via the interaction between the pins 980A-980F and corresponding apertures 962A-962F, limit the bending range of the flexible display 18, such that the support 12 prevents undesirable bending of the flexible display 18 (e.g., bending beyond the minimum bending radius of the display 18) in any one or more of these directions. As an example, when the device 10 is substantially flat and is bent in the longitudinal direction (e.g., along or parallel to the longitudinal axis 990), the applied bending force causes at least some of the pins 980A-980F to move (e.g., slide) in the transverse direction within the apertures 962A-962F, respectively, from the center point of the apertures 962A-962F toward the stop surface 966 of a respective aperture 962A-962F (depending on whether the device 10 is bent inward or outward). Whether each pin 980A-980F moves, and the exact movement of the pins 980A-980F, will of course depend upon the longitudinal axis along which the device 10 is bent. In some cases, the device 10 will be bent to such a degree that at least some of the pins 980A-980F contact the stop surface 966 of a respective aperture 962A-962F. At this point, the support 12 has reached its pre-defined bending limit (e.g., greater than the minimum bending radius of the display 18 in this direction) and any further bending of the device 10, particularly the display 18, in the longitudinal direction will be prevented. Conversely, when the device 10 is substantially flat and is bent in the transverse direction (e.g., along or parallel to the transverse axis 964), the applied bending force causes at least some of the pins 980A-980F to move (e.g., slide) in the longitudinal direction within the apertures 962A-962F, respectively, from the center point of the apertures 962A-962F toward the stop surface 966 of a respective aperture 962A-962F F (depending on whether the device 10 is bent inward or outward). As noted above, whether each pin 980A-980F moves, and the exact movement of the pins 980A-980F, will depend upon the transverse axis along which the device 10 is bent. In some cases, the device 10 will be bent to such a degree that at least some of the pins 980A-980F contact the stop surface 966 of a respective aperture 962A-962F. At this point, the support 12 has reached its pre-defined bending limit (e.g., greater than the minimum bending radius of the display 18 in this direction) and any further bending of the device 10, particularly the display 18, in the transverse direction will be prevented. It will be appreciated that the support 12 limits undesirable bending of the flexible display 18 in a number of different directions, whether done at different times or at the same time, using the same principles.

It will be appreciated that the components of the support 12 can vary from those illustrated in FIGS. 18A and 18B. In other examples, the first substrate 950 and/or the second substrate 952 can have a different shape (e.g., can be more curved, can have a more circular shape, can have an irregular shape, can contain holes) and/or a different size. In some examples, the first substrate 950 can have a different size and/or shape than the second substrate 952, in which case portions of the first substrate 950 or the second substrate 952 may always be visible when the two substrates 950 and 952 are assembled to form the support 12.

The support 12 can also be varied to control (e.g., adjust) the amount of permissible bending in one or any number of different directions. More specifically, the apertures 962A-962F and/or the pins 980A-980F can be varied to control (e.g., adjust) the amount of bending permitted by the support 12. In this regard, the first substrate 950 can include more or less than six apertures 962A-962F, can include differently positioned or arranged apertures 962A-962F (e.g., spaced closer to or further from one another, spaced closer to or further from the ends 958A, 958B, and/or spaced closer to or further from the edges 960A, 960B), and/or can include differently constructed slots. In other examples, the slots can have a different shape and/or size that facilitate greater, less, and/or different pin movement, thereby facilitating greater or less bending freedom. In some examples, the apertures 962A-962F can take the form of openings, tracks, channels, grooves, recesses, or any other suitable structure, and/or do not necessarily need to cut through the complete substrate thickness. Similarly, the second substrate 952 can include more or less than six pins 980A-980F, can include differently positioned or arranged pins 980A-980F (e.g., spaced closer to or further from one another, spaced closer to or further from the ends 974A, 974B, and/or spaced closer to or further from the edges 978A, 978B), and/or can include differently constructed protrusions. In some examples, the pins 980A-980F can instead take the form of other protrusions, such as tabs, hooks, knobs, or bumps, or any other suitable structure.

Moreover, the first and second substrates 950, 952 can be connected to one another in a different manner. For example, the first substrate 950 and the second substrate 952 can be reversed, with the first substrate 950 including the pins 980A-980F and the second substrate 952 including the apertures 962A-962F. As another example, the first and second substrates 950, 952 can each include apertures 962A-962F and pins 980A-980F (e.g., alternating slots and pins). The manner in which the first and second substrates 950, 952 are connected to one another can also be varied to control (e.g., adjust) the amount of multi-direction bending permitted by the support 12. More specifically, the first and second substrates 950, 952 can be locally fixedly connected to one another in one or more different locations than illustrated in FIG. 18B.

Figure 19:
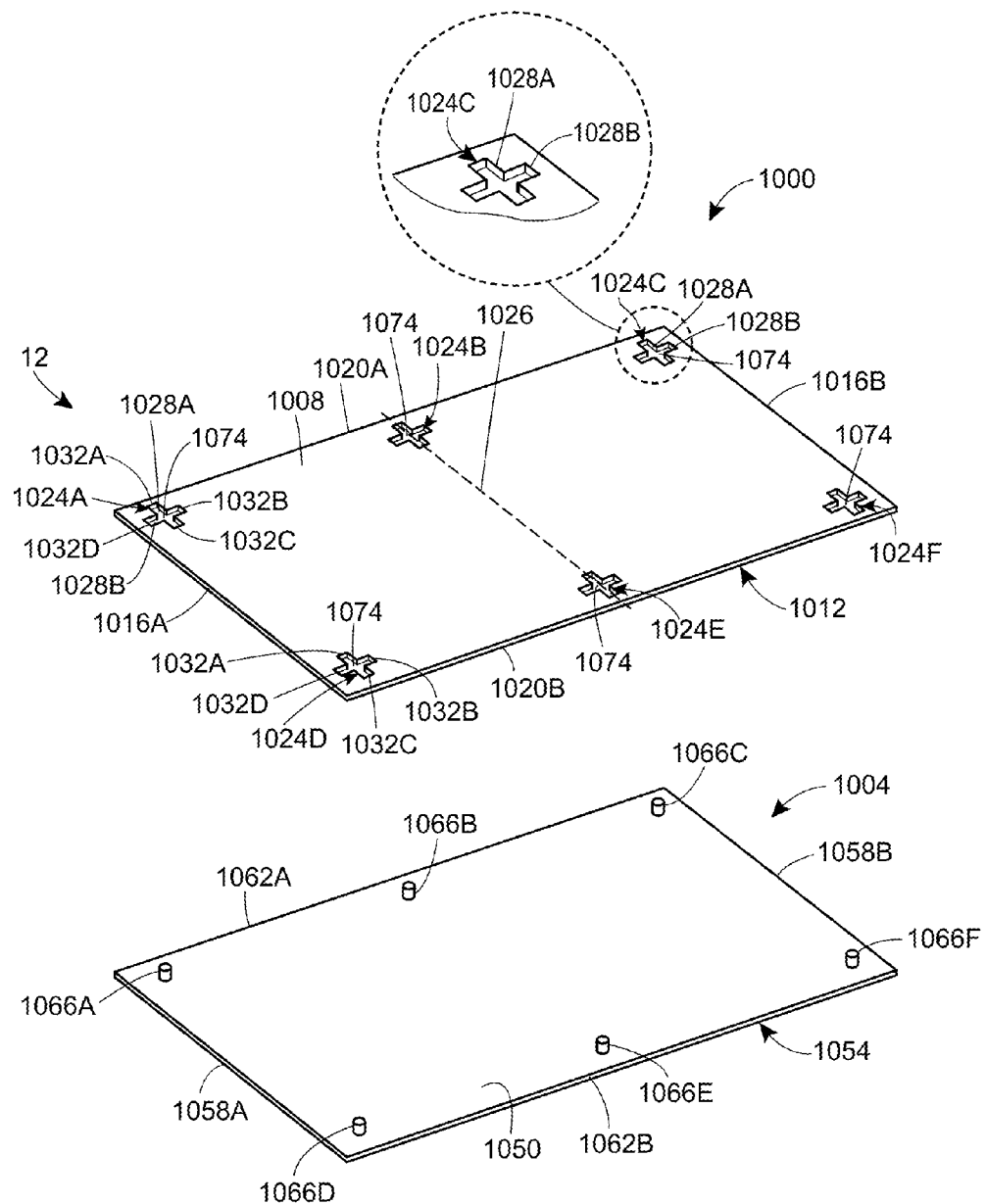
FIGS. 19 and 20 illustrate an example of a flexible support that can be coupled to the flexible electronic component to constrain bending of the flexible electronic component to prevent the formation of bending axes that, when projected onto a reference plane, intersect or cross at a point within a reference area in the reference plane that is defined by the flexible electronic component when the flexible electronic component is in a substantially flat position.
Figure 20:
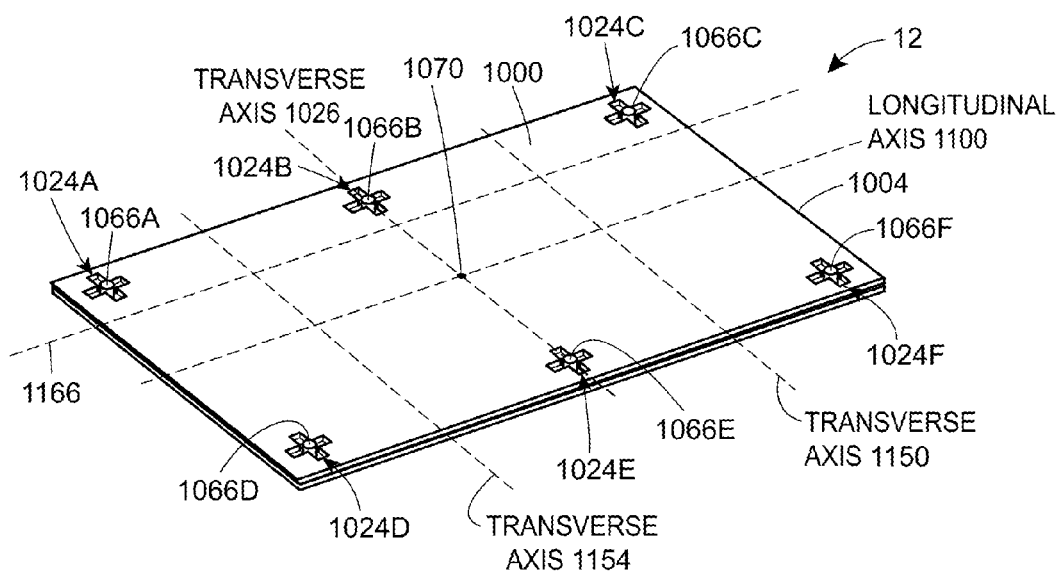

FIGS. 19 and 20 depict an example of a bending limiting structure that may be incorporated into the support 12. This bending limiting structure allows the support 12 to be bent in different directions at different times and allows the support 12 to be bent in or along different bending radii in the same direction, but generally prevents the support 12 from being bent in two or more directions at the same time, as permitting such bending would undesirably create bending axes that, when projected onto a reference plane, intersect or cross at a point within a reference area in the reference plane. The reference area generally refers to a two-dimensional area defined by the display 18 in the reference plane when the flexible display 18 is laid in a substantially flat position. As noted above, simultaneous bending of the display 18 along two or more bending axes that intersect or cross in this manner creates singularities within the display 18, which can in turn damage the display 18.

The support 12 illustrated in FIGS. 19 and 20 includes a first substrate 1000 and a second substrate 1004 movably connected or coupled to the first substrate 1000. The first and second substrates 1000, 1004 cooperate or interact with one another to limit or constrain bending to prevent the crossing or intersecting bending axes described above. The first substrate 1000 and the second substrate 1004 in this example are substantially rectangular metal (e.g., brass, aluminum, copper, steel, tin, nickel) plates or sheets, though the first substrate 1000 and/or the second substrate 1004 can have a different shape and/or be made of a different material (e.g., cloth, leather, plastic).

As illustrated in FIG. 19, the first substrate 1000 has a top side 1008, a bottom side 1012, a pair of opposing ends 1016A, 1016B, and a pair of opposing edges 1020A, 1020B disposed between the ends 1016A, 1016B. Six (6) slots 1024A-1024F are formed in the first substrate 1000 between the ends 1016A, 1016B. Slots 1024A-1024C are formed in the first substrate 1000 proximate to the edge 1020A and slots 1024D-1024F are formed in the first substrate 1000 proximate to the edge 1020B and opposite the slots 1024A-1024C, respectively. Slots 1024A and 1024D are transversely aligned with one another proximate to the end 1016A. Slots 1024B and 1024E are transversely aligned with one another along or proximate to a central transverse axis 1026 of the first substrate 1000. Slots 1024C and 1024F are transversely aligned with one another proximate to the end 1016B.

With reference still to FIG. 19, each slot 1024A-1024F has two transversely extending portions 1028A and two longitudinally extending portions 1028B at least substantially perpendicular to the transversely extending portions 1028A. In this example, the transversely extending portions 1028A and longitudinally extending portions 1028B of each slot 1024A-1024F extend outward of or from, and are symmetrically arranged around, a center point 1074 of the respective slot 1024A-1024F. Each slot 1024A-1024F is thus shaped like a cross. Each slot 1024A-1024F also includes or defines four (4) stop surfaces 1032A-1032D. The transversely extending portions 1028A of each slot 1024A-1024F define the stop surfaces 1032A, 1032C, and the longitudinally extending portions 1028B of each slot 1024A-1024F define the stop surfaces 1032B, 1032D. So arranged, the stop surfaces 1032A, 1032C are generally configured to constrain bending of the flexible support 12, and thus the flexible display 18, in the longitudinal direction, while the stop surfaces 1032B, 1032D are generally configured to constrain bending of the flexible support 12, and thus the flexible display 18, in the transverse direction, as will be described in greater detail below.

As further illustrated in FIG. 19, the second substrate 1004 has a top side 1050, a bottom side 1054, a pair of opposing ends 1058A, 1058B, and a pair of opposing edges 1062A, 1062B disposed between the ends 1058A, 1058B. The second substrate 1004 further includes six (6) pins 1066A-1066F coupled to and extending (e.g., projecting) outward from the top side 1050 of the second substrate 1004. The positioning of the pins 1066A-1066F generally corresponds to the positioning of the slots 1024A-1024F, respectively, with the pins 1066A-1066C disposed proximate to the edge 1062A and the pins 1066D-1066F disposed proximate to the edge 1062B and opposite the pins 1066A-1066C. The pins 1066A-1066F are aligned with one another in a similar manner as the slots 1024A-1024F, as discussed above.

The first and second substrates 1000, 1004 are aligned with and movably connected to one another in the manner illustrated in FIG. 20 to form the support 12. As the first and second substrates 1000, 1004 have a substantially similar shape and size, it will be appreciated that when the assembled support 12 is viewed from the top, the second substrate 1004 is substantially not visible (with the exception of the pins 1066A-1066F), while when the assembled support 12 is viewed from the bottom, the first substrate 1000 is substantially not visible. As illustrated in FIG. 20, a central portion of the first substrate 1000 is locally fixedly connected (e.g., welded, adhered, etc.) to a corresponding central portion of the second substrate 1004 at a fixation point 1070 centrally located between the ends 1016A, 1058A and the ends 1016B, 1058B.

When the first and second substrates 1000, 1004 are aligned with and movably connected to one another as illustrated in FIG. 20, the pins 1066A-1066F are disposed within the slots 1024A-1024F, respectively. The pins 1066A-1066F can, in some cases, protrude upward from or out of the top side 1008 of the first substrate 1000, can, in some cases, protrude downward from or out of the top side 1008 of the first substrate 1000, or can, in other cases, be flush with the top side 1008 of the first substrate 1000. At least initially, and when the device 10 is in a substantially flat position (illustrated in FIG. 20), the pins 1066A-1066F will be disposed at the center point 1074 of the slots 1024A-1024F, respectively. As illustrated in FIG. 19, the center point 1074 is located where the transverse and longitudinal portions 1028A, 1028B of each slot 1024A-1024F overlap and, as such, is approximately equidistant from each of the stop surfaces 1032A-1032D.

The support 12 can be coupled to the flexible display 18 in any number of different ways. In some cases, the flexible display 18 may be (locally) mounted or disposed on the support 12 via adhesive, welding, fastening, or some other means that cause the flexible display 18 to be attached to and to bend with the support 12 and thus be limited by the bending limiting structure of the support 12. In one case, the first substrate 1000 or the second substrate 1004 can be integrally formed with or integrated into the flexible display 18. To fully assemble the device 10, the other substrate 1000 or 1004 can be connected to the substrate 1000 or 1004 integrated into the display 18 (e.g., by disposing the pins 1066A-1066F in the slots 1024A-1024F). In other cases, the flexible electronic display 18 may be coupled to the bending limiting structure of the support 12 in a moveable or slidable manner. For example, the display 18 or the support 12 can be attached to a flexible housing (e.g., a nylon or leather pocket assembly) configured to receive and retain the other component (e.g., the display 18 when the support 12 is attached to the flexible housing). In yet other cases, the flexible display 18 can be disposed between the first and second substrates 1000, 1004.

So constructed, the support 12, and more generally the device 10, can be bent in multiple different directions. The support 12, and more generally the device 10, can, for example, be bent in a longitudinal direction (e.g., along a longitudinal axis 1100) or in a transverse direction (e.g., along the transverse axis 1026). When the device 10 is substantially flat and is bent in the longitudinal direction (e.g., along or parallel to the longitudinal axis 1100), the applied bending force causes the pins 1066A-1066F to move (e.g., slide) in the transverse direction within the slots 1024A-1024F, respectively, from the center point 1074 of the slots 1024A-1024F toward the stop surface 1032A or 1032C of a respective slot 1024A-1024F (depending on whether the device 10 is bent inward or outward). In some cases, the device 10 will be bent to such a degree that the pins 1066A-1066F contact the stop surface 1032A or 1032C of a respective slot 1024A-1024F. At this point, the support 12 has reached its pre-defined bending limit and any further bending of the device 10, particularly the display 18, in the longitudinal direction will be prevented. Conversely, when the device 10 is substantially flat and is bent in the transverse direction (e.g., along or parallel to the transverse axis 1026), the applied bending force causes the pins 1066A-1066F to move (e.g., slide) in the longitudinal direction within the slots 1024A-1024F, respectively, from the center point 1074 of the slots 1024A-1024F toward the stop surface 1032B or 1032D of a respective slot 1024A-1024F (depending on whether the device 10 is bent inward or outward). In some cases, the device 10 will be bent to such a degree that the pins 1066A-1066F contact the stop surface 1032B or 1032D of a respective slot 1024A-1024F. At this point, the support 12 has reached its pre-defined bending limit and any further bending of the device 10, particularly the display 18, in the transverse direction will be prevented.

In some cases, such as those described above, it may be desirable to permit bending of the display 18, and more generally the device 10, in or along different bending radii in the same direction or in two different directions at the same time (also referred to herein as simultaneous or multi-directional bending). As described above, however, simultaneous bending in two directions can damage the display 18 when bending axes are created that, when projected onto a reference plane, intersect or cross with one another at a virtual point within a reference area in the reference plane. As noted above, the reference area is a two-dimensional area defined by the flexible display 18 when the display 18 is laid in a substantially flat position. Accordingly, the support 12 is configured to constrain or limit simultaneous bending of the device 10, particularly the display 18, by preventing any simultaneous bending that would create these crossing or intersecting bending axes. In this case, the support 12 allows bending in different directions at different times (i.e., non-simultaneous bending) and allows bending in or along different bending radii in the same direction, but substantially prevents any simultaneous bending whatsoever. In other cases, the support 12 may only prevent undesirable simultaneous bending and permit other simultaneous bending. For example, the support 12 may permit simultaneous bending along the first bending axis and the second bending axis when the two axes are parallel to one another (and thus do not intersect, when projected, in the reference area) but may prevent simultaneous bending along the first and second bending axes when the two axes would, when projected, intersect in the reference area.

Generally speaking, the slots 1024A-1024F and the corresponding pins 1066A-1066F are constructed and configured to interact with one another to prevent simultaneous bending that would create bending axes that, when projected onto the display 18, would intersect or cross with one another at a virtual point within the flexible display 18. More specifically, when one or more of the pins 1066A-1066F are moved as described above in response to the device 10 being bent in a first direction (e.g., the transverse direction) along a first bending axis (e.g., the transverse axis 1026), one or more of the slots 1024A-1024F can in turn lock or prevent one or more of the pins 1066A-1066F from moving in one or more certain directions that correspond to a bending axis that, when projected onto the reference plane described above, would intersect or cross with the first bending axis, when projected onto the reference plane, at a virtual point within the reference area of the reference plane defined by the display 18. As such, the slots 1024A-1024F can prevent bending in a second direction along a second bending axis that, when projected onto the reference plane, would intersect or cross with the first bending axis, when projected onto the reference plane, at a virtual point within the reference area of the reference plane defined by the display 18. FIGS. 21A-21H illustrate examples of how this is accomplished.

Figure 21A:
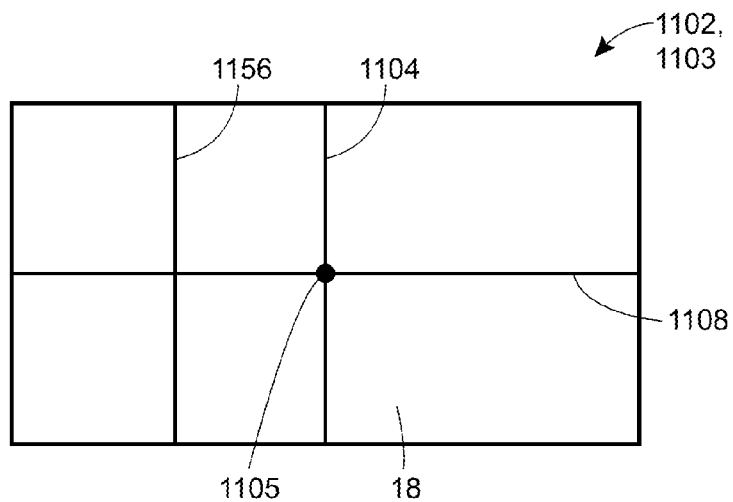
FIG. 21A illustrates a top view of the two-dimensional reference area defined by the flexible electronic component.
Figure 21B:
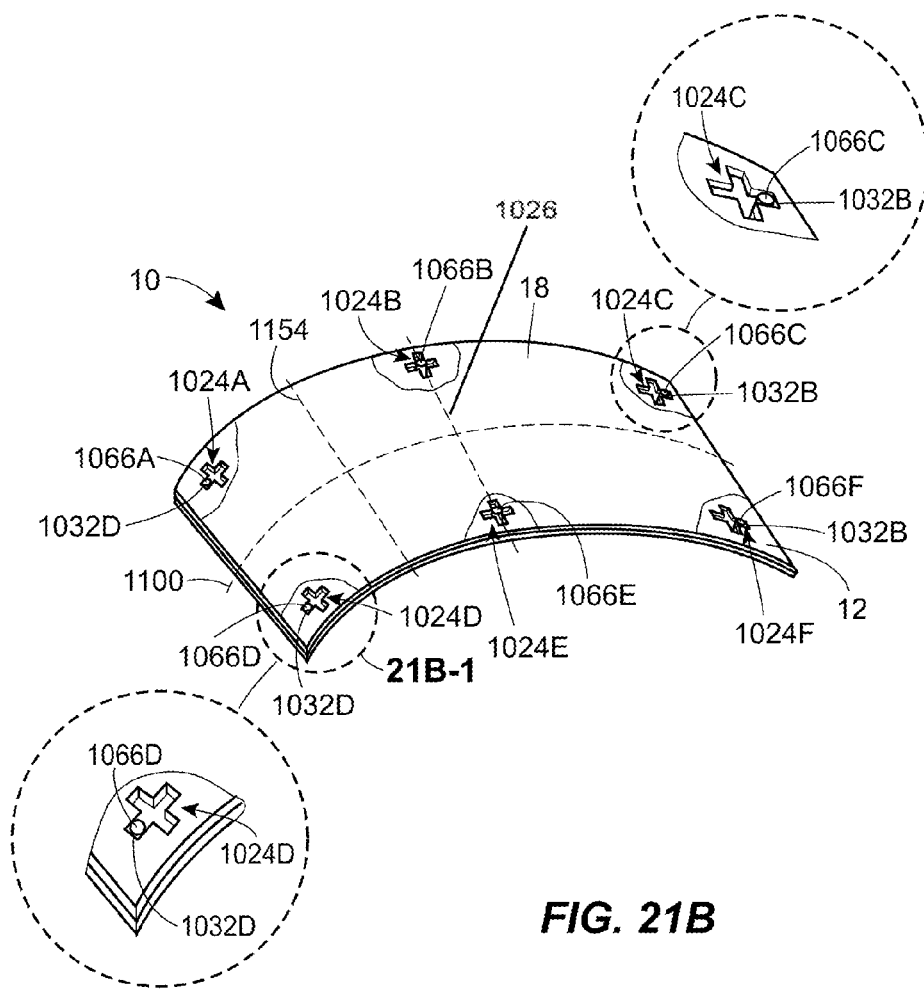
FIG. 21B illustrates bending the flexible support of FIGS. 19 and 20 along various bending axes.

FIG. 21A depicts a top view of a reference area 1102 defined by the display 18 in a reference plane 1103. The reference area 1102 is a two-dimensional area defined by the display 18 when the display 18 is in a substantially flat position. The reference plane 1103 can be co-planar with the plane in which the flat display 18 lies or can be disposed above or below the plane in which the flat display 18 lies.

FIG. 21B depicts the device 10 when bent in the outward direction (i.e., such that the device 10 has a concave shape) about the transverse axis 1026. When the device 10 is in the substantially flat position illustrated in FIG. 20 and is bent in this manner, the applied bending force causes (i) the pins 1066A and 1066D to move in the longitudinal direction within the slots 1024A and 1024D, respectively, toward a respective stop surface 1032D, and (ii) the pins 1066C and 1066F to move in the longitudinal direction within the slots 1024C and 1024F, respectively, toward a respective stop surface 1032B. The pins 1066A and 1066D will, in turn, be positioned somewhere between the stop surface 1032D and the center point 1074 of the slots 1024A and 1024D, respectively (the exact position will depend upon the magnitude of the bending force). Similarly, the pins 1066C and 1066F will be positioned somewhere between the stop surface 1032B and the center point 1074 of the slots 1024C and 1024F, respectively. In some cases, and as illustrated in FIG. 21B, the device 10 can be bent to such a degree that the pins 1066A and 1066D contact the stop surfaces 1032D and the pins 1066C and 1066F contact the stop surfaces 1032B, at which point any further bending of the device 10, particularly the display 18, in this outward direction will be prevented. Moreover, because the pins 1066B and 1066E lie along or proximate to the bending axis (the transverse axis 1026), the pins 1066B and 1066E remain centered within the slots 1024B and 1024E, respectively.

With the pins 1066A, 1066C, 1066D, and 1066F positioned as illustrated in FIG. 21B, the pins 1066A, 1066C, 1066D, and 1066F are locked, or unable to move (e.g., slide), in the transverse direction within the slots 1024A, 1024C, 1024D, and 1024F, respectively. In other words, the slots 1024A, 1024C, 1024D, and 1024F prevent the pins 1066A, 1066C, 1066D, and 1066F, respectively, from moving in the transverse direction. This is because any such movement of the pins would be the product of simultaneous bending in a different direction that would create bending axes that, when projected onto the reference plane 1103, would intersect or cross within or on the reference area 1102 in the reference plane 1103 defined by the display 18. More specifically, movement of the pins 1066A, 1066C, 1066D, and 1066F in the transverse direction would be the product of the device 10 also being bent in the transverse direction about a bending axis (e.g., the longitudinal axis 1100) that, when projected on the reference plane 1103, would intersect or cross the transverse axis 1026 (the first bending axis in this example), which is projected on the reference plane 1103 as indicated by reference numeral 1104 in FIG. 21A, at a virtual point within the reference area 1102. For example, as illustrated in FIG. 21A, if the support 12 also permitted bending of the device 10 in the transverse direction about the longitudinal axis 1100, singularities would be created within the display 18, as the longitudinal axis 1100, which would be projected on the reference plane 1103 as indicated by reference numeral 1108 in FIG. 21A, would intersect or cross the projection 1104 of the transverse axis 1026 at or near a virtual point 1105 within the display 18. Thus, the slots 1024A, 1024C, 1024D, and 1024F are configured to prevent the pins 1066A, 1066C, 1066D, and 1066F, respectively, from moving in the transverse direction, which in turn prevents the formation of any longitudinally-oriented bending axes that, when projected onto the reference plane 1103, would intersect the projection 1104 of the transverse axis 1026 within the reference area 1102 defined by the display 18, and, in turn, damage the display 18, thereby preventing simultaneous or additional bending that would otherwise damage the display 18.

Of course, the support 12 permits simultaneous bending along two different bending radii in the same direction, as the projections of the created bending axes would not intersect or cross within the reference area 1102 defined by the display 18 (i.e., the projections of the created bending axes would not intersect at all or intersect at a virtual point outside of the reference area 1102). In other words, the device 10 can be bent in the outward direction about the transverse axis 1026, as illustrated in FIG. 21B, and can simultaneously be bent in about a different bending axis when that second bending axis, when projected onto the reference area 1102 illustrated in FIG. 21A, does not intersect or cross the projection 1104 (the projection of the transverse axis 1026 onto the reference plane 1103) within the reference area 1102 defined by the display 18. In this regard, the pins 1066A, 1066B, 1066D, and 1066E are not locked or unable to move within the slots 1024A, 1024B, 1024D, and 1024E, respectively. This is because any movement of the pins 1066A, 1066B, 1066D, and 1066E within the slots 1024A, 1024B, 1024D, and 1024E, respectively, would be the product of simultaneous bending along a bending axis that, when projected, would not intersect with the transverse axis 1026 within the reference area 1102 defined by the display 18. For example, while the device 10 is in the bent configuration illustrated in FIG. 21B, the support 12 also permits bending of the device 10 about the bending axis 1154 (see FIG. 20), as the axis 1154, when projected onto the reference plane 1103 as indicated by reference numeral 1156 in FIG. 21A, will not intersect or cross with the projection 1104 (the projection of the transverse axis 1026 on the reference plane 1103) within the reference area 1102.

Figure 21C:
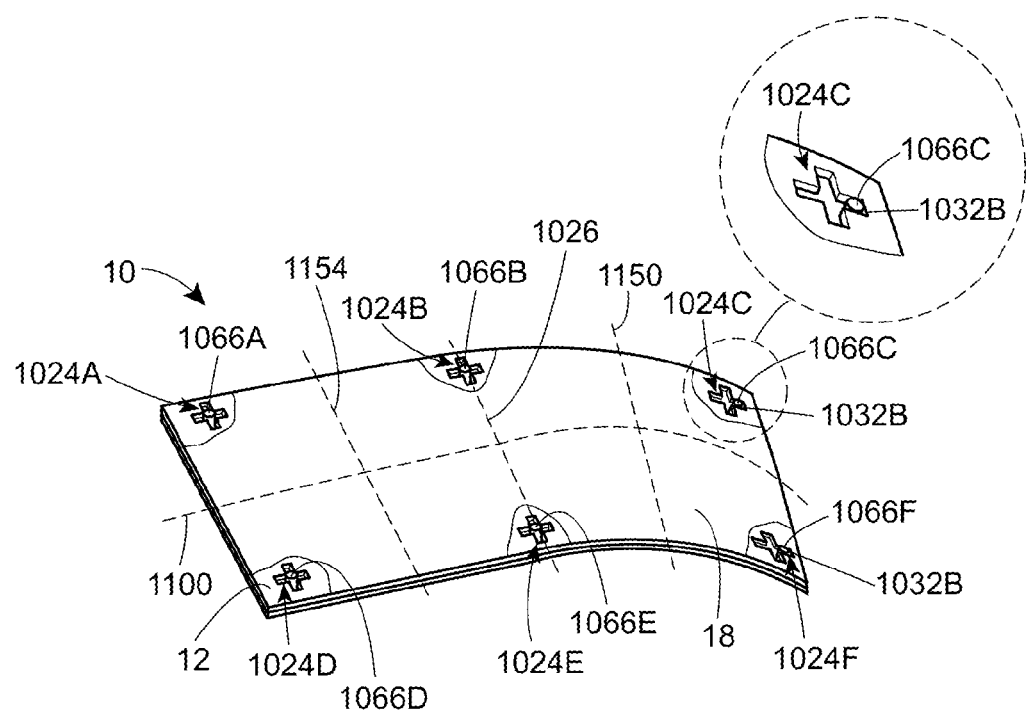
FIG. 21C illustrates another manner of bending the flexible support of FIGS. 19 and 20 along various bending axes.
Figure 21D:
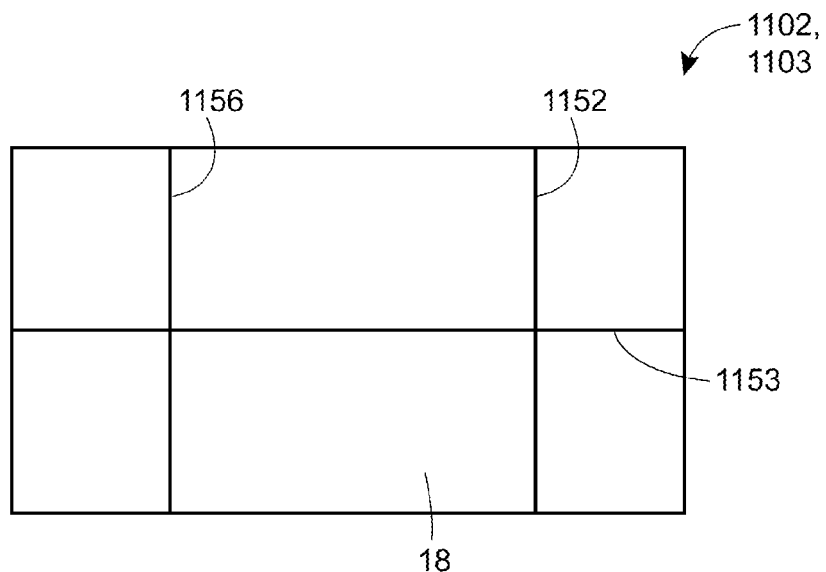
FIG. 21D illustrates a top view of the two-dimensional reference area defined by the flexible support and including projections of the various bending axes onto the reference plane.

FIG. 21C depicts the device 10 when a portion of the device 10 is bent in the outward direction (i.e., such a portion of the device 10 has a concave shape) about a transverse axis 1150 parallel to the transverse axis 1026. When the device 10 is in the substantially flat position illustrated in FIG. 20 and is bent in this manner, the applied bending force causes the pins 1066C and 1066F to move in the longitudinal direction within the slots 1024C and 1024F, respectively, toward a respective stop surface 1032B. The pins 1066C and 1066F will, in turn, be positioned somewhere between the stop surface 1032B and the center point 1074 of the slots 1024 and 1024F, respectively (the exact position will depend upon the magnitude of the bending force). In some cases, and as illustrated in FIG. 21C, the device 10 can be bent to such a degree that the pins 1066C and 1066F contact the stop surfaces 1032B, at which point any further bending of the device 10, particularly the display 18, in this outward direction and about the transverse axis 1150 will be prevented. Moreover, because of the position of the bending axis (the transverse axis 1150), the pins 1066A, 1066B, 1066D, and 1066E substantially remain centered within the slots 1024A, 1024B, 1024D, and 1024E, respectively.

With the pins 1066C and 1066F positioned as illustrated in FIG. 21C, the pins 1066C and 1066F are locked, or unable to move (e.g., slide), in the transverse direction within the slots 1024C and 1066F, respectively. In other words, the slots 1024C and 1024F prevent the pins 1066C and 1066F, respectively, from moving in the transverse direction. This is because any such movement of the pins would be the product of simultaneous bending in a different direction that would create bending axes that, when projected onto the display 18, would intersect or cross within the display 18. More specifically, movement of the pins 1066C and 1066F in the transverse direction would be the product of the device 10 also being bent in the transverse direction about a bending axis (e.g., the longitudinal axis 1100) that, when projected onto the reference plane 1103, would intersect or cross the transverse axis 1150 (the first bending axis in this example), which is projected on the reference plane 1103 as indicated by reference numeral 1152 in FIG. 21D, at a virtual point within the reference area 1102 of the reference plane 1103 defined by the display 18. For example, if the support 12 also permitted bending of the device 10 in the transverse direction about the longitudinal axis 1100, singularities would be created within the display 18, as the longitudinal axis 1100, when projected on the reference plane 1103 as indicated by reference numeral 1153, would intersect or cross the projection 1152 of the transverse axis 1150 within the reference area 1102 defined by the display 18. Thus, the slots 1024C and 1024F are configured to prevent the pins 1066C and 1066F, respectively, from moving in the transverse direction, which in turn prevents the formation of any longitudinally-oriented bending axes that, when projected onto the reference plane 1103, would intersect the projection 1152 (the projection of the transverse axis 1150 on the reference plane 1103) within the reference area 1102 defined by the display 18, and, in turn, damage the display 18, thereby preventing simultaneous or additional bending that would otherwise damage the display 18.

Of course, the support 12 permits simultaneous bending along two different bending radii in the same direction, as the projections of the created bending axes would not intersect or cross within the reference area 1102 defined by the display 18 (i.e., the projections of the created bending axes would not intersect or intersect at a virtual point outside of the reference area 1102 defined by the display 18). In other words, the device 10 can be bent in the outward direction about the transverse axis 1150, as illustrated in FIG. 21C, and can simultaneously be bent about a different bending axis when that second bending axis, when projected onto the reference plane 1103, does not intersect or cross the projection 1152 (the projection of the transverse axis 1150 onto the reference plane 1103) within the reference area 1102 defined by the display 18. In this regard, the pins 1066A, 1066B, 1066D, and 1066E are not locked or unable to move within the slots 1024A, 1024B, 1024D, and 1024E, respectively. This is because any movement of the pins 1066A, 1066B, 1066D, and 1066E within the slots 1024A, 1024B, 1024D, and 1024E, respectively, would be the product of simultaneous bending in along a bending axis that, when projected, would not intersect with the transverse axis 1150 within the reference area 1102. For example, while the device 10 is in the bent configuration illustrated in FIG. 21C, the support 12 also permits bending of the device 10 about the bending axis 1154 (see FIG. 21C), as the axis 1154, when projected onto the reference plane 1103 as indicated by reference numeral 1156 in FIG. 21D, will not intersect or cross the projection 1152 (the projection of the transverse axis 1150 on the reference plane 1103) within the reference area 1102.

Figure 21E:
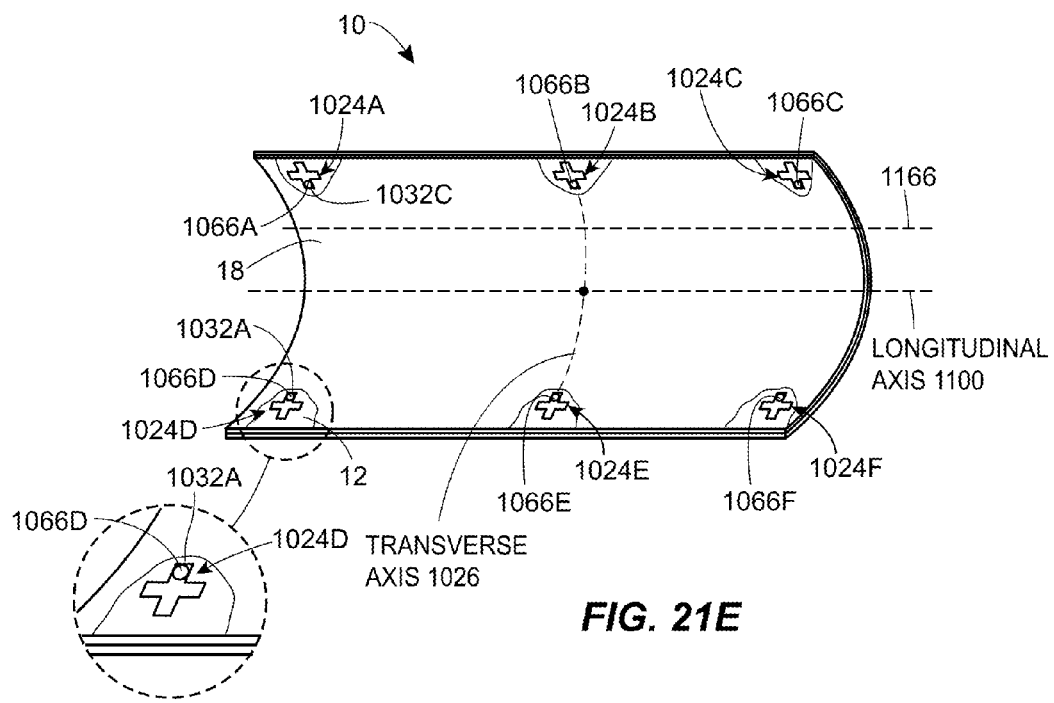
FIG. 21E illustrates another manner of bending the flexible support of FIGS. 19 and 20 along various bending axes.
Figure 21F:
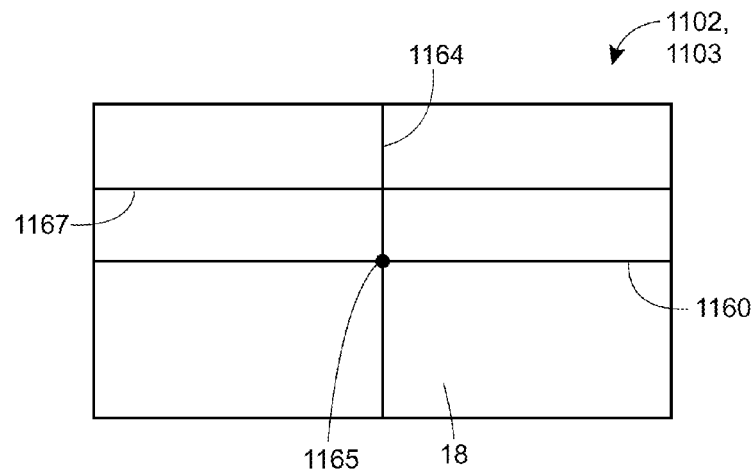
FIG. 21F illustrates a top view of the two-dimensional reference area defined by the flexible support and including projections of the various bending axes onto the reference plane.

FIG. 21E depicts the device 10 when bent in an inward direction (i.e., such that the device 10 has a concave shape) about the longitudinal axis 1100. When the device 10 is in the substantially flat position illustrated in FIG. 20 and is bent in the depicted manner, the applied bending force causes (i) the pins 1066A-1066C to move in the transverse direction within the slots 1024A-1024C, respectively, toward a respective stop surface 1032C, and (ii) the pins 1066D-1066F to move in the transverse direction within the slots 1024D-1024F, respectively, toward a respective stop surface 1032A. The pins 1066A-1066C will, in turn, be positioned somewhere between the center point 1074 and the stop surface 1032C of the slots 1024A-1024C, respectively (the exact position will depend upon the magnitude of the bending force). Similarly, the pins 1066D-1066F will be positioned somewhere between the center point 1074 and the stop surface 1032A of the slots 1024D-1024F, respectively (the exact position will again depend upon the magnitude of the bending force). In some cases, and as illustrated in FIG. 21E, the device 10 can be bent to such a degree that the pins 1066A-1066C contact the stop surfaces 1032C and the pints 1066D-1066F contact the stop surfaces 1032A, at which point any further bending of the device 10, particularly the display 18, in this inward direction will be prevented.

With the pins 1066A-1066F positioned as illustrated in FIG. 21C, the pins 1066A-1066F are locked, or unable to move (e.g., slide) in the longitudinal direction within the slots 1024A-1024F, respectively. In other words, the slots 1024A-1024F prevent the pins 1066A-1066F, respectively, from moving in the longitudinal direction. This is because any such movement of the pins would be the product of simultaneous bending in a different direction that would create bending axes that, when projected onto the reference plane 1103, would intersect or cross within the reference area 1102 defined by the display 18. More specifically, movement of the pins 1066A-1066F in the longitudinal direction would be the product of the device 10 also being bent in the longitudinal direction about a bending axis (e.g., the transverse axis 1026, the transverse axis 1150) that, when projected onto the reference plane 1103, would intersect or cross the longitudinal axis 1100 (the first bending axis in this example), which is projected on the reference plane 1103 as indicated by reference numeral 1160 in FIG. 21F, at a virtual point within the reference area 1102 defined by the display 18. For example, if the support 12 also permitted bending of the device 10 in the longitudinal direction about the transverse axis 1026, singularities would be created within the display 18, as the transverse axis 1026, when projected on the reference plane 1103 as indicated by reference numeral 1164, would intersect or cross the projection 1160 (the projection of the longitudinal axis 1100 on the reference plane 1103) at a virtual point 1165 within the reference area 1102 defined by the flat display 18. Thus, the slots 1024A-1024F are configured to prevent the pins 1066A-1066F, respectively, from moving in the longitudinal direction, which in turn prevents the formation of any transversely-oriented bending axes that, when projected onto the reference plane 1103, would intersect the projection 1160 (the projection of the longitudinal axis 1100 onto the reference plane 1103) within the reference area 1102, and, in turn, damage the display 18, thereby preventing simultaneous or additional bending that would otherwise the display 18.

Of course, the support 12 permits simultaneous bending along two different bending radii in the same direction, as the projections of the created bending axes would not intersect or cross within the reference area 1102 defined by the display 18 (i.e., the projections of the created bending axes would not intersect or intersect at a virtual point outside of the reference area 1102 defined by the display 18). In other words, the device 10 can be bent in the inward direction about the longitudinal axis 1100, as illustrated in FIG. 21E, and can simultaneously be bent about a different bending axis when that second bending axis, when projected onto the reference plane 1103, does not intersect or cross the projection 1160 (the projection of the longitudinal axis 1100 onto the reference plane 1103) within the reference area 1102 defined by the display 18. In this regard, the pins 1066A-1066F are not locked or unable to move within the slots 1024A-1024F, respectively. This is because any movement of the pins 1066A-1066F within the slots 1024A-1066F, respectively, would be the product of simultaneous bending along a bending axis that, when projected, would not intersect with the longitudinal axis 1100, when projected, within the reference area 1102. For example, while the device 10 is in the bent configuration illustrated in FIG. 21E, the support 12 also permits bending of the device 10 about the bending axis 1166 (see FIG. 21E), as the axis 1166, when projected onto the reference plane 1103 as indicated by reference numeral 1167 in FIG. 21F, will not intersect or cross the projection 1160 (the projection of the longitudinal axis 1100 on the reference plane 1103) within the reference area 1102.

Figure 21G:
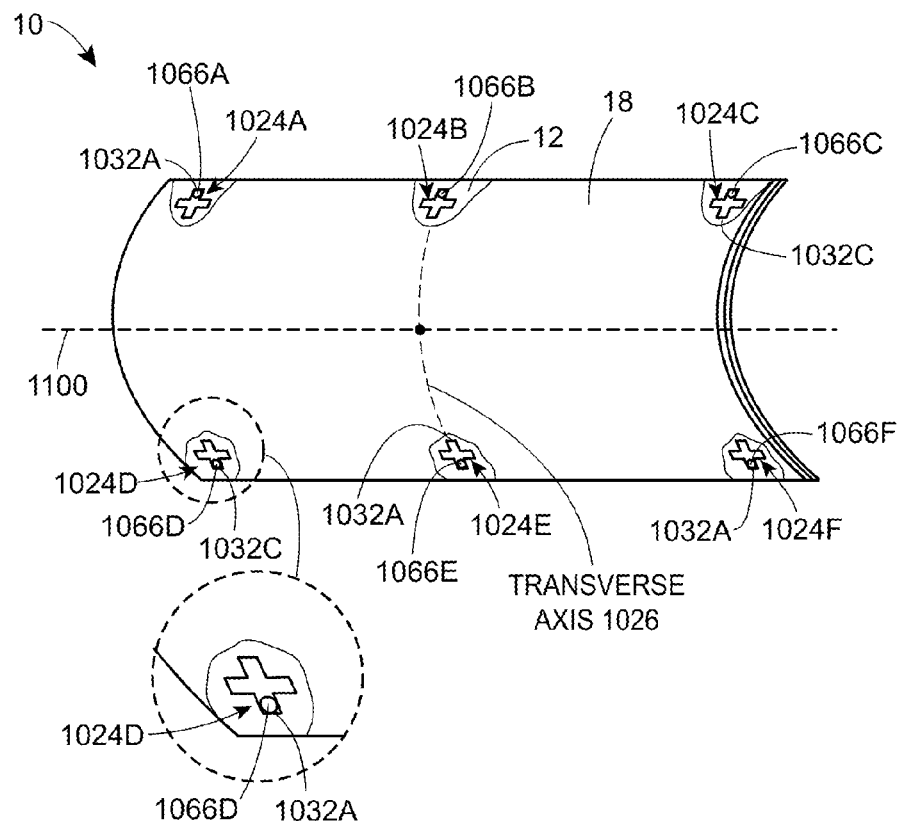
FIG. 21G illustrates yet another manner of bending the flexible support of FIGS. 19 and 20 along various bending axes.
Figure 21H:
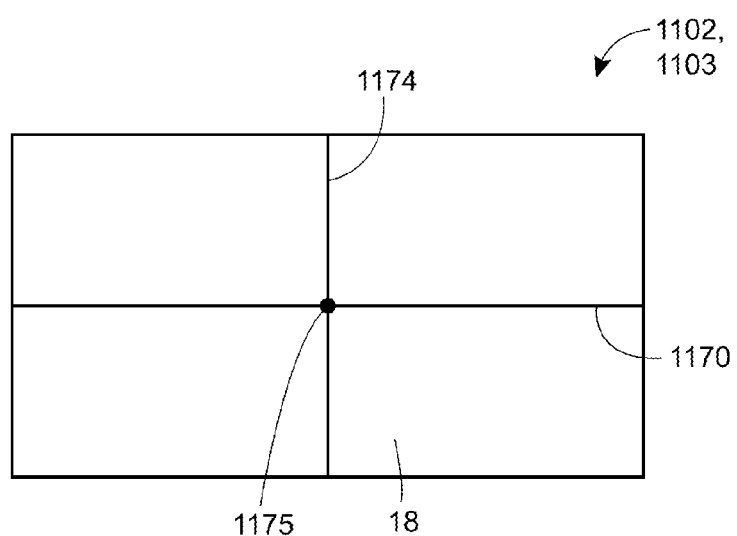
FIG. 21H illustrates a top view of the two-dimensional reference area defined by the flexible support and including projections of the various bending axes onto the reference plane.

FIG. 21G depicts the device 10 when bent in an outward direction (i.e., such that the device 10 has a convex shape) about the longitudinal axis 1100. When the device 10 is in the substantially flat position illustrated in FIG. 20 and is bent in the depicted manner, the applied bending force causes (i) the pins 1066A-1066C to move in the transverse direction within the slots 1024A-1024C, respectively, toward a respective stop surface 1032A, and (ii) the pins 1066D-1066F to move in the transverse direction within the slots 1024D-1024F, respectively, toward a respective stop surface 1032C. The pins 1066A-1066C will, in turn, be positioned somewhere between the center point 1074 and the stop surface 1032A of the slots 1024A-1024C, respectively (the exact position will depend upon the magnitude of the bending force). Similarly, the pins 1066D-1066F will be positioned somewhere between the center point 1074 and the stop surface 1032C of the slots 1024D-1024F, respectively (the exact position will again depend upon the magnitude of the bending force). In some cases, and as illustrated in FIG. 21G, the device 10 can be bent to such a degree that the pins 1066A-1066C contact the stop surfaces 1032A and the pints 1066D-1066F contact the stop surfaces 1032C, at which point any further bending of the device 10, particularly the display 18, in this outward direction will be prevented.

With the pins 1066A-1066F positioned as illustrated in FIG. 21G, the pins 1066A-1066F are locked, or unable to move (e.g., slide) in the longitudinal direction within the slots 1024A-1024F, respectively. In other words, the slots 1024A-1024F prevent the pins 1066A-1066F from moving in the longitudinal direction. This is because any such movement of the pins would be the product of simultaneous bending in a different direction that would create bending axes, that when projected onto the reference plane 1103, would intersect or cross within the reference area 1103 defined by the display 18. More specifically, movement of the pins 1066A-1066F in the longitudinal direction would be the product of the device 10 also being bent in the longitudinal direction about a bending axis (e.g., the transverse axis 1026, the transverse axis 1150) that, when projected onto the reference plane 1103, would intersect or cross the longitudinal axis 1100 (the first bending axis in this example), which is projected on the reference plane 1103 as indicated by reference numeral 1170 in FIG. 21H, at a virtual point within the reference area 1102 defined by the display 18. For example, if the support 12 also permitted bending of the device 10 in the longitudinal direction about the transverse axis 1026, singularities would be created within the display 18, as the transverse axis 1026, when projected on the display 18 as indicated by reference numeral 1174 in FIG. 21H, would intersect or cross the projection 1170 (the projection of the longitudinal axis 1100 on the reference plane 1102) at a virtual point 1175 within the reference area 1102 defined by the display 18. Thus, the slots 1024A-1024F are configured to prevent the pins 1066A-1066F, respectively, from moving in the longitudinal direction, which in turn prevents the formation of any transversely-oriented bending axes that, when projected onto the reference plane 1103, would intersect the projection 1170 (the projection of the longitudinal axis 1100 on the reference plane 1103) within the display 18, and, in turn, damage the display 18, thereby preventing simultaneous or additional bending that would otherwise the display 18.

It will be appreciated that the components of the support 12 can vary from those illustrated in FIGS. 19 and 20. In other examples, the first substrate 1000 and/or the second substrate 1004 can have a different shape (e.g., can be more curved, can have a more circular shape, can have an irregular shape, can contain holes) and/or a different size. In some examples, the first substrate 1000 can have a different size and/or shape than the second substrate 1004, in which case portions of the first substrate 1000 or the second substrate 1004 may always be visible when the two substrates 1000 and 1004 are assembled to form the support 12.

The support 12 can also be varied to control (e.g., adjust) the amount of bending (e.g., multi-directional bending) permitted by the support 12, and, more generally, the device 10. More specifically, the slots 1024A-1024F and/or the pins 1066A-1066F can be varied to control (e.g., adjust) the amount of bending permitted by the support 12. In this regard, the first substrate 1000 can include more or less than six slots 1024A-1024F, can include differently positioned or arranged slots 1024A-1024F (e.g., spaced closer to or further from one another, spaced closer to or further from the ends 1016A, 1016B, and/or spaced closer to or further from the edges 1020A, 1020B), and/or can include differently constructed slots. In other examples, the slots can have a different shape and/or size that facilitate greater, less, and/or different pin movement, thereby facilitating greater, less, and/or different bending freedom. More particularly, one or more of the slots can have a different shape (e.g., a star shape, a T-shape), with one or more portions extending in different directions than the portions 1028A, 1028B, a different number of portions, portions that are asymmetrically arranged around the center point 1074, and/or one or more portions having different lengths and/or widths (e.g., than one another). For example, one or more of the slots can include an odd number of portions (e.g., three portions, five portions, seven portions) or a different number of even portions (e.g., two portions, six portions, eight portions). In some examples, the slots 1024A-1024F can take the form of openings, apertures, tracks, channels, grooves, recesses, or any other suitable structure. Similarly, the second substrate 1004 can include more or less than six pins 1066A-1066F, can include differently positioned or arranged pins 1066A-1066F (e.g., spaced closer to or further from one another, spaced closer to or further from the ends 1058A, 1058B, and/or spaced closer to or further from the edges 1062A, 1062B), and/or can include differently constructed protrusions. In some examples, the pins 1066A-1066F can instead take the form of other protrusions, such as tabs, hooks, knobs, or bumps, or any other suitable structure.

Figure 22A:
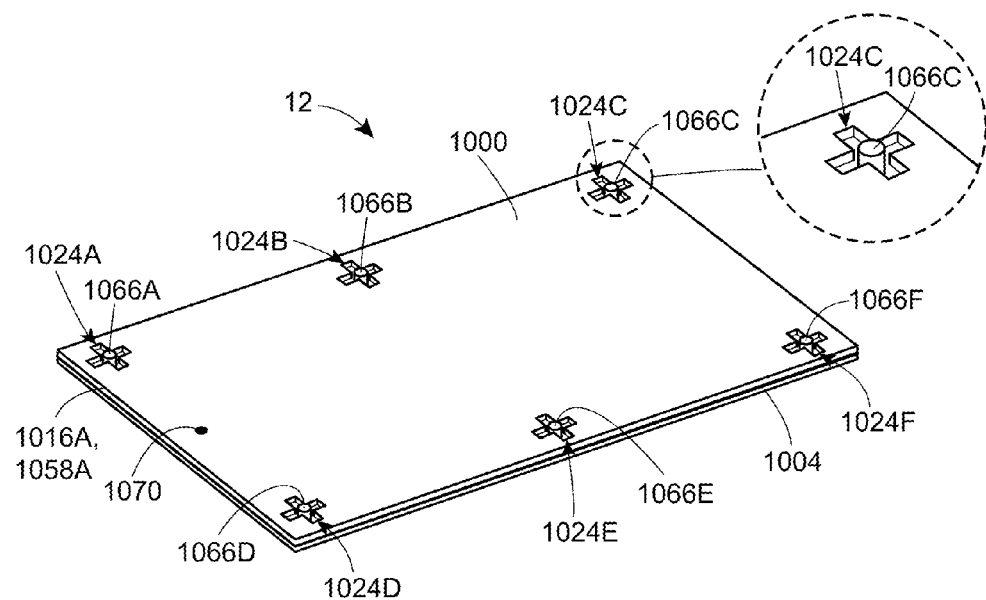
FIGS. 22A, 22B, and 23A, 23B illustrate different examples of the flexible support depicted in FIGS. 19 and 20.
Figure 22B:
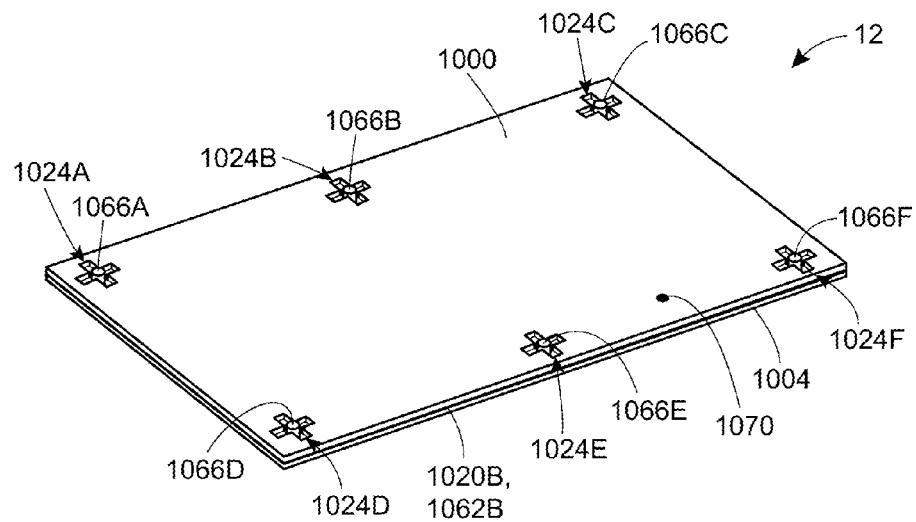

Moreover, the first and second substrates 1000, 1004 can be connected to one another in a different manner. For example, the first substrate 1000 and the second substrate 1004 can be reversed, with the first substrate 1000 including the pins 1066A-1066F and the second substrate 1004 including the slots 1024A-1024F. As another example, the first and second substrates 1000, 1004 can each include slots 1024A-1024F and pins 1066A-1066F (e.g., alternating slots and pins). The manner in which the first and second substrates 1000, 1004 are connected to one another can also be varied to control (e.g., adjust) the amount of multi-direction bending permitted by the support 12. More specifically, the first and second substrates 1000, 1004 can be locally fixedly connected to one another in one or more different locations than illustrated in FIGS. 19 and 20. For example, as illustrated in FIG. 22A, the local fixation point 1070, which locally fixedly connects the first and second substrates 1000, 1004 to one another, can instead be located proximate to the ends 1016A, 1058A of the first and second substrates 1000, 1004 and between the slots 1024A and 1024D. As another example, as illustrated in FIG. 22B, the local fixation point 1070 can instead be located proximate to the edges 1020B, 1062B of the first and second substrates 1000, 1004 and between the slots 1066E and 1066F. Of course, the first and second substrates 1000, 1004 can be fixedly connected to one another at other locations as well.

Figure 23A:
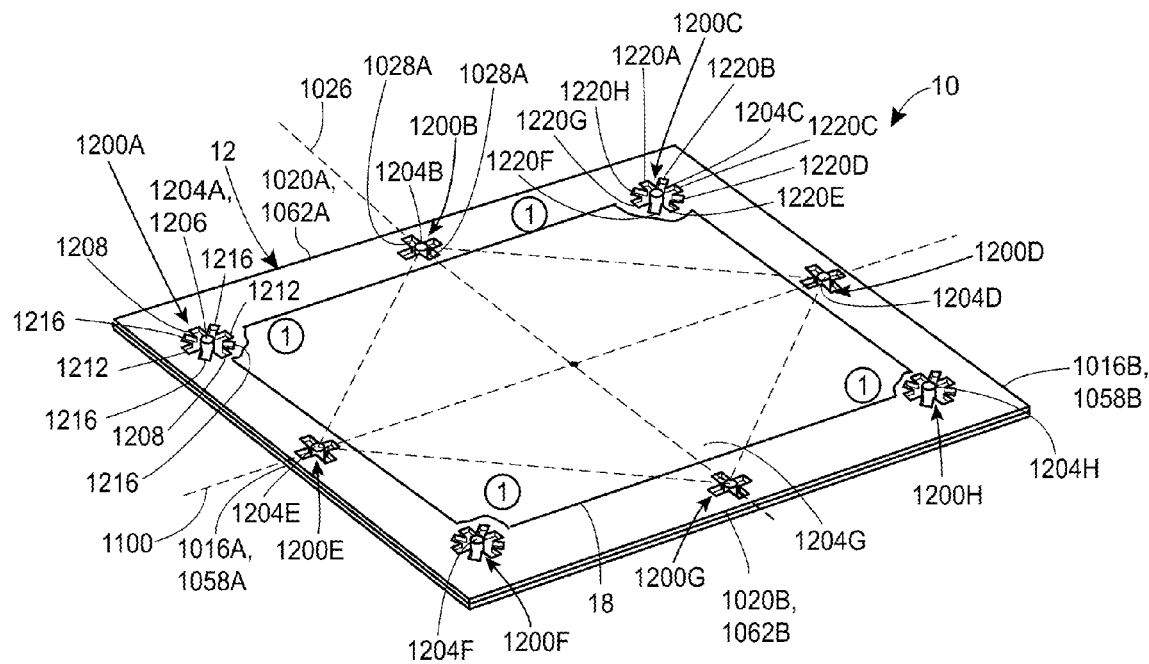
Figure 23B:
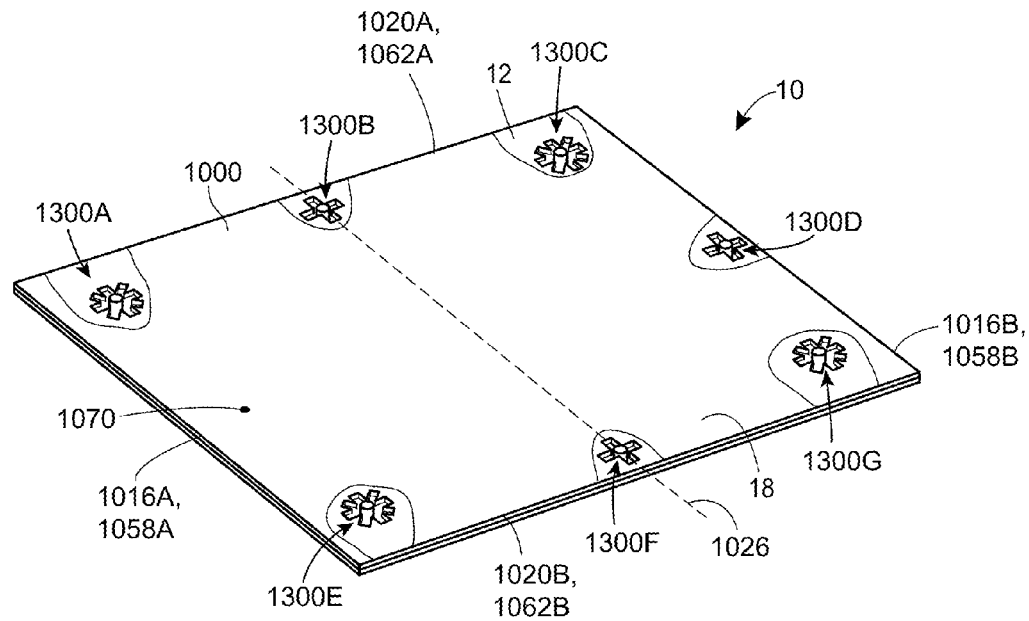

The device 10 illustrated in FIGS. 23A and 23B includes a support 12 and a flexible display 18 coupled to the support 12, the display 18 having a smaller area than the area of the support 12. As depicted in each of FIGS. 23A and 23B, the support 12 includes different slot and pin arrangements than the slot 1024 and pin 1066 arrangements described in FIGS. 19 and 20. Common components are denoted with common reference numerals. The structurally different slot and pin arrangements depicted in FIGS. 23A and 23B operate to permit more bending than the slot and pin arrangements described in FIGS. 19 and 20 (e.g., they permit more than just transverse and longitudinal bending and bending along different radii in the same direction), but still constrain undesirable simultaneous multi-directional bending of the device 10 in a similar manner as the arrangements described above.

As illustrated in FIG. 23A, the support 12 can include eight (8) slots 1200A-1200H formed in the first substrate 1000 and eight (8) pins 1204A-1204H coupled to the second substrate 1000 and movably disposed within the slots 1200A-1200H, respectively. Generally speaking, the slots 1200A-1200C are formed in the first substrate 1000 proximate to the edge 1020A, slots 1200E-1200H are formed in the first substrate 1000 proximate to the edge 1020B and across from the slots 1200A-1200C, and slots 1200D and 1200E are formed in the first substrate 1000 therebetween.

As illustrated in FIG. 23A, the slots 1200A, 1200C, 1200F, and 1200H are constructed differently than the slots 1200B, 1200D, 1200E, and 1200G. Slots 1200B, 1200D, 1200E, and 1200G are identical to the slots 1024A-1024F discussed above, with each of the slots 1200B, 1200D, 1200E, and 1200G having two transversely extending portions 1028A, two longitudinally extending portions 1028B at least substantially perpendicular to the transversely extending portions 1028A, and four identically defined stop surfaces 1032A-1032D. For clarity reasons, these components are not illustrated in FIG. 23A. Meanwhile, the slots 1200A, 1200C, 1200F, and 1200H each include (8) portions angled relative to one another. In this example, the eight (8) portions of each slot 1200A, 1200C, 1200F, and 1200H extend outward of or from, and are symmetrically arranged around, a center point 1206 of respective one of the slots 1200A, 1200C, 1200F, and 1200H. The eight (8) portions are oriented at a 45 degree angle relative to one another, though greater, lesser, and/or different angles can be utilized between one or more of the portions. The eight (8) portions include two (2) transversely extending portions 1208, two (2) longitudinally extending portions 1212, and four angled portions 1216 each disposed between one of the transversely extending portions 1208 and one of the longitudinally extending portions 1212 (for clarity reasons, these components are only labeled in slot 1200A). Thus, unlike the slots 1024A-1024F, which define four stop surfaces 1032A-1032D, each of the slots 1200A, 1200C, 1200F, and 1200H defines eight (8) stop surfaces 1220A-1220H, with each of the eight (8) portions of each slot defining a different stop surface 1220A-1220H. For clarity reasons, these features are only labeled in slot 1200C. The stop surfaces 1220A-1220H operate to constrain bending in a similar manner as the stop surfaces 1032A-1032D described above.

Generally speaking, the slots 1200B, 1200D, 1200E, and 1200G are positioned outward of, or closer to the perimeter of the device 10 than, the slots 1200A, 1200C, 1200F, and 1200H. More specifically, the slots 1200B, 1200D, 1200E, and 1200G are mostly disposed outside of the display area 18. As illustrated in FIG. 23A, the center point of each of the slots 1200B, 1200D, 1200E, and 1200G is disposed outside of the display area 18. As such, at least one of the transversely extending portions 1028A of each of the slots 1200B, 1200D, 1200E, and 1200G is entirely disposed outside of the display area 18, while at least a portion of the other transversely extending portion 1028A and at least a portion of the transversely extending portions 1208 of each of the slots 1200B, 1200D, 1200E, and 1200G are disposed outside of the display area 18 as well. It will be appreciated that the slots 1200B, 1200D, 1200E, and 1200G can be positioned closer to the ends 1016A, 1016B and the edges 1020A, 1020B in other examples (i.e., more of the slots 1200B, 1200D, 1200E, and 1200G can be disposed outside of the display area 18). Unlike the slots 1200B, 1200D, 1200E, and 1200G, the center point 1206 of each of the slots 1200A, 1200C, 1200F, and 1200H is disposed within the display area 18, such that at least one of the angled portions 1216 is entirely disposed within the display area 18 and at least a portion of one of the transversely extending portions 1208 and a portion of one of the longitudinally extending portions 1212 is disposed within the display area 18. This, however, need not be the case. Instead, the center point 1206 of one or more of the slots 1200A, 1200C, 1200F, and 1200H can be disposed outside of the display area, as is the case with the other slots 1200B, 1200D, 1200E, and 1200G. Moreover, the center point 1206 of one or more of the slots 1200A, 1200C, 1200F, and 1200H can be positioned further inward (e.g., away from the ends 1016A, 1016B and the edges 1020A, 1020B), such that a larger portion of the slots 1200A, 1200C, 1200F, and 1200H is disposed within the display area 18. As also illustrated in FIG. 23A, the pins 1204A-1204H are structurally identical to the pins 1066A-1066F described above, but are arranged differently about the second substrate 1004. The positioning of the pins 1204A-1204H corresponds to the positioning of the slots 1200A-1200H, so will not be explicitly described herein.

When the first and second substrates 1000, 1004 are aligned with and movably connected to one another as illustrated in FIG. 23A, the pins 1204A-1204H are movably disposed within the slots 1200A-1200H, respectively, in a similar manner as the slot and pin arrangement described in connection with FIGS. 19 and 20. However, unlike the slot and pin arrangement described in connection with FIGS. 19 and 20, which only permits longitudinal and transverse bending at different times and bending along different radii in the same direction, the slot and pin arrangement in this example, because of the configuration of the slots 1200B, 1200D, 1200E, and 1200G, permits transverse bending (i.e., bending along a transverse axis), longitudinal bending (i.e., bending along a longitudinal axis), bending along different radii in the same direction, and bending with a longitudinal and a transverse component (i.e., bending along an axis that is angled relative to both a longitudinal axis and to a transverse axis). More specifically, the slot and pin arrangement in this example permits additional bending along bending axes that are oriented at a 45 degree angle relative to both the transverse axis 1026 and the longitudinal axis 1100. The slot and pin arrangement in this example also permits some simultaneous bending in two directions. In this way, the slot and pin arrangement in this example increases the bending freedom of the support 12 (as compared to the slot and pin arrangement described in connection with FIGS. 19 and 20).

At the same time, the additional bending permitted by this slot and pin arrangement is bound or limited by the slots 1200B, 1200D, 1200E, and 1200G and the corresponding pins 1204B, 1204D, 1204E, and 1204G disposed therein. More specifically, the slots 1200B, 1200D, 1200E, and 1200G, by virtue of being positioned relative to the other slots as described above, serve to bind or limit some of the additional bending that would otherwise be permitted by the slots 1200A, 1200C, 1200F, and 1200H (and corresponding pins 1204A, 1204C, 1204F, and 1204H) and would likely lead to crossing bending axes that, when projected onto a reference plane, would intersect within the reference area in the reference plane that is defined by the display 18, as described above. For example, as illustrated in FIG. 23A, the slots 1200B, 1200D, 1200E, and 1200G limit bending permitted by the slots 1200A, 1200C, 1200F, and 1200H, respectively, to those areas marked with a 1 (each area marked 1 being bounded by a respective corner of the support 12, a respective one of the dashed lines in FIG. 23A, and two of the slots 1200B, 1200D, 1200E, and 1200G). Without the slots 1200B, 1200D, 1200E, and 1200G limiting bending in this way, the slots 1200A, 1200C, 1200F, 1200H would permit pending beyond those areas marked with a 1 (i.e., bending further away from the corners and closer to the center of the support 12). Additional bending beyond these areas would, however, likely lead to crossing bending axes that, when projected on the display 18, would intersect within the display 18.

Like the slot and pin arrangement described in connection with FIGS. 19 and 20, the slots 1200A-1200H and the corresponding pins 1204H are configured to interact with one another to prevent the device 10, when bent in one direction (e.g., the transverse direction, the longitudinal direction) from being bent beyond its pre-defined bending limit in that direction (the pre-defined bending limit for that direction being determined by the position of the respective stop surface 1032A-1032D and 1220A-1220H. Moreover, the support 12 illustrated in FIG. 23 is also configured to prevent the undesirable simultaneous multi-directional bending discussed above. Like the slot and pin arrangement described in connection with FIGS. 19 and 20, the slots 1200A-1200H and the corresponding pins 1204A-1204H are similarly configured to interact with one another to prevent simultaneous multi-directional bending that, when projected onto a reference plane, would create bending axes that would intersect or cross with one another at a virtual point within a reference area defined by the flexible display 18 and disposed in the reference plane, the reference area being a two-dimensional area defined by the display 18 when laid in a substantially flat position. More specifically, when one or more of the pins 1204A-1204H are moved in response to the device 10 being bent in a first direction (e.g., the transverse direction) along a first bending axis (e.g., the transverse axis 1026), one or more of the slots 1200A-1200H can in turn lock or prevent one or more of the pins 1204A-1204H from moving in one or more certain directions that correspond to a bending axis that, when projected onto the reference plane, would intersect or cross with the first bending axis, when projected onto the reference plane, within the reference area, in the reference plane, defined by the display 18. As such, the slots 1200A-1200H can prevent simultaneous bending in a second direction along a second bending axis that, when projected onto the reference plane, would intersect or cross with the first bending axis, when projected onto the reference plane, within the reference area defined by the display 18.

If desired, the support 12 described in connection with FIG. 23A can be varied to control (e.g., adjust) the amount of bending (e.g., multi-directional bending) permitted by the support 12. More specifically, the slot and pin arrangement can be varied to control the amount of multi-directional bending permitted by the support 12. The first substrate 1000 can include more or less than eight (8) slots, the slots 1200A-1200H can be differently positioned or arranged, and/or can include differently constructed slots. For example, as illustrated in FIG. 23B, the slot and pin arrangement can instead include seven slots 1300A-1300G, those slots being identical to the slots 1200A-1200E, 1200G, and 1200H, respectively, with the fixation point 1070 being located proximate to the ends 1016A, 1058A of the first and second substrates 1000, 1004 and between the slots 1300A and 1300E. The fixation point 1070, which functions to locally fixedly connect the substrates 1000, 1004 together, also effectively replaces the slot 1200F described in FIG. 23A. It will be appreciated that the fixation point 1070 can perform the same bending limiting function as the slot 1200F. In some examples, the slots 1200A-1200H can have a different shape and/or size that facilitate greater, less, and/or different pin movement, thereby permitting greater, less, and/or different bending freedom. More particularly, one or more of the slots can have a different shape (e.g., a star shape, a T-shape), with one or more portions extending in different directions than the portions illustrated in FIG. 23A, a different number of portions, portions that are asymmetrically arranged around the center point(s) 1206, and/or one or more portions having different lengths and/or widths than one another. For example, the orientation of the angled portions 1216 in the slot and pin arrangement can be varied to permit additional bending along different axes (i.e., axes oriented at different angles relative to the transverse axis 1026 and the longitudinal axis 1100). As another example, one or more of the slots can include an odd number of portions (e.g., three portions, five portions, seven portions) or a different number of even portions (e.g., two portions, six portions, eight portions). In other examples, the slots 1200A-1200H can take the form of openings, apertures, tracks, channels, grooves, recesses, or any other suitable structure. For example, the slots 1200A, 1200C, 1200F, and/or 1200H can instead take the form of the slots 980A-980H described above in connection with FIGS. 18A and 18B. Similarly, the second substrate 1004 can include more or less than eight (8) pins, the pins 1204A-1204H can be differently positioned or arranged, and/or can include differently constructed pins 1204A-1204H. For example, as illustrated in FIG. 23B, the support 12 can include seven (7) pins 1304A-1304G, which are identical to the pins 1204A-1204H described in FIG. 23A, and correspond to the slots 1300A-1300G. In some examples, the pins 1204A-1204H can instead take the form of other protrusions, such as hooks, tabs, knobs, bumps, or any other suitable structure.

Figure 24:
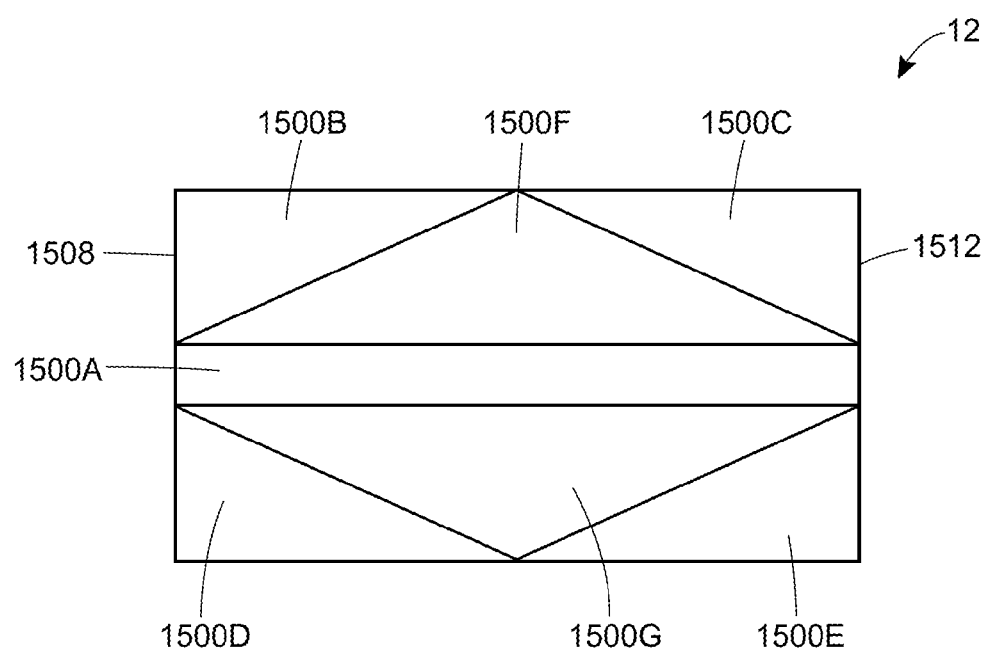
FIG. 24 illustrates another example of a flexible support that can be coupled to the flexible electronic component to constrain bending of the flexible electronic component to prevent the formation of bending axes that intersect or cross at a point within the flexible electronic component.

FIG. 24 depicts another example of a bending limiting structure that may be used to prevent the support 12 from being bent in two or more directions in a way that would undesirably create bending axes that, when projected onto the flexible display 18, intersect or cross within the flexible display 18. To this end, the bending limiting structure generally includes a plurality of different bending regions or zones that permit varying amounts of one-dimensional bending and are arranged relative to one another to prevent bending axes that when projected onto a reference plane cross or intersect within a reference area defined by the display 18 and disposed within the reference plane, just as described above.

The support 12 illustrated in FIG. 24 includes five (5) bending regions or zones 1500A-1500E combined with two (2) rigid regions or zones 1500F, 1500G. Bending region 1500A is centrally formed, has a rectangular shape, and longitudinally extends between a first end 1508 of the support 12 and a second end 1512 of the support. Each of the bending regions or zones 1500B-1500E is formed or defined at a corner of the support 12 and has a triangular shape. It will thus be appreciated that the bending regions or zones 1500A-1500E are angled relative to one another. Rigid zone 1500F is defined by and between bending regions 1500A, 1500B, and 1500C, with the result that the rigid zone 1500F has a triangular shape. Rigid zone 1500G is defined by and between bending regions 1500A, 1500D, and 1500E, with the result that the rigid zone 1500G has a triangular shape as well. The rigid zones 1500F, 1500G are made of a hard plastic or other rigid material configured to substantially resist or prevent bending.

Each of the bending regions or zones 1500A-1500E is generally defined to permit a desired level or amount of one-dimensional bending in each region (i.e., one permissible bending direction is fixed in each region). In some cases, the bending regions 1500A-1500E can be made of a flexible material such as, for example, rubber, plastic, leather, or other material selected based on the desired level of one-dimensional bending. The bending regions 1500A-1500E can be made of the same flexible material or one or more different flexible materials, such that the bending regions 1500A-1500E can permit the same or a different amount of one-dimensional bending. In other cases, the bending regions 1500A-1500E can include structural components such as, for example, slots, protrusions, tabs, recesses, openings, pins, hinges, or links, that interact with one another to permit a desired level of bending. One or more of the bending regions 1500A-1500E can take the form of any of the support structures described in (i) commonly owned U.S. Provisional Patent Application No. 61/920,705, filed Dec. 24, 2013 and entitled "Dynamically Flexible, Attachable Device Having an Integral Flexible Display, (ii) commonly owned U.S. Provisional Patent Application No. 61/946,412, filed Feb. 28, 2014 and entitled "Support Structure for a Flexible Electronic Component," and (iii) commonly owned U.S. Provisional Patent Application No. 61/979,668, filed Apr. 15, 2014 and entitled "Support Structure for a Flexible Electronic Component," the disclosures of which are hereby expressly incorporated by reference herein. In yet other cases, one or more of the bending regions 1500A-1500E can be made of a flexible material, while one or more other bending regions 1500A-1500E can take the form of any one of these previously described support structures.

So constructed, the support 12 permits one-dimensional bending of the different bending regions or zones 1500A-1500E and prevents the formation bending axes that when projected onto a reference plane cross or intersect within a reference area, defined by the display 18 when the display 18 is laid in a substantially flat position, and disposed in the reference plane. At the same time, although the support 12 only permits one-dimensional bending, the structure facilitates an overall two-dimensional bending ability of the support 12.

It will be appreciated that the support 12 illustrated in FIG. 24 can vary and still function in the intended manner. The support 12 can include more or less bending regions or zones 1500A-1500E, the bending regions or zones 1500A-1500E can vary in shape or size, and/or the bending regions or zones 1500A-1500E can be arranged differently. The support 12 can include more or less than two rigid zones 1500F, 1500G, the rigid zones 1500F, 1500G can vary in shape or size, and/or the rigid zones 1500F, 1500G can be arranged differently. For example, the support 12 may not include any rigid zones whatsoever.

Figure 25A:
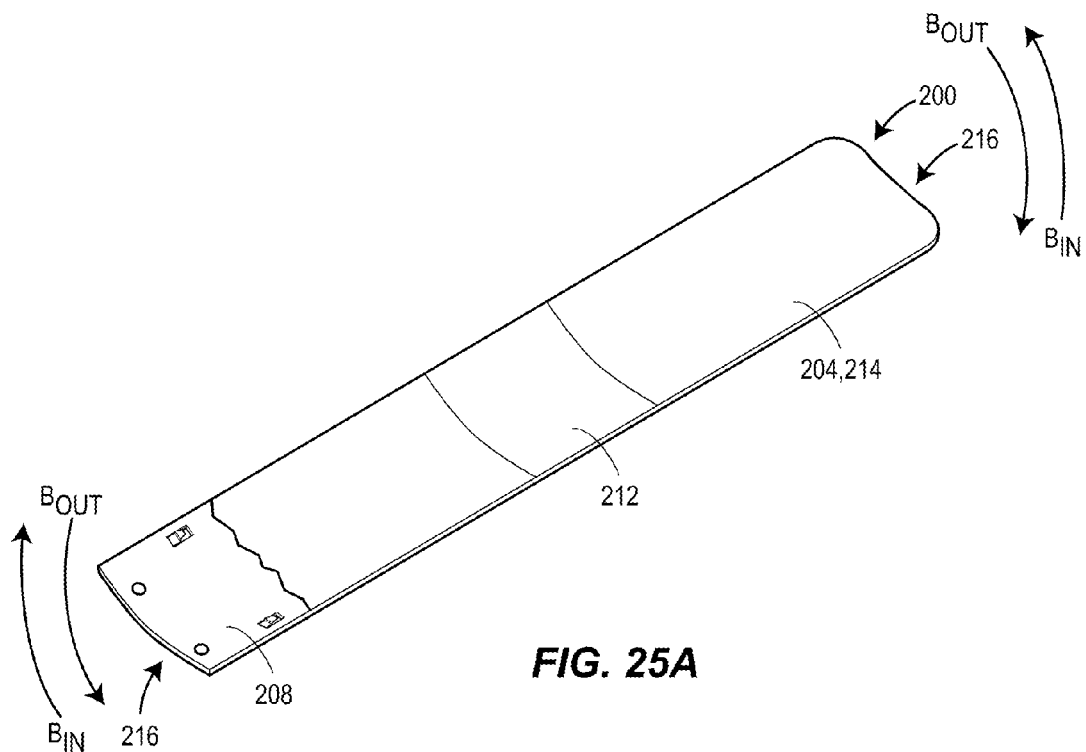
FIG. 25A is a perspective view of another example of a flexible support structure that can be coupled to the flexible electronic component to limit bending of the flexible electronic component, the flexible support structure including a first substrate and a second substrate movably connected to the first substrate.
Figure 25B:
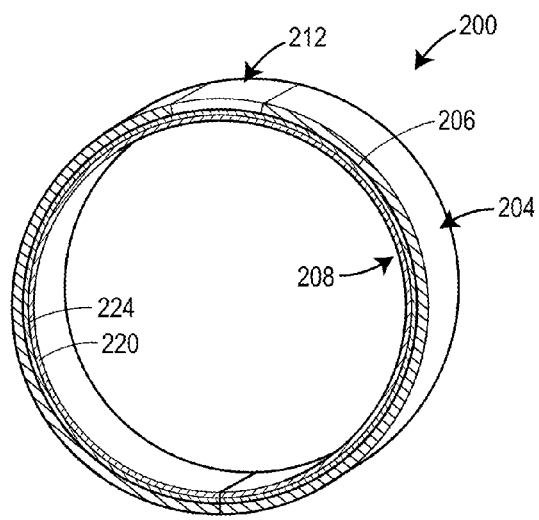
FIG. 25B is a side view of the flexible support structure illustrated in FIG. 25A bent or curved in an outward direction.

FIGS. 25A-25J illustrate a dynamically flexible article 200, in the form of an attachable or wearable wristband. As illustrated in FIGS. 25A and 25B, the article 200 includes a flexible electronic component 204 and a flexible support structure 208 coupled to the component 204. The article 200 is configured for bending, flexing, or curving in an outward direction (i.e., the component 204 has a concave shape), which is indicated by the arrows in FIG. 25A. Generally speaking, FIG. 25A depicts the article 200 in a first or substantially flat position, while FIG. 25B depicts the article 200 in a second or curved position.

With reference to FIGS. 25A and 25B, the flexible electronic component 204 is a flexible electronic display that is dynamically bendable or conformable to a surface, object, or device, though in other embodiments the flexible electronic component 204 can be a collapsible e-reader, roll-out screen, OLED light, or other electronic component. The flexible display 204 can be manufactured as any type of flexible display, such as an e-paper display, an organic light-emitting diode (OLED) display, etc., further details of which are described in commonly owned U.S. Provisional Patent Application 61/920,705, filed Dec. 24, 2013 and entitled "Dynamically Flexible, Attachable Device Having an Integral Flexible Display, the disclosure of which is hereby expressly incorporated by reference herein. Once manufactured, the flexible display 204 can be configured for flexing, curving, or bending in an inward direction (i.e., the flexible display 204 has a convex shape) and/or outward direction (i.e., the flexible display 204 has a concave shape). As is known in the art, the flexible display 204 has a minimum bending radius, which is based on the details surrounding the manufacture of the flexible display 204. When the flexible display 204 is flexed, curved, or bent beyond this minimum bending radius, one or more layers of the display 204 can delaminate, buckle, or crack, or otherwise be damaged, causing damage to the display 204. Likewise, when the flexible display 204 is flexed, curved, or bent in multiple directions and/or twisted (i.e., torsion is applied), one or more layers of the display 204 can delaminate, buckle, crack, or other be damaged, causing damage to the display 204.

With reference still to FIGS. 25A and 25B, the article 200 includes an electronics module 212 that is disposed between opposing ends 216 of the article 200 and holds electronics, such as processors, memories, sensors, batteries, display drivers, etc. that are used to power and drive the flexible display 204 and to provide other communication functionality for the device 200. It will be appreciated that the electronics module 212 can be positioned elsewhere in other examples, such as, for example, disposed on the flexible display 204 or at another position between the ends 216. If desired, the components of the electronics module 212 can be sealed or otherwise protected from water, air, dirt, etc. to which the exterior of the device 200 is exposed. For example, any or all of these electronic components may be encapsulated in a hermetically sealed manner to prevent any direct exposure of these components to exterior forces and environmental hazards.

As illustrated in FIG. 25A, the article 200 further may include a touch screen interface 214 disposed over the flexible display 204. The touch screen interface 214 can be a capacitive touch screen or any other type of touch screen interface that is transparent in nature, and thus can be laid over the top of the flexible display 204 to allow the flexible display 204 to be viewable there-through. As will be understood, the touch screen interface 214 may be powered and controlled by the electronics disposed within the electronics module 212 to perform various different types of touch detection functionality associated with a typical touch screen display.

The flexible support structure 208 in this example is a bi-stable flexible support, such that the flexible support structure 208 is movable between a substantially flat stable state or position, which corresponds to the first position of the article 200 illustrated in FIG. 25A, and a curled or curved state or position, which corresponds to the second position of the article 200 illustrated in FIG. 25B. The flexible support structure 208 includes a first substrate 220 and a second substrate 224 movably connected to the first substrate 220. As such, the flexible support structure 208 is configured to limit bending of the article 200, and, particularly, the flexible display 204, when the structure 208 is in both the flat stable state and the curved stable state, as will be described in greater detail below. In other words, the flexible support structure 208 is configured to limit bending of the article 200, and, particularly, the flexible display 204 beyond the flat stable state and the curved stable state. Moreover, the flexible support structure 208 is configured to provide torsion protection for the article 200 by resisting torsion applied thereto, as will also be described in greater detail below.

As illustrated in FIG. 25B, an interlayer 206 is disposed between the flexible display 204 and the flexible support structure 208. In this example, the interlayer 206 is an adhesive layer that serves to mechanically couple (i.e., adhere) the flexible display 204 to the flexible support structure 208. In other examples, the interlayer 206 can be or include a stretchable material (e.g., a flexible fabric covering integrally formed with the flexible display 204 and coupled to the flexible support structure 208), one or more layers of foam, rubber, visco-elastic, or other suitable material(s), or combinations thereof. In some cases, the interlayer 206 only serves to couple portions or segments of the display 204 to corresponding portions or segments of the flexible support structure 208. In some cases, the interlayer 206 can reduce, or even eliminate, the local variations in the bending radius of the article 200. In other words, the inter layer 206 can serve to smoothen out any local variation in the bending of the article 200, particularly the local variation of any bending experienced by the flexible display 204, thereby providing a more continuous local bending radius when the article 200 is curved or bent. Advantageously, in some cases, the inter layer 206 can also provide visco-elastic cushioning to the display 204, thereby making the display 204 less sensitive (e.g., less prone to damage) to objects dropped thereon. Finally, it will be appreciated that the article 200 need not include the interlayer 206, or any layer disposed between the flexible display 204 and the flexible support 208. Instead, the flexible display 204 and the flexible support 208 can be directly coupled to (e.g., integrally formed with) one another in any known manner.

As illustrated in FIGS. 25A and 25B, the flexible display 204 is, in this example, disposed over and spans the entire length of the interlayer 206 and the flexible support 208, such that the flexible display 204 extends between the ends of the article 200 and is viewable from the top of the article 200. In other examples, the flexible display 204 may only be disposed over and span a partial length of the flexible support 208 and/or may be disposed under the flexible support 208.

Though not depicted in FIGS. 25A and 25B, the article 200 can also include a connection structure that functions to connect the ends 216 of the article 200 together when the article 200 is bent, as illustrated in FIG. 25B, to form a circular, oval, or other-shaped band. In some embodiments, the connection structure can be a magnetically-based connection structure, such as, for example, a connection structure in the form of magnets disposed within the flexible support 208 at or proximate to the ends 216, magnets disposed at the ends 216 so that the ends 216 connect end-to-end, or magnets disposed on the top or bottom sides of the support 208 at or proximate to the ends 216 so that the article 200 can be folded around on itself so as to create an article of variable length. One or more mechanical connectors (e.g., buckles, snap components, clasps, cooperating grooves and projections, cooperating tabs and recesses), any desired hook and loop connection material (e.g., Velcro), or some other connection means can be used instead of or in addition to the magnetically-based connection structure. These and other connection structures are described in further detail in commonly owned U.S. Provisional Patent Application 61/920,705, filed Dec. 24, 2013 and entitled "Dynamically Flexible, Attachable Device Having an Integral Flexible Display, the disclosure of which is hereby expressly incorporated by reference herein.

Figure 25C:
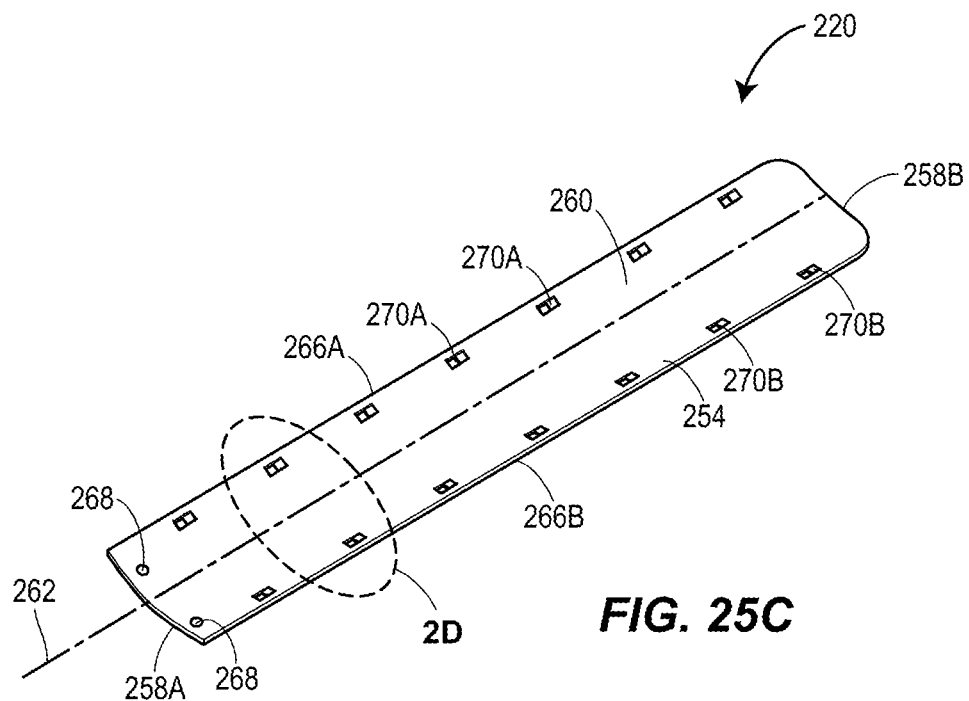
FIG. 25C is a perspective view of the first substrate of the flexible support structure illustrated in FIG. 25A.

Further details regarding the first and second substrates 220, 224 will now be described in connection with FIGS. 25C-25F. With reference to FIG. 25C, the first substrate 220 in this example is a substantially rectangular metal (e.g., brass, aluminum, copper, steel, tin, nickel) strip that has a slightly concave shape (i.e., a large radius of curvature) and is formed as a bi-stable spring, such that the first substrate 220 may be referred to herein as a bi-stable flexible metal strip. As illustrated in FIG. 25C, the first substrate 220 has a top side 250, a bottom side 254, a pair of opposing ends 258A, 258B, a longitudinal axis 262, and a pair of edges 266A, 266B disposed between the ends 258A, 258B and parallel to the longitudinal axis 262.

As illustrated in FIG. 25C, the first substrate 220 includes a pair of apertures 268 and a plurality of slots 270. The apertures 268 each have a circular shape and are formed in the first substrate 220 at or proximate to the end 258A. The plurality of slots 270 are generally formed in the first substrate 220 and are disposed from one end 258A of the first substrate 220 to the other end 258B of the first substrate 220. The plurality of slots 270 include slots 270A formed in the first substrate 220 proximate to the edge 266A and slots 270B formed in the first substrate 220 proximate to the edge 266B and across from or opposite the slots 270A. The slots 270A are evenly spaced apart from one another and formed at the same distance from the edge 266A as one another, with the slots 270B being evenly spaced apart from one another and formed at the same distance from the edge 266B as one another. It will be appreciated that as the distance between the apertures 268 and the slots 270A, 270B increases, the length of the slots 270A, 270B increases. In other words, the slots 270A, 270B positioned further away from the apertures 268 generally have a greater length than the slots 270A, 270B positioned closer to the apertures 268. As will be described in greater detail below, the slots 270 generally define or correspond to the most extreme local bending that will be permitted.

Figure 25D:
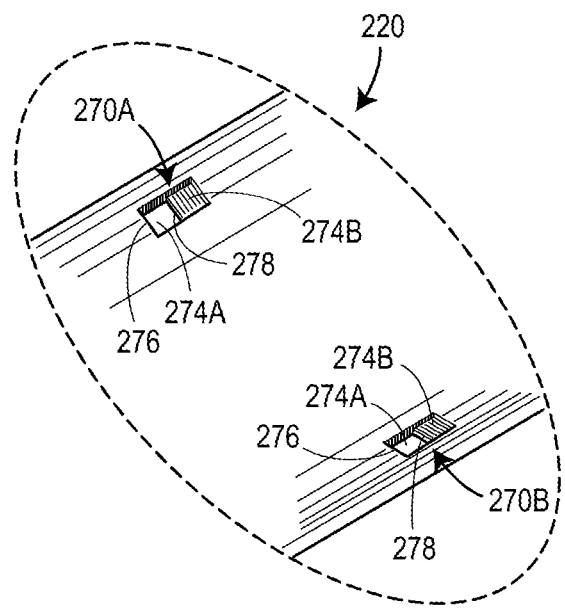
FIG. 25D is a close-up perspective view of a portion of the first substrate illustrated in FIG. 25C.

FIG. 25D is a close-up view of a portion of the first substrate 220, showing one of the slots 270A and one of the slots 270B in greater detail. As depicted, each slot 270A, 270B has a rectangular-shape in cross-section, and includes a first portion 274A that extends entirely through the thickness of the first substrate 220 and a second portion 274B that extends through only a portion of the thickness of the first substrate 220. Each second portion 274B is thus recessed relative to the top side 250 of the first substrate 220. As illustrated in FIG. 25D, each slot 270A, 270B has a first stop surface 276 and a second stop surface 278 opposite the first stop surface 276. The first stop surface 276, which is defined by a perimeter edge of the first portion 274A, generally defines or corresponds to the most extreme bending that will be permitted in the outward direction when the article 200 is in the second or curled position (see FIG. 25B). The second stop surface 278, which is defined by the intersection of the first portion 274A and the second portion 274B, generally defines or corresponds to the most extreme bending that will be permitted in the inward direction when the article 200 is in the first or substantially flat position (see FIG. 25A).

In other embodiments, the first substrate 220 can vary from the one illustrated in FIGS. 25C and 25D. The first substrate 220 can have a different shape (e.g., can be substantially or entirely flat, can have a more circular shape, can have an irregular shape, can have a more or less concave shape, can have a convex shape) and/or a different size. In one embodiment, the first substrate 220 can take the form of one or more (e.g., two) elongated, narrow strips. The first substrate 220 can alternatively be formed as a mono-stable flexible strip (i.e., the first substrate can have one stable position, similar to a tape measure) or as a multi-stable flexible strip having more than two stable positions. The first substrate 220 can alternatively or additionally be made of one or more different materials, such as, for example, plastic, leather, or cloth. Further yet, the first substrate 220 can include a different number of apertures 268 (e.g., one aperture 268, four apertures 268), can include differently positioned apertures 268 (e.g., apertures 268 disposed near or at the end 258B), and/or can include differently constructed apertures 268 (e.g., apertures 268 having a differently shaped cross-section). Alternatively, the first substrate 220 need not include the apertures 268. The first substrate 220 can include a different number of slots 270, can include differently positioned or spaced slots 270 (e.g., spaced closer to or further from one another, spaced closer to or further from the edges 258A, 258B), and/or can include differently constructed slots 270. For example, the slots 270 can take the form of openings, apertures, tracks, channels, grooves, recesses, or any other suitable structure.

Figure 25E:
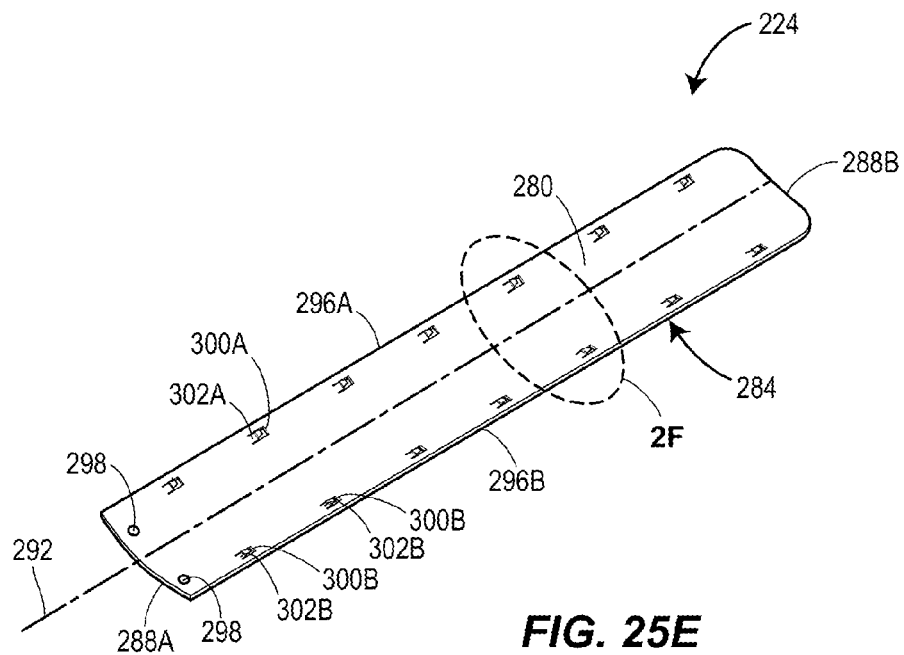
FIG. 25E is a perspective view of the second substrate of the flexible support structure illustrated in FIG. 25A.

With reference to FIG. 25E, the second substrate 224 in this example is a substantially rectangular metal (e.g., brass, aluminum, copper, steel, tin, nickel) strip that has a slightly concave shape (i.e., a large radius of curvature) and is formed as a bi-stable spring such that the second substrate 224 may also be referred to herein as a bi-stable flexible metal strip. As illustrated in FIG. 25E, the second substrate 224 has a top side 280, a bottom side 284, a pair of opposing ends 288A, 288B, a longitudinal axis 292, and a pair of edges 296A, 296B disposed between the ends 288A, 288B and parallel to the longitudinal axis 292.

As illustrated in FIG. 25E, the second substrate 224 includes a pair of apertures 298, a plurality of openings 300, and a plurality of projections 302. The apertures 298 are identical in shape and size to the apertures 268 but are formed in the second substrate 224 at or proximate to the end 288A. The openings 300 are essentially identical in shape and size to the slots 270 and are generally formed in the second substrate 224 from one end 288A of the second substrate 224 to the other end 288B of the second substrate 224. The plurality of openings 300 includes openings 300A formed in the second substrate 224 proximate to the edge 296A and openings 300B formed in the second substrate 224 proximate to the edge 296B and across from or opposite the openings 300A. The openings 300A are formed the same distance from the edge 296A as one another, while the openings 300B are formed the same distance from the edge 296B as one another. It will be appreciated that as the distance between the apertures 298 and the openings 300A, 300B increases, the length of the openings 300A, 300B increases. In other words, the openings 300A, 300B positioned further away from the apertures 298 generally have a greater length than the openings 300A, 300B positioned closer to the apertures 298. The plurality of projections 302 are generally associated with or correspond to the openings 300, respectively. The plurality of projections 302 are generally formed or defined such that each projection 302 extends outwardly or away from the top side 280 of the second substrate 224 at a position over or above a respective one of the openings 300. The plurality of projections 302 includes projections 302A formed or defined proximate to the edge 296A and projections 302B formed or defined proximate to the edge 296B. The projections 302A are formed at the same distance from the edge 296A as one another, while the projections 302B are formed at the same distance from the edge 296B as one another. As with the openings 300A, 300B, it will be appreciated that as the distance between the apertures 298 and the projections 302A, 302B increases, the length of the projections 302A, 302B increases. In other words, the projections 302A, 302B positioned further away from the apertures 298 generally have a greater length than the projections 302A, 302B positioned closer to the apertures 298.

Figure 25F:
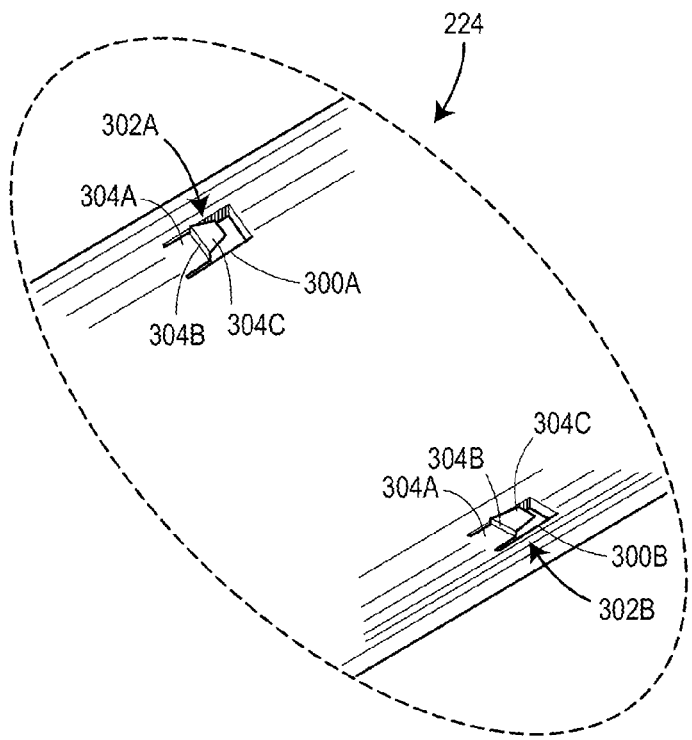
FIG. 25F is a close-up perspective view of a portion of the second substrate illustrated in FIG. 25E.

FIG. 25F is a close-up view of a portion of the second substrate 224, showing one opening 300A, one opening 300B, one projection 302A, and one projection 302B in greater detail. As illustrated, each projection 302A, 302B is generally shaped like a shelf, with a substantially horizontal first portion 304A that is coupled to the top side 280 and extends inward into a portion of a respective one of the openings 300A, 300B, a substantially horizontal second portion 304C disposed over or above a respective one of the openings 300A, 300B, and a substantially vertical step portion 304B that connects the first portion 304A and the second portion 304B.

In other embodiments, the second substrate 224 can vary from the one illustrated in FIGS. 25E and 25F. The second substrate 224 can have a different shape (e.g., can be substantially or entirely flat, can have a more circular shape, can have an irregular shape, can have a more or less concave shape, can have a convex shape) and/or can have a different size. The second substrate 224 can alternatively be formed as a mono-stable flexible strip (i.e., the second substrate 224 can have one stable position, similar to a tape measure) or as a multi-stable flexible strip having more than two stable positions. The second substrate 224 can alternatively or additionally be made of one or more different materials, such as, for example, plastic, leather, or cloth. Further yet, the second substrate 224 can include a different number of apertures 298 (e.g., one aperture 298, four apertures 298), can include differently positioned apertures 298 (e.g., apertures 298 disposed near or at the end 288B), and/or can include differently constructed apertures 298 (e.g., apertures 298 having a differently shaped cross-section). Alternatively, the second substrate 224 need not include the apertures 298. The second substrate 224 can include a different number of openings 300 and/or projections 302, differently positioned or spaced openings 300 and/or projections 302 (e.g., openings 300 spaced closer to or further from the edges 288A, 288B or from each other), and/or differently constructed openings 300 and/or projections 302 (e.g., projections 302 having a different shape). For example, the projections 302 can take the form of tabs, hooks, knobs, bumps, or any other suitable structure(s).

Figure 25G:
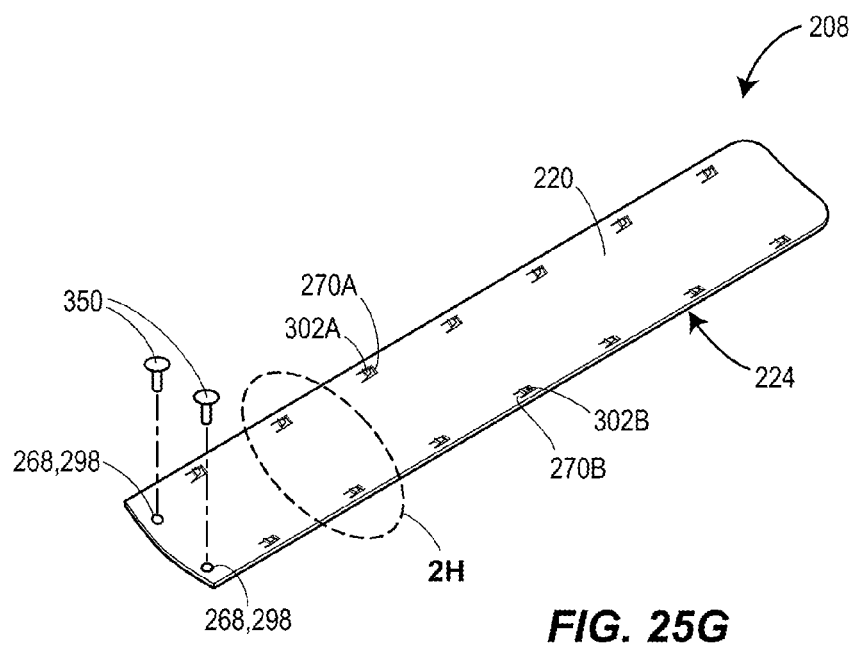
FIG. 25G is a perspective view illustrating the first substrate illustrated in FIGS. 25C and 25D and the second substrate illustrated in FIGS. 25E and 25F movably connected to form the flexible support structure illustrated in FIG. 25A.

FIG. 25G depicts the first and second substrates 220, 224 aligned with and movably connected or coupled to one another. It will be appreciated that the first and second substrates 220, 224 have a substantially similar shape and size, such that when the assembled flexible support structure 208 is viewed from the top, the second substrate 224 is substantially not visible (with the exception of the projections 302), while when the flexible support structure 208 is viewed from the bottom, the first substrate 220 is substantially not visible. In other examples, however, the first and second substrates 220, 224 need not have a substantially similar shape and/or size. In some examples, one of the first and second substrates 220, 224 can have the shape illustrated in FIGS. 25C-25F, while the other one of the substrates 220, 224 can have a different shape, such as, for example, a substantially or entirely flat shape. For example, the first substrate 220 can be substantially flat, in which case the slots 270 of the first substrate 220 can be wider, as compared to the slots 270 illustrated herein, in order to accommodate the transition of the second substrate 224 from the concave state to the flat state when the article 200 is moved from the substantially flat position to the curled position. In this example, the first and second substrates 220, 224 would be overlaying and in contact with one another when the article 200 is in the curled position, but would only touch one another at or along the edges 266A, 266B, 288A, 288B when the article 200 is in the substantially flat position. As another example, the second substrate 224 can have the shape illustrated in FIGS. 25E and 25F, while the first substrate 220 can take the form of one or more narrow, elongated strips movably coupled to the second substrate 224.

When the first and second substrates 220, 224 are substantially aligned with one another as illustrated in FIG. 25G, the apertures 268 of the first substrate 220 are aligned with the apertures 298 of the second substrate 224, the slots 270 of the first substrate 220 are aligned with the openings 300 of the second substrate 224, and the projections 302 of the second substrate 224 are movably disposed within the slots 270 of the first substrate 220. At least some portion of the first substrate 220 is fixedly attached to at least some portion of the second substrate 224. In this example, one end 258A of the first substrate 220 is fixedly attached to a corresponding end 288A of the second substrate 220 using or via a fastener 350 (e.g., a pin, a rivet, a screw) inserted into each of the aligned pairs of apertures 268, 298. The other ends 258B, 288B of the first and second substrates 220, 224 are thus freely movable relative to one another.

In other examples, the apertures 268, 298 can be formed or defined in different portions of the first and second substrates 220, 224, such that the first and second substrates 220, 224 can be fixedly attached to one another at different portions. For example, the apertures 268, 298 can be formed at or near the ends 258B, 288B of the first and second substrates 220, 224, respectively, such that the first and second substrates 220, 224 can be fixedly attached to one another at or near the ends 258B, 288B, rather than at the ends 258A, 288A. As another example, the apertures 268, 298 can be formed at or near a middle portion of the first and second substrates 220, 224, such that the first and second substrates 220, 224 can be fixedly attached to one another at or near the middle portion, rather than at the ends 258A, 288A. In other examples, the first and second substrates 220, 224 can include more or less apertures 268, 298. For example, the first substrate 220 can include one aperture 268 and the second substrate 224 can include one aperture 298, with the first and second substrates 220, 224 locally fixedly attached to one another at or via the two apertures 268, 298. Further yet, the first and second substrates 220, 224 can be locally welded, adhered (e.g., glued), or otherwise fixedly attached to one another in a way such that the apertures 268, 298 are not necessary.

Figure 25H:
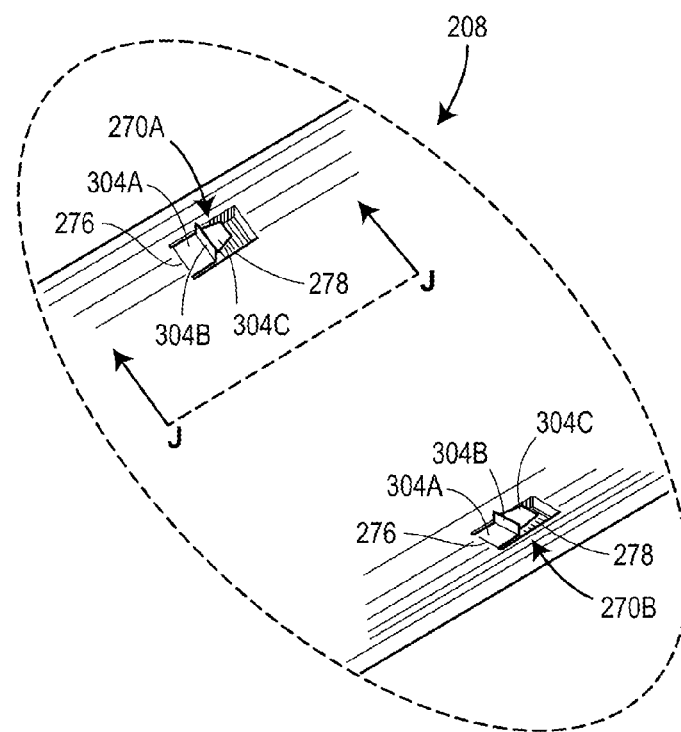
FIG. 25H is a close-up perspective view of a portion of the flexible support structure illustrated in FIG. 25G.

FIG. 25H is a close-up view of a portion of the support structure 208 illustrated in FIG. 25G. As noted above, the projections 302 of the second substrate 224 are movably disposed within the slots 270 of the first substrate 220. More specifically, as illustrated in FIG. 25H, the first portion 304A of each projection 302 is aligned with, but slightly recessed relative to, the first portion 274A of a respective slot 270, the step portion 304B of each projection 302 is disposed within the first portion 274A of a respective slot 270, and the second portion 304C of each projection 302 is seated or disposed on the second portion 274B of a respective slot 270. As such, the step portion 304B of each projection 302 is movably disposed between the first and second stop surfaces 276, 278 of a respective slot 270.

It will be appreciated that the first and second substrates 220, 224 can be movably connected to one another in a different manner. For example, the first substrate 220 and the second substrate 224 can be reversed, with the second substrate 224 including the slots 270 and the first substrate 220 including the projections 302 movably disposed within the slots 270. As another example, the first and second substrates 220, 224 can each include slots 270 and projections 302 (e.g., alternating slots 270 and projections 302). The first and second substrates 220, 224 can, in some examples, be movably connected to one another in a different location, in multiple locations, and/or using components other than the slots 270 and the projections 302 illustrated herein. Any number and/or combination of fasteners, grooves, tabs, protrusions, ribs, slots, and other components can be used for this/these purpose(s).

In any event, the flexible support 208, via the interaction between corresponding slots 270 and projections 302, can limit bending of the article 200, and, more particularly, the flexible display 204. Because the article 200 is configured for bending in the outward direction, the flexible support 208 is configured to permit some bending of the article 200, and, more particularly, the flexible display 204, in the outward direction but is configured to prevent bending of the flexible display 204 in the outward direction (indicated by the arrows $B_{OUT}$ in FIG. 25A) beyond its bending limit (e.g., beyond its minimum bending radius). At the same time, the flexible support 208 can substantially limit bending of the article 200, and, more particularly, the flexible display 204, in the inward direction (indicated by the arrows $B_{IN}$ in FIG. 25A). It will thus be appreciated that the flexible support 208 is configured to permit more bending of the article 200 in the outward direction than in the inward direction, though this need not be the case.

Figure 25I:
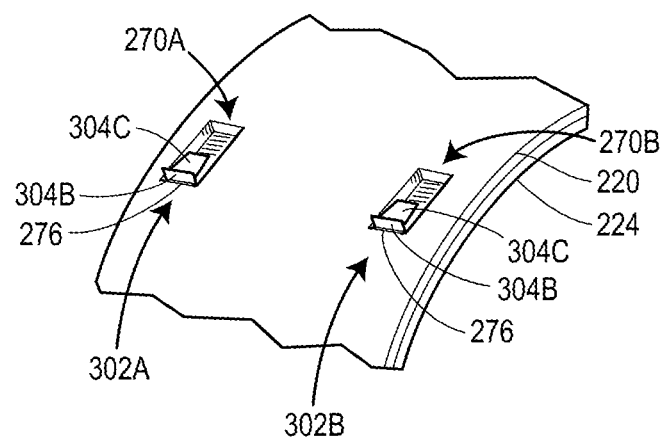
FIG. 25I illustrate a portion of the flexible support structure illustrated in FIG. 25G bent or curved in an outward direction.

When the article 200 is in the first or substantially flat stable position (i.e., the position illustrated in FIGS. 25A, 25G, and 25H), and the article 200 is bent or curved in the outward direction (indicated by the arrows in FIG. 25A), the applied bending force causes the projections 302 of the second substrate 224 to move relative to the slots 270 of the first substrate 220. Specifically, the applied bending force causes the first portion 304A of each projection 302 to slide relative to and away from the first portion 274A of a respective slot 270 and underneath the first substrate 220, causes the step portion 304B of each projection 302 to slide away from the second portion 274B and toward the stop surface 276 of a respective slot 270, and causes the second portion 304C of each projection 302 to slide along the second portion 274B and toward the first portion 274A of a respective slot 270. At some point, the article 200 will be bent to such a degree that the step portion 304B of each projection 302 contacts the first stop surface 276 of a respective slot 270, as depicted in FIG. 25I. At this point, the article 200 has reached its pre-defined bending limit and any further bending of the article 200, particularly the flexible display 204, in the outward direction is prevented. This position generally corresponds to the second or curled stable position of the article 200 (see FIG. 25B), such that the article 200 cannot be bent or curved beyond the second stable position, though that need not be the case (e.g., a limited amount of bending can be permitted beyond the second or curled stable position).

Figure 25J:
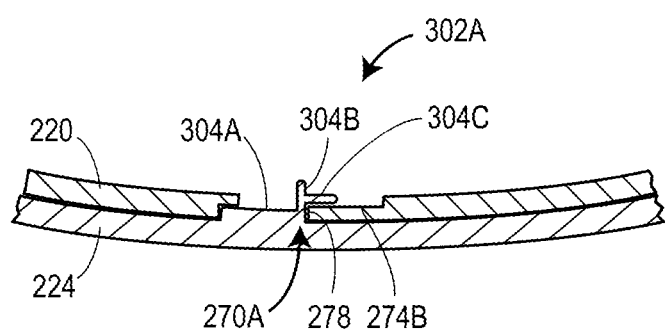
FIG. 25J illustrate a portion of the flexible support structure illustrated in FIG. 25G bent or curved in an inward direction.

When the article 200 is in the first or substantially flat stable position (i.e., the position illustrated in FIGS. 25A, 25G, and 25H), and the article 200 is bent or curved in the inward direction, the applied bending force causes the projections 302 of the second substrate 224 to move relative to the slots 270 of the first substrate 220. Specifically, the applied bending force causes the first portion 304A of each projection 302 to slide relative to the first portion 274A of a respective slot 270, causes the step portion 304B of each projection 302 to slide toward the second portion 274B and away from the stop surface 276 of a respective slot 270, and causes the second portion 304C of each projection 302 to slide along the second portion 274B and away from the first portion 274A of a respective slot 270. At some point, the article 200 will be bent to such a degree (i.e., corresponding to the maximum bending amount in this direction) that the step portion 304B of each projection 302 contacts the second stop surface 278 of a respective slot 270, as depicted in FIG. 25J. At this point, the article 200 has reached its pre-defined bending limit and any further bending of the article 200, particularly the flexible display 204, in the inward direction is prevented.

The flexible support structure 208 can also provide torsion control. By virtue of having two substrates 220, 224 movably connected to one another and the slots 270 and the projections 302 being positioned proximate to the edges 266A, 266B and 296A, 296B, respectively, and configured to interferingly contact one another, the flexible support structure 208 can substantially resist or prevent torsion from being applied to the longitudinal sides of the article 200, and, thus, the flexible display 204. At the very least, the flexible support structure 208 described herein will substantially reduce the amount of torsion that can be applied to the article 200, and, thus, the flexible display 204. It will be appreciated that the flexible support structure 208 can thus help to prevent the damage to the brittle layers of the flexible display 204 that would otherwise be caused by torsion applied to the article 200. It will be appreciated that the width and/or the length of the slots and the projections 302, and/or the spacing between the slots 270 and the projections 302, can be varied, yet the flexible support structure 208 can still provide at least some level of torsion control. In some of these cases, the width, length, and/or the spacing can be varied such that the flexible support structure 208 provides less resistance to torsion, and thus permits more bending in the transverse direction.

In other examples, the components of the flexible support 208, e.g., the slots 270, the projections 302, can be varied to control (e.g., adjust) the amount of bending between adjacent portions of the article 200, and, in turn, adjust the shape of the article 200 in the second or curled stable position. In some examples, the length of the slots 270 and the projections 302 can be varied to control (e.g., adjust) the amount of bending between portions of the article 200 adjacent to those slots 270 and projections 302, and, in turn, adjust the shape of the article 200 in the second or curled stable position. In general, the degree to which the length of the slots 270 and the projections 302 is varied relative to adjacent slots 270 and projections 302 determines the degree to which the amount of bending can be varied for portions of the article 200 therebetween. More specifically, the more the length of the slots 270 and the projections 302 is increased relative to adjacent slots 270 and projections 302, the greater the increase in the amount that portions of the article 200 between the slots 270 and the projections 302 (i.e., between the (i) increased length slots 270 and projections 302 and (ii) the slots 270 and projections 302 adjacent thereto) can be bent. Conversely, the less the length of the slots 270 and the projections 302 is increased relative to adjacent slots 270 and projections 302, the smaller the increase in the amount that portions of the article 200 between the slots 270 and the projections 302 (i.e., between the (i) increased length slots 270 and projections 302 and (ii) the slots 270 and projections 302 adjacent thereto) can be bent. Further yet, the number of and spacing between the different slots 270 and the number of and spacing between the different projections 302 can be adjusted to control (e.g., adjust) the amount of bending between adjacent portions of the article 200, and, in turn, adjust the shape of the article 200 in the second or curled stable position. It will be appreciated that the length of the components of the flexible support 208 and, in some cases, the spacing between the components of the flexible support 208, can be varied in a way such that the article 200 has any number of other shapes (e.g., an elliptical shaped article). In further examples, the article 200 can include an adjustable flexible support structure, such that the article 200 can be adjusted to reach a desired shape and size (e.g., to produce the shape and size of the wrist of the user wearing the article 200). This is generally achieved by providing the flexible support structure with one or more user-selectable components (e.g., slots, fixation points). This generally produces an adjustable flexible support structure, such that the article 200 can be adjusted to reach the desired shape and size. This can be advantageous when, for example, the article 200 is used by a user with a small wrist, but is then used by another user with a larger wrist (or vice-versa).

Figure 26A:
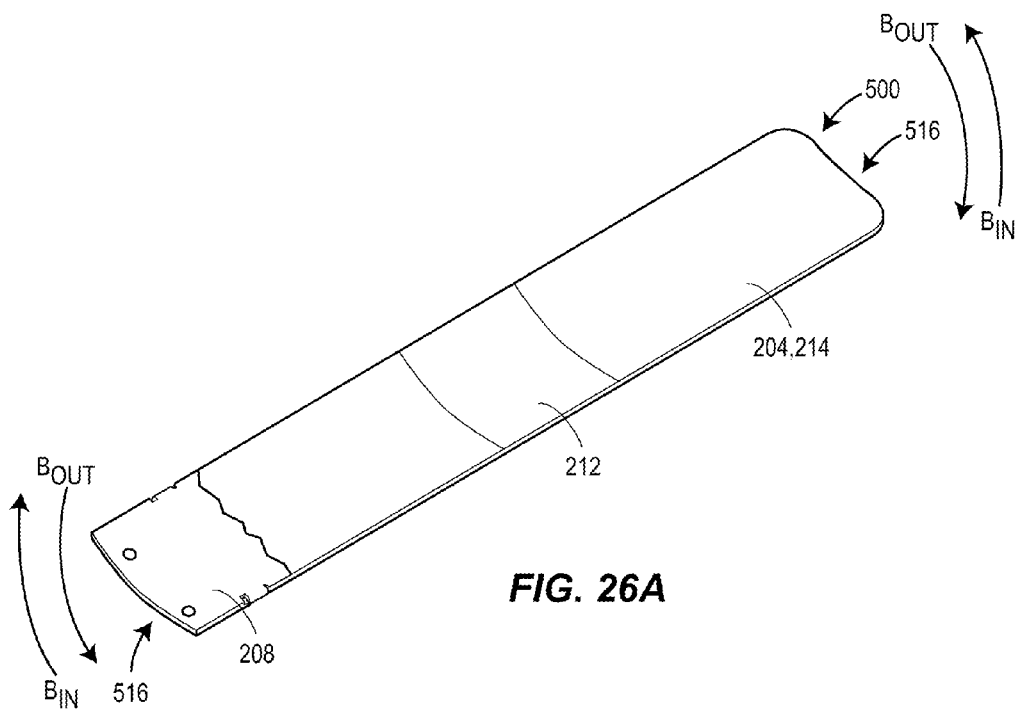
FIG. 26A is a perspective view of another example of a flexible support structure that can be coupled to the flexible electronic component to limit bending of the flexible electronic component, the flexible support structure including a first substrate and a second substrate movably connected to the first substrate.
Figure 26B:
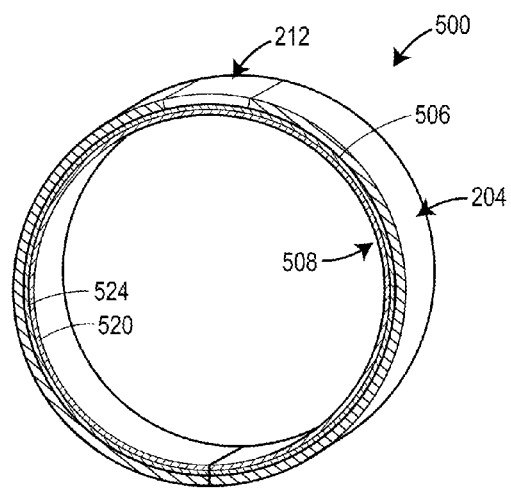
FIG. 26B is a side view of the attachable article illustrated in FIG. 26A bent or curved in an outward direction.

FIGS. 26A-26J illustrate another dynamically flexible article 500, in the form of an attachable or wearable wristband. As illustrated in FIGS. 26A and 26B, the article 500 is similar to the article 200 described above, with common components represented by common reference numerals, but includes a flexible support structure 508, different from the flexible support structure 208, coupled to the flexible display 204. The article 500 is configured for bending, flexing, or curving in an outward direction (i.e., such that the flexible display 204 has a concave shape), which is indicated by the arrows in FIG. 26A. FIG. 26A depicts the article 500 in a first or substantially flat position. FIG. 26B depicts the article 500 in a second or curved position.

Like the flexible support structure 208 described above, the flexible support structure 508 is a bi-stable flexible support, such that the flexible support structure 508 is movable between a flat stable state or position (see FIG. 26A) and a curled or curved stable state or position (see FIG. 26B). The flexible support structure 508 includes a first substrate 520 and a second substrate 524 movably connected to the first substrate 520. As such, the flexible support structure 508 is configured to limit bending of the article 500, particularly the display 204, when the structure 508 is in both the flat stable state and the curved stable state, as will be described in greater detail below. In other words, the flexible support structure 508 is configured to limit bending of the article 500, particularly the display 204, beyond the flat stable state and the curved stable state. Moreover, the flexible support structure 508 is configured to resist torsion applied to the article 500, as will also be described in greater detail below.

As illustrated in FIG. 26B, an interlayer 506 is disposed between the flexible display 204 and the flexible support structure 508. In this example, the interlayer 506 is an adhesive layer that serves to mechanically couple (e.g., adhere) the flexible display 204 to the flexible support structure 508. In other examples, the interlayer 506 can be or include a stretchable material (e.g., a flexible fabric covering integrally formed with the flexible display 204 and coupled to the flexible support structure 508), one or more layers of foam, rubber, visco-elastic, or other suitable material(s), or combinations thereof. In some cases, the interlayer 506 only serves to couple portions or segments of the display 204 to corresponding portions or segments of the flexible support structure 508. In some cases, the interlayer 506 can reduce, or even eliminate, the local variations in the bending radius of the article 500. In other words, the interlayer 506 can serve to smoothen out any local variation in the bending of the article 500, particularly the local variation of any bending experienced by the flexible display 204, thereby providing a more continuous local bending radius when the article 500 is curved or bent. Advantageously, in some cases, the interlayer 506 can also provide visco-elastic cushioning to the display 204, thereby making the display 204 less sensitive (e.g., less prone to damage) to objects dropped thereon. Finally, it will be appreciated that the article 500 need not include the interlayer 506, or any layer disposed between the flexible display 204 and the flexible support 508. Instead, the flexible display 204 and the flexible support 508 can be directly coupled to (e.g., integrally formed with) one another in any known manner.

As illustrated in FIGS. 26A and 26B, the flexible display 204 is, in this example, disposed over and spans the entire length of the interlayer 506 and the flexible support 508, such that the flexible display 204 extends between the ends of the article 500 and is viewable from the top of the article 500. In other examples, the flexible display 204 may only be disposed over and span a partial length of the flexible support 508 and/or may be disposed under the flexible support 508.

Though not depicted in FIGS. 26A and 26B, the article 500 can also include a connection structure that functions to connect the ends 516 of the article 500 together when the article 500 is bent, as illustrated in FIG. 26B, to form a circular, oval, or other-shaped band. In some embodiments, the connection structure can be a magnetically-based connection structure, such as, for example, a connection structure in the form of magnets disposed within the flexible support 508 at or proximate to the ends 516, magnets disposed at the ends 516 so that the ends 516 connect end-to-end, or magnets disposed on the top or bottom sides of the support 508 at or proximate to the ends 516 so that the article 500 can be folded around on itself so as to create an article of variable length. One or more mechanical connectors (e.g., buckles, snap components, clasps, cooperating grooves and projections, cooperating tabs and recesses), any desired hook and loop connection material (e.g., Velcro), or some other connection means can be used instead of or in addition to the magnetically-based connection structure. These and other connection structures are described in further detail in commonly owned U.S. Provisional Patent Application 61/920,705, filed Dec. 24, 2013 and entitled "Dynamically Flexible, Attachable Device Having an Integral Flexible Display, the disclosure of which is hereby expressly incorporated by reference herein.

Figure 26C:
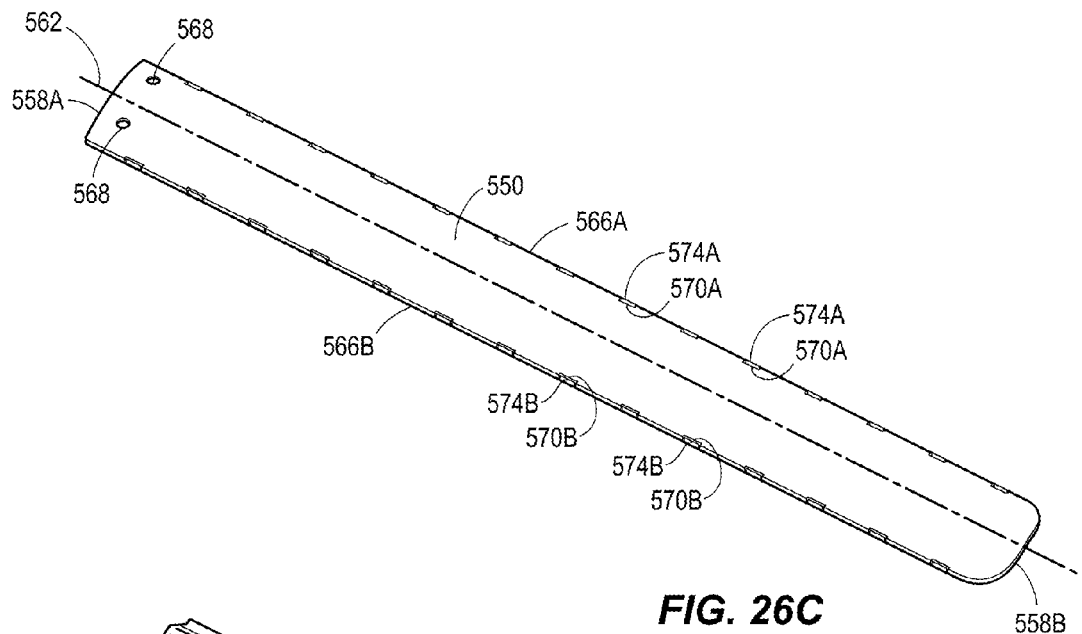
FIG. 26C is a perspective view of the first substrate of the flexible support structure illustrated in FIG. 26A.

Further details regarding the first and second substrates 520, 524 will now be described in connection with FIGS. 26C-26F. With reference to FIG. 26C, the first substrate 520 in this example is a substantially rectangular metal (e.g., brass, aluminum, copper, steel, tin, nickel) strip that has a slightly concave shape (i.e., a large radius of curvature) and is formed as a bi-stable spring, such that the first substrate 520 can be referred to as being a bi-stable flexible metal strip. As illustrated in FIG. 26C, the first substrate 520 has a top side 550, a bottom side 554, a pair of opposing ends 558A, 558B, a longitudinal axis 562, and a pair of edges 566A, 566B disposed between the ends 558A, 558B and parallel to the longitudinal axis 562.

As also illustrated in FIG. 26C, the first substrate 520 includes a pair of apertures 568, a plurality of openings 570, and a plurality of projections 574. The apertures 568 each have a circular shape and are formed in the first substrate 520 at or proximate to the end 558A. The openings 570 have a generally rectangular shape in cross-section and are generally formed in the first substrate 520 from one end 558A of the first substrate 520 to the other end 558B of the first substrate 520. The plurality of openings 570 includes openings 570A formed in or along the edge 566A of the first substrate 520 and openings 570B formed in or along the edge 566B of the first substrate 520 across from or opposite the openings 570A. The openings 570A are evenly spaced apart from one another and the openings 570B are evenly spaced apart from one another, although the openings 570A, 570B may be unevenly spaced apart from one another if desired. It will be appreciated that as the distance between the apertures 568 and the openings 570A, 570B increases, the length of the openings 570A, 570B increases. In other words, the openings 570A, 570B positioned further away from the apertures 568 generally have a greater length than the openings 570A, 570B positioned closer to the apertures 568. The plurality of projections 574 are generally associated with or correspond to the openings 570, respectively. The plurality of projections 574 are generally formed or defined such that each of the projections 574 extends outward and downward from the top side 550 of the first substrate 520 within a respective one of the openings 570. The plurality of projections 574 include projections 574A formed or defined along the edge 566A and projections 574B formed or defined along the edge 566B. The projections 574A are evenly spaced apart from one another and the projections 574B are evenly spaced apart from one another, although the projections 574A, 574B may be unevenly spaced apart from one another if desired. As with the openings 570A, 570B, it will be appreciated that as the distance between the apertures 568 and the projections 574A, 574B increases, the length of the projections 574A, 574B increases. In other words, the projections 574A, 574B positioned further away from the apertures 568 generally have a greater length than the projections 574A, 574B positioned closer to the apertures 568.

Figure 26D:
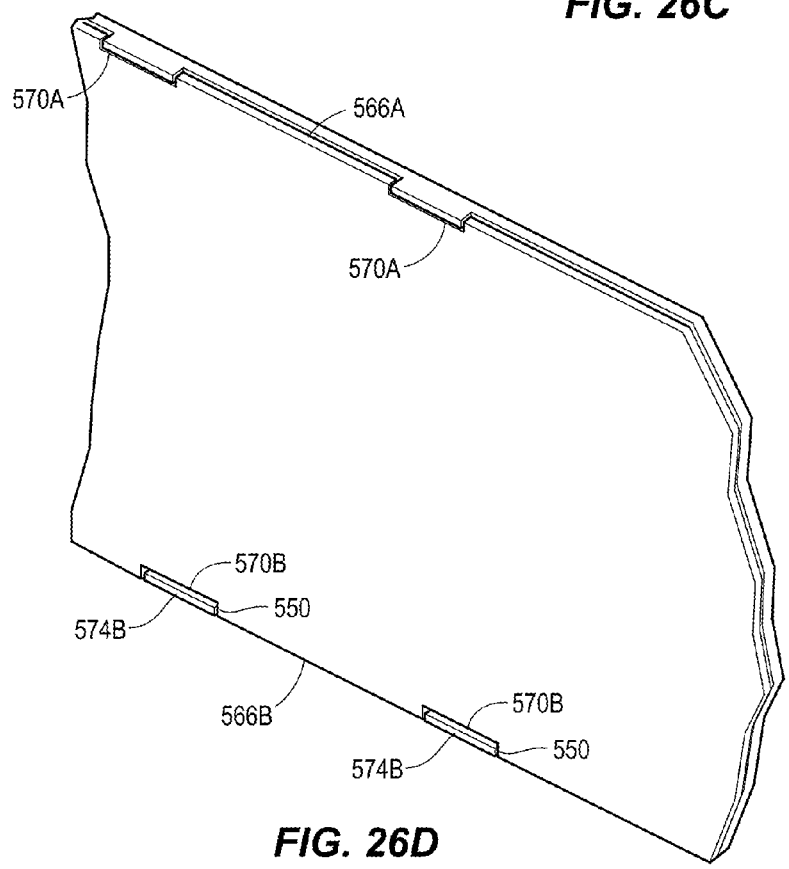
FIG. 26D is a close-up perspective view of a portion of the first substrate illustrated in FIG. 26C.

FIG. 26D is a close-up view of a portion of the first substrate 520, showing two openings 570A, two openings 570B, two projections 574A, and two projections 574B. As illustrated, each projection 574A, 574B has a generally curved profile, with a first end portion 575A that is coupled to and extends outward or away from the top side 550, a middle portion 575B that extends downward and outward from the first end portion 575A and is positioned within a respective one of the openings 570, and a second end portion 575C, opposite the first end portion 575A, that extends downward from and inward of the middle portion 575B. The second end portion 575C in this example terminates at a position substantially below the first substrate 520 and substantially vertically aligned with the first end portion 575A.

In other embodiments, the first substrate 520 can vary from the one illustrated in FIGS. 26C and 26D. The first substrate 520 can have a different shape (e.g., can be substantially or entirely flat, can have a more circular shape, can have an irregular shape, can have a more or less concave shape, can have a convex shape) and/or can have a different size. The first substrate 520 can alternatively be formed as a mono-stable flexible strip (i.e., the first substrate 520 can have one stable position, similar to a tape measure) or as a multi-stable flexible strip having more than two stable positions. The first substrate 520 can alternatively or additionally be made of one or more different materials, such as, for example, plastic, leather, or cloth. Further yet, the first substrate 520 can include a different number of apertures 568 (e.g., one aperture 568, four apertures 568), can include differently positioned apertures 568 (e.g., apertures 568 disposed near or at the end 558B), and/or can include differently constructed apertures 568 (e.g., apertures 568 having a differently shaped cross-section). Alternatively, the first substrate 520 need not include the apertures 568. The first substrate 520 can include a different number of openings 570 and/or projections 574, can include differently positioned or spaced openings 570 and/or projections 574 (e.g., openings 570 and projections 574 spaced further from the edges 566A, 566B, openings 570 and projections 574 spaced further from or closer to one another), and/or can include differently constructed openings 570 and/or projections 574. The projections 574 can, for example, take the form of tabs, hooks, knobs, bumps, or any other suitable structure(s). In one example, the projections 574 can have a substantially rectangular profile that extends substantially downward from the first substrate 520. In other examples, the projections 574 can have a profile with more or less curvature. For example, each projection 574 can have a second end portion 575C that terminates at a position inward or outward of, rather than substantially vertically aligned with, the first end portion 575A.

Figure 26E:
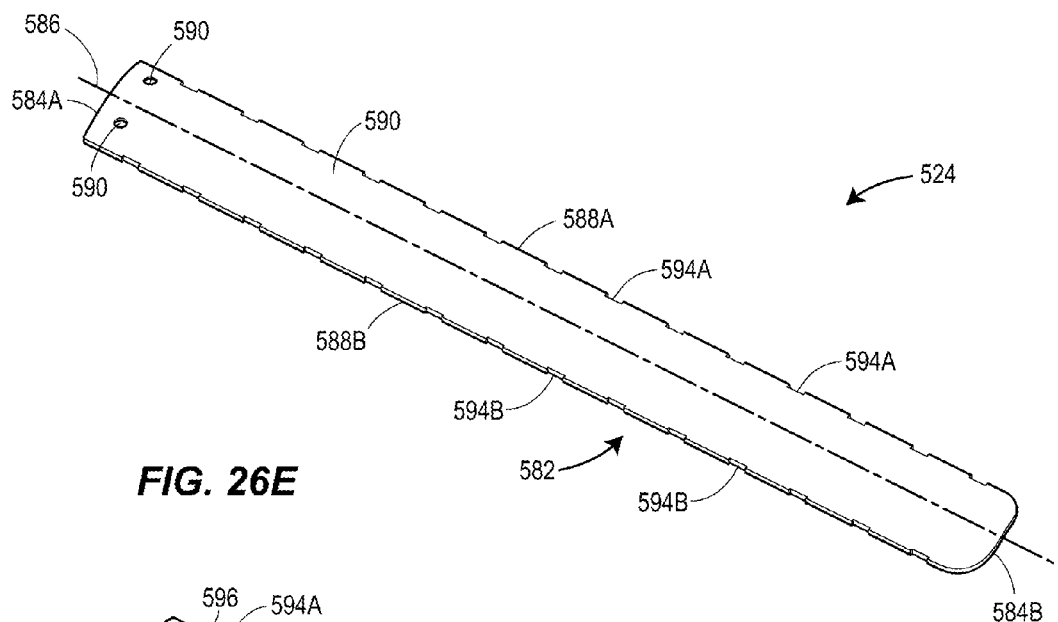
FIG. 26E is a perspective view of the second substrate of the flexible support structure illustrated in FIG. 26A.

With reference to FIG. 26E, the second substrate 524 in this example is a substantially rectangular metal (e.g., brass, aluminum, copper, steel, tin, nickel) strip that has a slightly concave shape (i.e., a large radius of curvature) and is formed as a bi-stable spring, such that the second substrate 524 may also be referred to herein as a bi-stable flexible metal strip. As illustrated in FIG. 26E, the second substrate 524 has a top side 580, a bottom side 582, a pair of opposing ends 584A, 584B, a longitudinal axis 586, and a pair of edges 588A, 588B disposed between the ends 584A, 584B and parallel to the longitudinal axis 586.

As illustrated in FIG. 26E, the first substrate 520 includes a pair of apertures 590 and a plurality of slots 594. The apertures 590 are identical in shape and size to the apertures 568 but are formed in the second substrate 524 at or proximate to the end 584A. The slots 594 are generally formed in the second substrate 524 from one end 584A of the second substrate 524 to the other end 584B of the second substrate 524. The plurality of slots 594 includes slots 594A formed in or along the edge 588A of the second substrate 524 and slots 594B formed in or along the edge 588B of the second substrate 524 across from or opposite the slots 594A. The slots 594A are evenly spaced apart from one another and the slots 594B are evenly spaced apart from one another. It will be appreciated that as the distance between the apertures 590 and the slots 594A, 594B increases, the length of the slots 594A, 594B increases. In other words, the slots 594A, 594B positioned further away from the apertures 590 generally have a greater length than the slots 594A, 594B positioned closer to the apertures 590. As will be described in greater detail below, the slots 594 generally define or correspond to the most extreme bending that will be permitted.

Figure 26F:
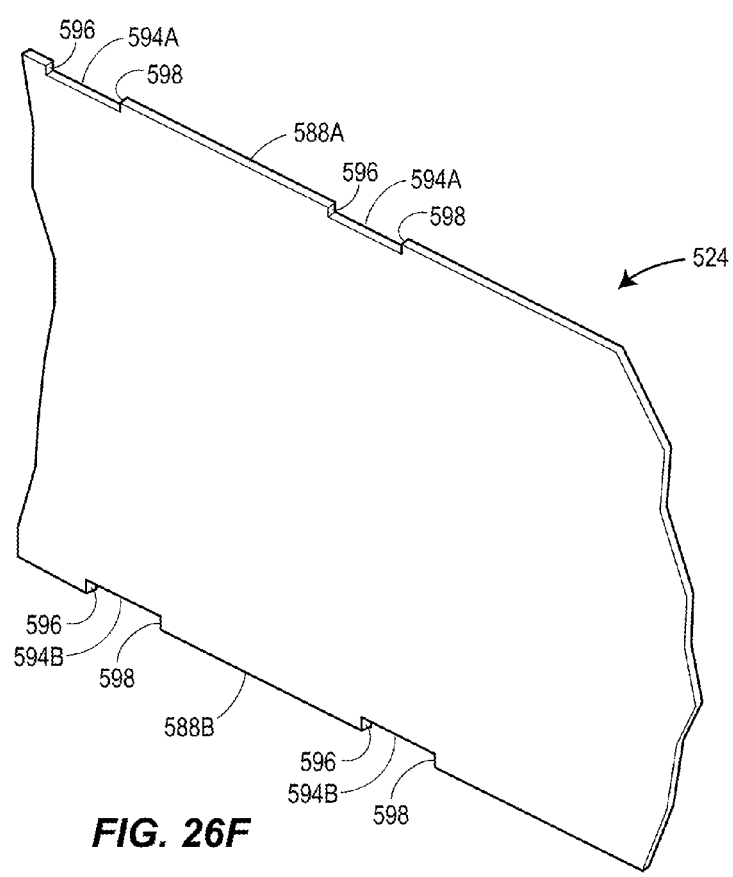
FIG. 26F is a close-up perspective view of a portion of the second substrate illustrated in FIG. 26E.

FIG. 26F is a close-up view of a portion of the second substrate 524, showing two of the slots 594A and two of the slots 594B. As depicted, each slot 594A, 594B has a rectangular-shape in cross-section and is wider than the openings 570 (i.e., larger in a direction along the longitudinal axis 586). Each slot 594A, 594B has or defines a first stop surface 596 and a second stop surface 598 opposite the first stop surface 596. The first stop surface 596 generally defines or corresponds to the most extreme bending that will be permitted in the outward direction when the article 500 is in the second or curled position (see FIG. 26B). The second stop surface 598 generally defines or corresponds to the most extreme bending that will be permitted in the inward direction when the article 500 is in the first or substantially flat position (see FIG. 26A).

In other embodiments, the second substrate 524 can vary from the one illustrated in FIGS. 26E and 26F. The second substrate 524 can have a different shape (e.g., can be substantially or entirely flat, can have a more circular shape, can have an irregular shape, can have a more or less concave shape, can have a convex shape) and/or can have a different size. In one embodiment, the second substrate 524 can take the form of one or more (e.g., two) elongated, narrow strips. The second substrate 524 can alternatively be formed as a mono-stable flexible strip (i.e., the second substrate 524 can have one stable position, similar to a tape measure) or as a multi-stable flexible strip having more than two stable positions. The second substrate 524 can alternatively or additionally be made of one or more different materials, such as, for example, plastic, leather, or cloth. Further yet, the second substrate 524 can include a different number of apertures 590 (e.g., one aperture 590, four apertures 590), can include differently positioned apertures 590 (e.g., apertures 590 disposed near or at the end 584B), and/or can include differently constructed apertures 590 (e.g., apertures 590 having a differently shaped cross-section). Alternatively, the second substrate 524 need not include the apertures 590. The second substrate 524 can include a different number of slots 594, can include differently positioned or spaced slots 594 (e.g., spaced further from the edges 588A, 588B, spaced further from or closer to one another), and/or can include differently constructed slots 594. For example, the slots 594 can take the form of openings, apertures, tracks, channels, grooves, recesses, or any other suitable structure(s). As another example, the slots 594 can be essentially identical in shape and size to the openings 570.

Figure 26G:
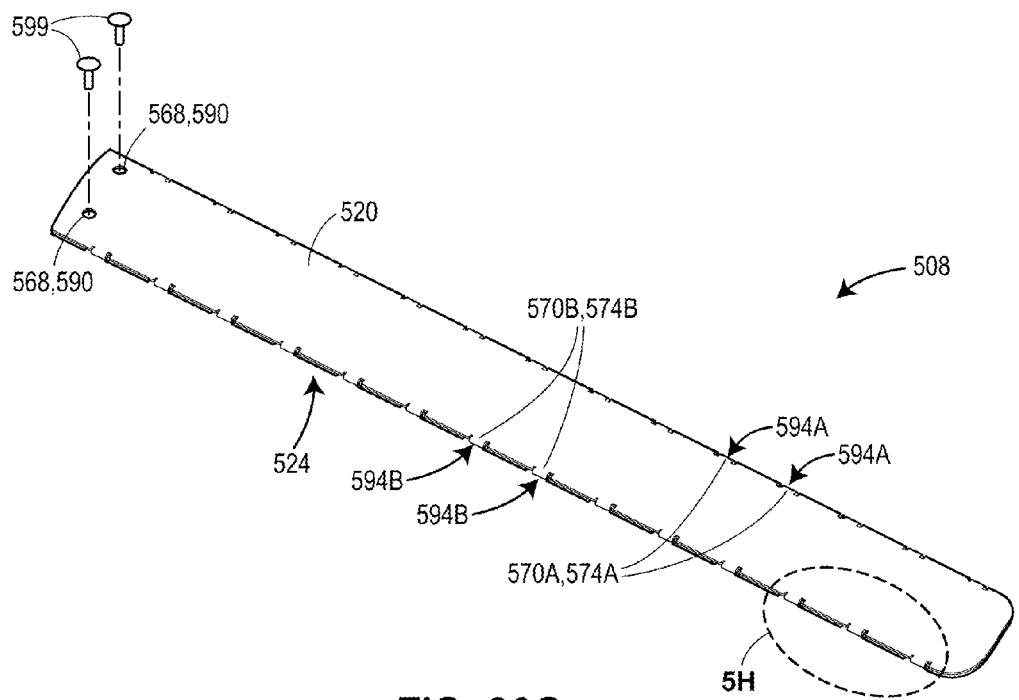
FIG. 26G is a perspective view illustrating the first substrate illustrated in FIGS. 26C and 26D and the second substrate illustrated in FIGS. 26E and 26F movably connected to form the flexible support structure illustrated in FIG. 26A.

FIG. 26G depicts the first and second substrates 520, 524 aligned with and movably connected or coupled to one another. It will be appreciated that the first and second substrates 520, 524 have a substantially similar shape and size, such that when the assembled flexible support structure 508 is viewed from the top, the second substrate 524 is substantially not visible (with the exception of the projections 574), while when the flexible support structure 508 is viewed from the bottom, the first substrate 520 is substantially not visible. In other examples, however, the first and second substrates 520, 524 need not have a substantially similar shape and/or size. For example, one of the first and second substrates 520, 524 can have the shape illustrated in FIGS. 26C-26F, while the other one of the substrates 520, 524 can have a different shape, such as, for example, a substantially or entirely flat shape. As another example, the second substrate 524 can have the shape illustrated in FIGS. 26E and 26F, while the first substrate 520 can take the form of one or more narrow, elongated strips movably coupled to the second substrate 524.

When the first and second substrates 520, 524 are substantially aligned with one another as illustrated in FIG. 26G, the apertures 568 of the first substrate 520 are aligned with the apertures 590 of the second substrate 524, and the openings 570 of the first substrate 520 are aligned with the slots 594 of the second substrate 524, such that the projections 574 of the first substrate 520 are movably disposed within the slots 594 of the second substrate 524. At least some portion of the first substrate 520 is fixedly attached to at least some portion of the second substrate 524. In this example, one end 558A of the first substrate 520 is fixedly attached to a corresponding end 584A of the second substrate 524 using or via a fastener 599 (e.g., a pin, a rivet, a screw) inserted into each of the aligned pairs of apertures 568, 590. The other ends 558B, 584B of the first and second substrates 520, 524 are thus freely movable relative to one another.

In other examples, the apertures 568, 590 can be formed or defined in different portions of the first and second substrates 520, 524, such that the first and second substrates 520, 524 can be fixedly attached to one another at different portions. For example, the apertures 568, 590 can be formed at or near the ends 558B, 584B of the first and second substrates 520, 524, respectively, such that the first and second substrates 520, 524 can be fixedly attached to one another at the ends 558B, 584B, rather than at the ends 558A, 584A. As another example, the apertures 568, 590 can be formed at or near a middle portion of the first and second substrates 520, 524, such that the first and second substrates 520, 524 can be fixedly attached to one another at or near the middle portion, rather than at the ends 558A, 584A. In other examples, the first and second substrates 520, 524 can include more or less apertures 568, 590. For example, the first substrate 520 can include one aperture 568 and the second substrate 524 can include one aperture 590, with the first and second substrates 520, 524 locally fixedly attached to one another at or via the apertures 568, 590. Further yet, the first and second substrates 520, 524 can be welded, adhered (e.g., glued), or otherwise fixedly attached to one another in a way such that the apertures 568, 590 are not necessary. For example, the apertures 568, 590 would not be necessary if the openings 570 and the apertures 590 were identical in shape and size, as the engagement between the openings 570 and the apertures 590 would serve to keep the first and second substrates 520, 524 together.

Figure 26H:
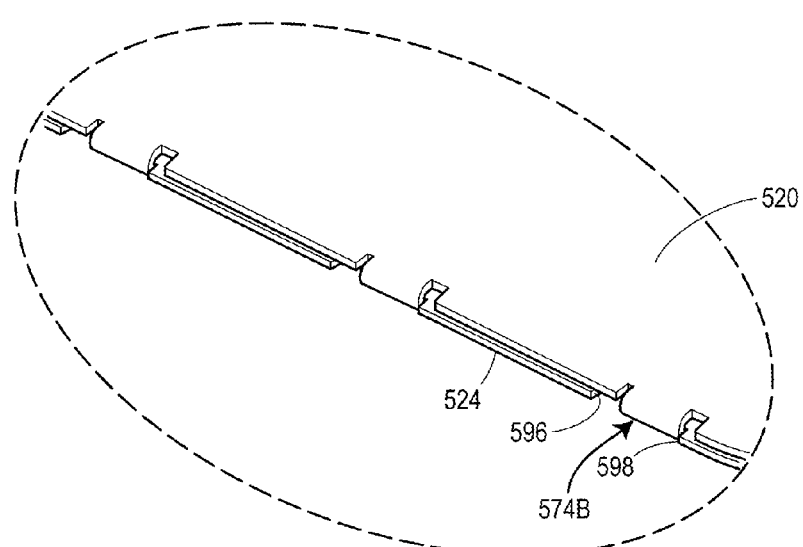
FIG. 26H is a close-up perspective view of a portion of the flexible support structure illustrated in FIG. 26G.

FIG. 26H is a close-up view of a portion of the support structure 508 illustrated in FIG. 26G. As noted above, the projections 574 of the first substrate 520 are movably disposed within the slots 594 of the second substrate 524. More specifically, as illustrated in FIG. 26H, each projection 574 is movably disposed between the first and second stop surfaces 596, 598 of a respective slot 594. Because each projection 574 has a second end portion 574C that extends below the first substrate 520, each projection 574 is configured to interferingly engage or contact the first and second stop surfaces 596, 598, as will be described below.

It will be appreciated that the first and second substrates 520, 524 can be movably connected to one another in a different manner. For example, the first substrate 520 and the second substrate 524 can be reversed, with the first substrate 520 including the slots 594 and the second substrate 524 including the projections 574 movably disposed within the slots 594. The first and second substrates 520, 524 can, in some examples, be movably connected to one another in a different location, in multiple locations, and/or using components other than the slots 594 and the projections 574 illustrated herein. Any number and/or combination of fasteners, grooves, tabs, protrusions, ribs, slots, and other components can be used for this/these purpose(s).

In any event, the flexible support 508, via the interaction between corresponding projections 574 and slots 594, can limit bending of the article 500, and, more particularly, the flexible display 204. Because the article 500 is configured for bending in the outward direction, the flexible support 508 is configured to permit some bending of the article 500, and, more particularly, the flexible display 204, in the outward direction but is configured to prevent bending of the flexible display 204 in the outward direction (indicated by the arrows $B_{OUT}$ in FIG. 26A) beyond its bending limit (e.g., beyond its minimum bending radius). At the same time, the flexible support 508 can substantially limit bending of the article 500, and, more particularly, the flexible display 204, in the inward direction (indicated by the arrows $B_{IN}$ in FIG. 26A). It will thus be appreciated that the flexible support 508 is configured to permit more bending of the article 500 in the outward direction than in the inward direction, but this need not be the case (e.g., the flexible support 508 can be configured to permit more bending in the inward direction).

Figure 26I:
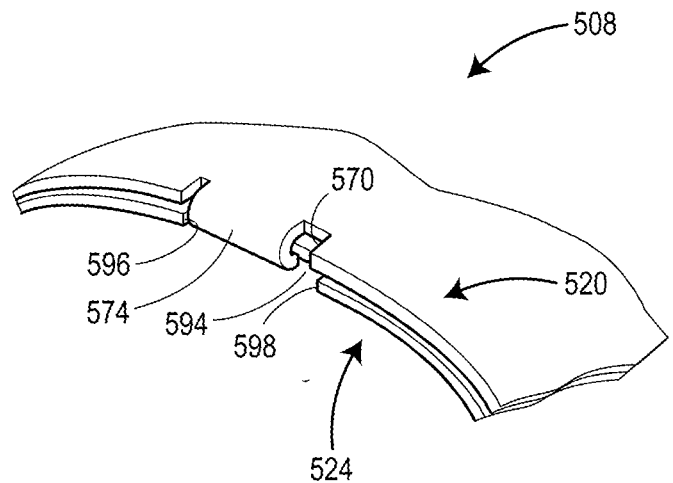
FIG. 26I is a side view of a portion of the flexible support structure illustrated in FIG. 26G bent or curved in an outward direction.

When the article 500 is in the first or substantially flat stable position (i.e., the position illustrated in FIG. 26A), and the article 500 is bent or curved in the outward direction (indicated by the arrows in FIG. 26A), the applied bending force causes the projections 574 of the first substrate 520 to move relative to the slots 594 of the second substrate 524. Specifically, the applied bending force causes each projection 574 to slide away from the second stop surface 598 and toward the first stop surface 596 of a respective slot 594. At some point, the article 500 will be bent to such a degree that each projection 574 contacts the first stop surface 596 of a respective slot 594, as depicted in FIG. 26I. At this point, the article 500 has reached its pre-defined bending limit and any further bending of the article 500, particularly the flexible display 204, in the outward direction is prevented. This position also corresponds to the second or curled stable position of the article 500 (see FIG. 26B), such that the article 500 cannot be bent or curved beyond the second stable position, though that need not be the case (e.g., a limited amount of bending can be permitted beyond the second or curled stable position).

Figure 26J:
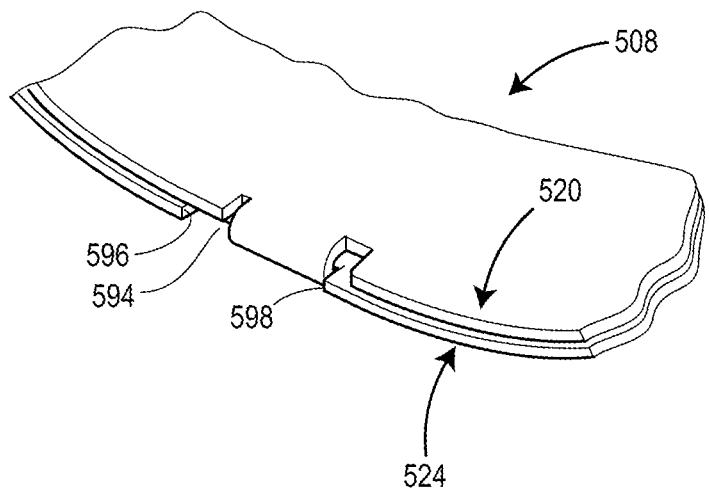
FIG. 26J is a side view of a portion of the flexible support structure illustrated in FIG. 26G bent or curved in an inward direction.

When the article 500 is in the first or substantially flat stable position (i.e., the position illustrated in FIG. 26A), and the article 500 is bent or curved in the inward direction, the applied bending force causes the projections 574 of the first substrate 520 to move relative to the slots 594 of the second substrate 524. Specifically, the applied bending force causes each projection 574 to slide away from the first stop surface 596 and toward the second stop surface 598 of a respective slot 594. At some point, the article 500 will be bent to such a degree (i.e., corresponding to the maximum bending amount in this direction) that each projection 574 contacts the second stop surface 598 of a respective slot 594, as depicted in FIG. 26J. At this point, the article 500 has reached its pre-defined bending limit and any further bending of the article 500, particularly the flexible display 204, in the inward direction is prevented.

The flexible support structure 508 can, like the flexible support structure 208, also provide torsion control. More specifically, the flexible support structure 508 can, by virtue of having two substrates 520, 524 movably connected to one another and the slots 594 and the projections 574 being positioned along or in the edges 566A, 566B and 588A, 588B, respectively, can substantially resist or prevent torsion from being applied to the longitudinal sides of the article 500, and, thus, the flexible display 204. At the very least, the flexible support structure 508 described herein will substantially reduce the amount of torsion that can be applied to the article 500, and, thus, the flexible display 204. It will be appreciated that the flexible support structure 508 can thus help to prevent the damage to the brittle layers of the flexible display 204 that would otherwise be caused by torsion applied to the article 500. It will be appreciated that the width and/or length of the projections 574 and the slots 594, and/or the spacing between the projections 574 and the slots 594 can be varied, yet the flexible support structure 508 can still provide at least some level of torsion control. In some of these cases, the width, length, and/or spacing can be varied such that the flexible support structure 508 provides less resistance to torsion, and thus permits more bending in the transverse direction.

Figure 27:
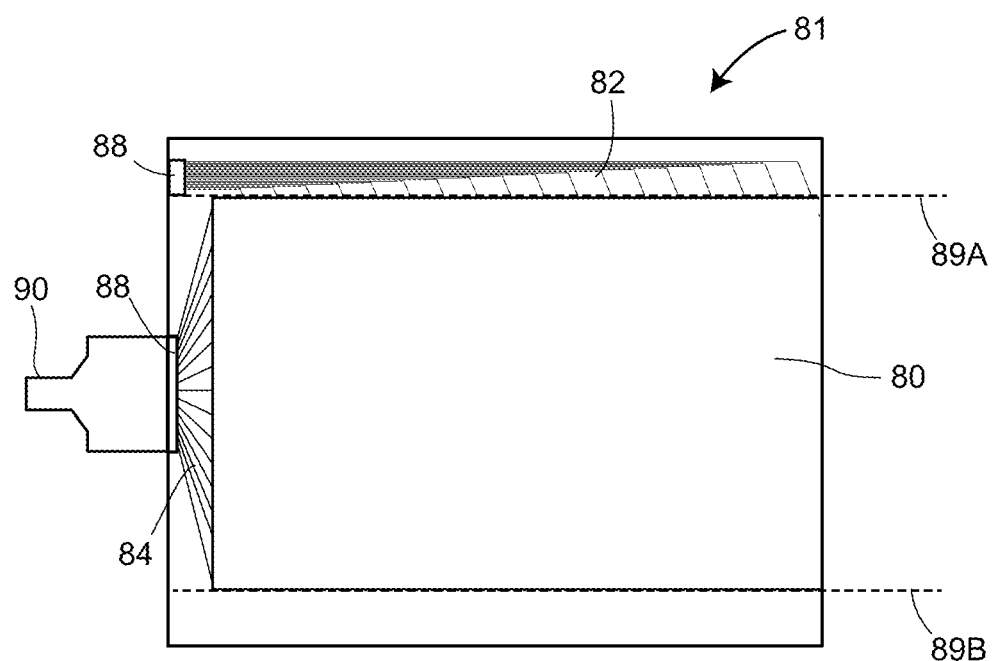
FIGS. 27 and 28 depict a manner of attaching one or more electrical connection members to the flexible electronic display in a manner that maximizes the display surface area on the flexible electronic component.

Moreover, it may be desirable to manufacture the flexible display 18 in a manner that maximizes the amount of the display area space viewable on the top layer of the device 10. In this regard, FIG. 27 illustrates a base or backplane layer of a flexible display 18 as manufactured. Generally speaking, the backplane of a flexible display 18 comprises a flat surface, or a first display substrate, and has a display area with various electrical energizing elements (e.g., transistors) formed, printed, etched or otherwise disposed thereon. As is known, the electronically energizing components on the backplane substrate of a backplane component are then operatively connected to electronically energizable components, such as organic light emitting diodes (OLEDs), encapsulated electrophoretic media (e.g., as in an e-paper display), etc., disposed on or formed on a frontplane component. Both the backplane substrate of the backplane component and the frontplane substrate of the frontplane component are flexible, and the backplane substrate and the frontplane substrate are positioned to thereby align or connect various energizing components and energizable components to form pixels on the display area. In particular, the flexible display may be made of two or more layers including a backplane display substrate on which various display elements, such as pixel elements, associated with each pixel of the display are printed, etched or otherwise manufactured in the form of, for example, transistors or other switching elements, a secondary or frontplane display substrate on which OLEDs, e-ink microcapsules or other optically energizable components that form black and white or various colors on the display for each pixel, and, in some cases a further flexible substrate layer that operates as a ground layer. In some embodiments, such as in electrophoretic displays, the frontplane and backplane are laminated together as frontplane and backplane components. In some embodiments, the flexible display may be built in layers, e.g., starting with the backplane and ending with attaching the frontplane substrate. In some embodiments, as in the case of e-paper or e-ink, the backplane and frontplane are first prepared separately and then are aligned to provide register coupling between the energizing components and the energizable components. In some embodiments, such as in the case of OLED, LCD, or electrowetting, the backplane and the frontplane are prepared so that the electro-optical material (e.g., the frontplane) is disposed directly on top of the backplane.

As illustrated in FIG. 27, the display area 80 formed on the backplane component of such a display 18 may be generally rectangular in shape and have any desired aspect ratio. The display area 80 includes any number of pixels or pixel elements, each of which may be connected to at least two lines (e.g., electrical lines, lead lines, electrodes, connecting lines or connectors) for energization thereof. The electrical lines or connecting lines are disposed at the pixel elements and exit from the display area 80 via various sides of the display area 80. Generally, each line services a particular row or column of pixel elements. As such, in FIG. 27, the connection lines are illustrated as a first set of connecting lines 82 coming from one of the longitudinal sides and including a line 82 for each of y columns of pixels of the display area 80 (e.g., a set of longitudinal connecting lines), and a second set of connecting lines 84 coming from one of the transverse sides of the display area 80 and including a line 84 for each of x rows of pixels of the display area 80 (e.g., a set of transverse connecting lines). As is known, energization or connection between a particular connecting line 82 of a column $y_n$ and a connecting line 84 of a row $x_m$ of the display area will energize or turn on that corresponding pixel, and, as such, the corresponding pixel may be referred to using its two-dimensional coordinates, e.g., $(x_m, y_n)$ or $(y_n, x_m)$. In any event, as illustrated in FIG. 27, the sets of connecting lines 82, 84 exit from the display area 80 along the same backplane substrate and are connected to one or more multiplexer or IC driving circuits 88, which may be formed, for example, on or near the edge of the backplane display substrate. The driving circuits 88 may be integral with a display driver of the electronic module 19, or the driving circuits 88 may be disposed separately from but nonetheless communicatively connected to the display driver, e.g., the driving circuits 88 may be disposed on a flexible connector 90 connecting the backplane layer to the electronics module 19. Typically, the flexible connector 90 is not integral with the backplane layer, but instead is a separate element that couples to the backplane layer to communicate with the electronics module 19 and components included therein, such as the display driver.

Figure 28:
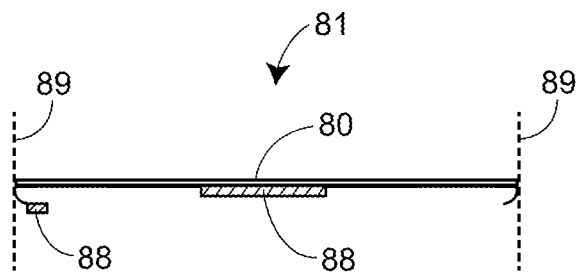

FIG. 28 illustrates a manner of folding or bending the substrate 81 of FIG. 27, to form a display that includes a maximum amount of display area 80 on the top thereof that is viewable to the user, so as to maximize the amount of area on the substrate 12 at which the display area 80 is viewable and to minimize the area of edges surrounding the display area 80 that are visible to the user. (For ease of viewing, the flexible connector 90 is not shown in FIG. 28.) In FIG. 28 in particular, the bending may occur along the dotted lines 89 so as to fold over the backplane sections adjacent to a side of the display area 80 at which the connecting lines 82 are disposed. This folding enables the connecting lines 82 to be bent down and under the display area 80, and enables the multiplexer or IC driving circuits 88 to be connected to the display driver (disposed in, for example, one of electronics module 19 not shown in FIGS. 27 and 28) via separate electronics or electrical connections. Thus, as illustrated in FIG. 28, which depicts a cross-sectional end view of the flexible display 18, the flexible display 18 so formed and bent enables the separate longitudinal display lines 82 to be connected to different multiplexer or driving IC circuits 88, which are ultimately connected to the display driver, in order to energize the rows and columns of pixel elements of the flexible display 18 to thereby drive the display 18. As the fold 89A occurs along the edge of the display area 80, the areas of the backplane substrate of the flexible display 18 that are used to form the connecting lines 82 are disposed in a different plane than, and are disposed in some cases under the display area 80, and thus do not require the backplane substrate 81 to extend out towards the sides of the substrate 12 much beyond the edges of the display area 80. This configuration, in turn, enables the maximal amount of viewable display area to be disposed on the top portion of the substrate 12 which maximizes the viewable or usable area of the substrate 12 at which the display 18 can present viewable images. In some embodiments, the backplane substrate 81 may also be bent along the dotted line 89B along the opposite longitudinal side, even if the opposite longitudinal side does not support any electrodes or connectors thereon, e.g., for ease of manufacturing and/or for aesthetic considerations. Still further, similar folds may occur on the other two sides of the display area 80 orthogonal to the folds 89A and 89B so that the electrical connections are folded on each side of the display area 80.

In some cases (for example, due to the size of the display area 80, the material composition of the flexible display 18, etc.), bending the backplane layer 81 so that the electrodes or connectors 82 are under the display area 80 may cause undesirable effects, such as interference between various electrical components of the backplane layer 81. Further, in order for the flexible display 18 to be as dynamically flexible as possible, the impact of the more rigid portions of the backplane layer 81 (e.g., the portions which support the less-flexible or rigid driving circuits 88) on the flexibility of the display area 80 is desired to be minimized. Still further, a minimum border extending from the display area 80 and viewable to a user may be necessary to seal the top and bottom layers of the flexible display 18, e.g., by using an environmental barrier material for the frontplane and backplane substrates and the seal, or by some other means. In electrophoretic displays, for instance, the required width of a border for sealing is typically around 2 to 6 mm.

As will be understood, the dynamically flexible, attachable article or device 10 as described above can be configured and operated in many different manners to perform many different functions at the same or at different times. For example, the device 10 may operate to execute any number of different types of applications including, for example, calendar applications, e-mail applications, web-browsing applications, picture, image or video display applications, stop-watch or other timing applications, alarm clock or alarming applications, location based applications including for example mapping applications, navigational applications, etc. In some cases, various different applications or functionality may be performed simultaneously, and different sections or portions of the flexible display 18 may be used to display information associated with the different applications. For example, one portion of the flexible display 18 may be used to illustrate calendar information provided by a calendar application, another portion of the flexible display 18 may be used to illustrate e-mails associated with an e-mail application and a still further portion of the flexible display 18 may be used to display a clock or stop watch associated with a timing application. Still further, applications executed on a processor within the electronics module of the device 10 may be executed on and display information computed solely with the electronics suite of the device 10. In another case, one or more applications may be executed on a processor of the device 10 to interface with and display information received from external computing devices, such as a mobile phone, a laptop computer, a desktop computer, etc. In this case, the device 10 may act as a slave display device or may operate in conjunction with information received from the external computing device to provide information, graphics, etc. to a user on the flexible display 18 of the device 10. The device 10 may communicate with external devices or an external network via any desired communication hardware, software and communications protocol, including any LAN or WAN based protocol, an NFC protocol, a Bluetooth protocol, an IP protocol, an RFID protocol, etc.

Figure 29:
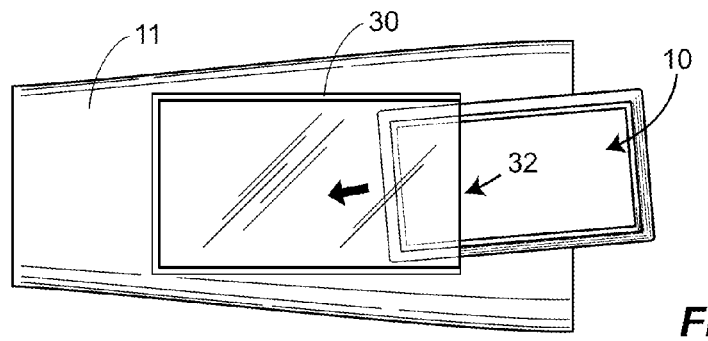
FIG. 29 illustrates an attachable flexible electronic component of FIGS. 3 and 4 mounted to an armband sleeve using a pocket.

The attachable device 10 may be connected to the sleeve 11 of FIG. 1 in any desired manner, but is preferably connected to the sleeve 11 in a manner that enables the device 10 to flex in or along two dimensions when attached to the sleeve 11. In one example, the exterior surface of the sleeve 11 may include a hook or a loop material thereon which mates with or interacts with a hook or loop material disposed on the bottom of the substrate or support 12. The sleeve 11 may then be stretched and placed around a user's arm and the device 10 may be connected to the sleeve 9 via the hook and loop materials. In other cases, snaps, ties, or other connection structure may be used. In a still further case, as illustrated in FIG. 29, the sleeve 11 may include a pocket 30 attached thereto having an interior cavity into which the device 10 can be inserted. FIG. 29 illustrates the device 10 being inserted into an opening 32 on one side of the pocket 30. The pocket 30 is preferably slightly bigger than the device 10 but is made of a material that applies pressure to the top of the device 10 when the device 10 is inserted into the pocket 30 to cause the device 10 to conform to the shape of the user's arm. The upper surface of the pocket 30 is preferably transparent or see-through in nature and thus may be made of plastic or other see-through material. In other cases, the pocket 30 may not have an upper surface that goes over the display 18 of the device 10, but instead may hold the device 10 within the pocket 30 using structure at the edges of the pocket 30 which contact and retain the edges of the device 10, to thereby prevent the pocket 30 from blocking the display 18 when the device 10 is inserted into the pocket 30.

If desired, the device 10 may only include the flexible display 18, with the support 12 instead being incorporated into the sleeve 11. The support 12 can be incorporated into the sleeve 11 in any desired manner. The support 12 can, for example, be removably coupled to the sleeve 11 via a hook and a loop material disposed thereon which mates with or interacts with a hook or loop material disposed on the bottom of the support 12. In other examples, the support 12 can be fixedly coupled to the sleeve 11 via, for example, an adhesive. The device 10 can then be connected to the support 12, and thus the sleeve 11, in any desired manner, but preferably in a manner that enables the device 10 to flex in or along two dimensions when attached to the sleeve 11. The device 10 can be connected to the support 12 in a similar manner as described above or in some other manner.

Figure 30:
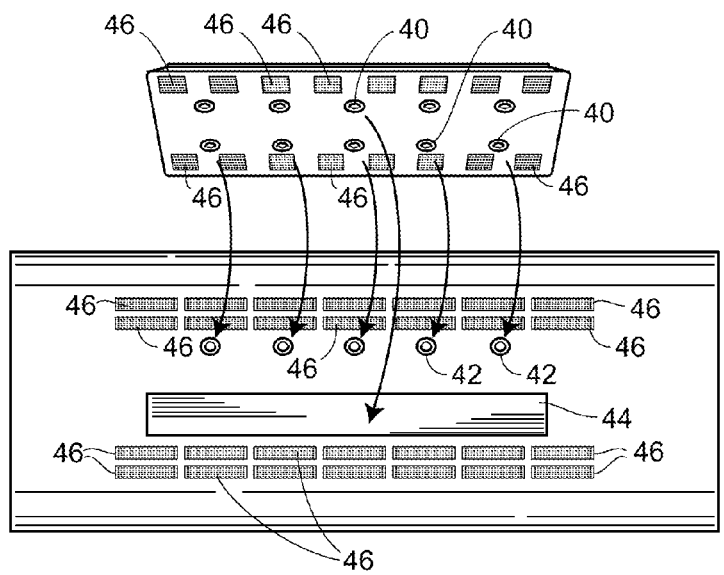
FIG. 30 illustrates an armband sleeve having metal disks and a metal strip therein that mate with sensor elements mounted on or in the flexible substrate of a flexible electronic component.

FIG. 30 illustrates a manner of enabling one or more sensors or sensor elements 40 within the device 10 to come into contact with the user's skin when the device 10 is mounted on the sleeve 11, as might be necessary in some situations, such as to measure the temperature of the user's skin, resistivity of the user's skin or body, pressure, heart rate, etc. of the user. In this case, the sleeve 11 includes one or more disks 42, preferably metal disks, and/or one or more strips 44, preferably metal strips, sewn or disposed therein such that one side of the disks 42 or strips 44 contacts the user's skin when the sleeve 11 is disposed on the user's arm, for example, and such that the other side of the disks 42 or strip 44 faces upwardly. For example, the one or more disks 42 and/or one or more strips 44 can be part of a flex circuit harness disposed within the sleeve 11. This flex circuit harness can be ultra-flexible but can also include contact points, electrical wiring facilitate current conduction and one or more holes to increase its mechanical flexibility. Moreover, as illustrated in FIG. 30, the substrate 12 includes one or more sensor elements 40 disposed on the bottom thereof so that, when the substrate 12 is placed onto the sleeve 11, one or more of the sensor elements 40 come into contact with the upper surface of one or more of the disks 42 or the strip 44. The sensor elements 40 may be metal or other types of disks (as shown) or strips or plates (not shown) that are connected to a sensor or that may be part of sensors themselves. Likewise, to ensure proper alignment between a sensor element 40 and a disk 42 or a strip 44 in the sleeve 11, the disks 42 and/or strips 44 may be larger in surface area than the sensor elements 40 on the support or substrate 12. Additionally, it may be that multiple sensor elements 40 are provided for a single sensor to ensure that one of the sensor elements aligns with one of the disks 42 or the strip 44 when the device 10 is disposed on the sleeve 11. On the other hand, there may be multiple disks 42 or strips 44 disposed on the sleeve 11 for any particular sensor element 40 to ensure or to increase the likelihood that the sensor element 40 aligns with disk 42 or strip 44. Of course, the sensor elements 40 and the disks 42 and strips 44 can take on any shape and be made any size to help assure alignment. Moreover, FIG. 30 illustrates the device 10 being mountable to or attachable to the sleeve 11 using strips of hook and loop material 46 at various locations. These hook and loop materials 46 could of course be placed in different positions on the sleeve 11 and on the bottom of the substrate 12 and could be any size or shape. Additionally, any number or configuration of hook and loop material strips or patches could be used on either or both of the bottom of the substrate 12 and the outer surface of the sleeve 11 to maximize alignment between these materials on the sleeve 11 and the device 10. Of course, other types of connections mechanisms, besides hook and loop material, could be used to provide a connection between the device 10 and the sleeve 11.

Figure 31:
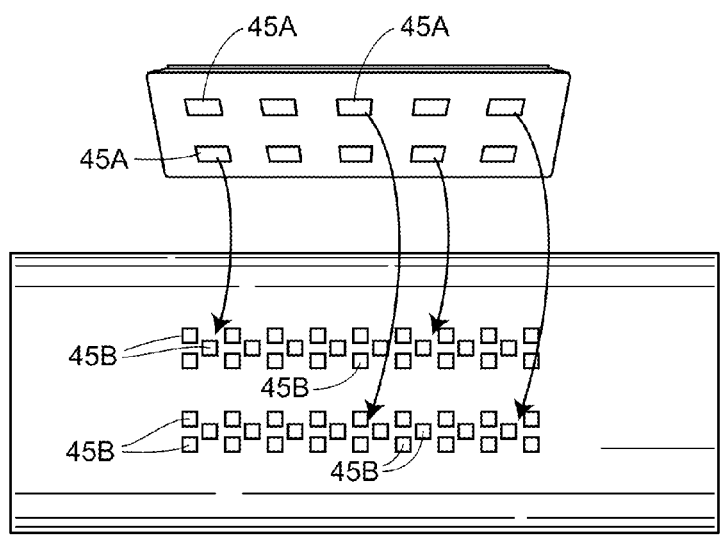
FIG. 31 illustrates an armband sleeve and a flexible electronic component having magnets disposed therein that interact to attach the flexible electronic component to the sleeve during use.

As an example, one type of connection mechanism that may be used to connect the device 10 to the sleeve 11 includes magnets and/or magnetic materials disposed within the sleeve 11 and the substrate 12. As illustrated in FIG. 31, the connection structure may be in the form of magnetic materials 45A and 45B disposed in or on each of the substrate 12 and the sleeve 11, wherein the materials 45A and 45B operate, when in close proximity to one another, to hold the substrate 12 onto the sleeve 11. The magnetic materials 45A and 45B can each be a permanent magnet, or one of the materials 45A or 45B could be a permanent magnet while the other material 45A or 45B could be a magnetically permeable material, such as many kinds of metal. The magnetic materials 45A and 45B can be disposed at the ends of the substrate 12 and at corresponding locations on the sleeve 11 so that the ends of the substrate 12 attach to the sleeve 11. However, magnetic materials may be spaced throughout or along the bottom surface of the substrate 12 and register with corresponding magnetic materials on the sleeve 11 to enable the entire device 10 to be connected in a secure manner to the sleeve 11 during use. In one case, the sleeve 11 may have a metal or magnetic material mesh therein to assure alignment with magnets in the substrate 12.

Figure 32:
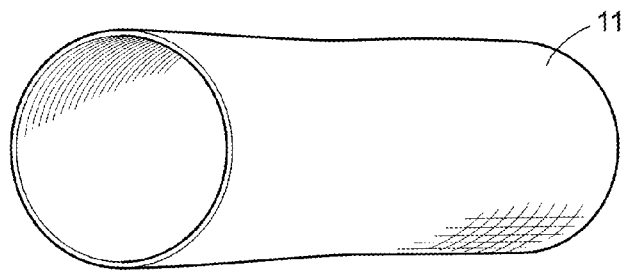
FIG. 32 illustrates a stretchable or expandable sleeve formed as a single continuous piece of material to which the flexible electronic component of FIGS. 3 and 4 can be mounted.
Figure 33:
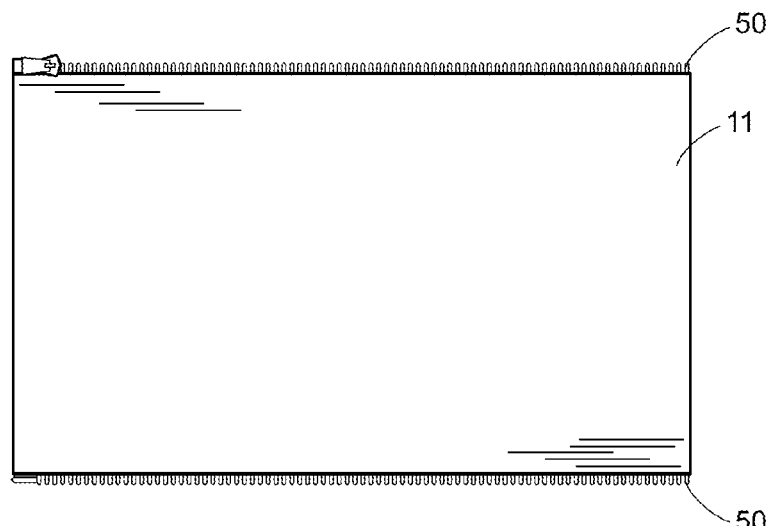
FIG. 33 illustrates a closable sleeve having zipper components attached to opposite ends thereof to enable the sleeve to be mounted on or around a user's arm, leg, or torso.
Figure 34:
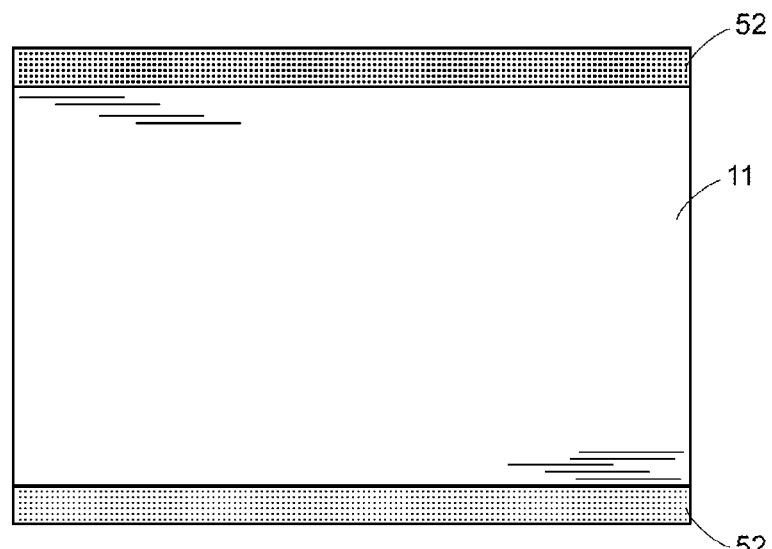
FIG. 34 illustrates a closable sleeve having components of a hook and loop material attached to opposite ends thereof to enable the sleeve to be mounted around a user's arm, leg, or torso.

Additionally, FIGS. 32-34 illustrate different manners in which the sleeve 11 can be constructed. As illustrated in FIG. 32, the sleeve 11 can be made of a continuous piece of material, such as neoprene or any other stretchable material, that can be slid onto a user's arm, leg, torso, etc., and which may stretch at different locations to conform to the user's body surface. As indicated above, the sleeve 11 may incorporate metal strips, metal disks or mesh metal or metallic materials (not shown in FIG. 32) to mate with the sensors or magnets on the support 12 to thereby enable the support 12 to be mounted on the sleeve 11. Of course, the device 10 may be attached to the sleeve 11 of FIG. 32 in any of the manners described above.

In other cases, such as illustrated in FIGS. 33 and 34, the sleeve 11 may be formed as a flat or single piece of material with connectors on opposite ends thereof which enable the ends of the sleeve 11 to be attached around an arm, a leg, a torso, etc. As an example, FIG. 33 illustrates a sleeve 11 with zipper components 50 attached to opposite sides of the sleeve 11, while FIG. 34 illustrates a sleeve 11 with hook and loop material 52 attached to opposite sides of the sleeve 11. Of course, other types of connections structure could be mounted on the opposites sides of the sleeve 11 to enable the opposite ends of the sleeve 11 to be connected together, instead of or in addition to that shown in FIGS. 33 and 34, including, for example, snaps, hooks, magnets, buttons, etc.

Figure 35:
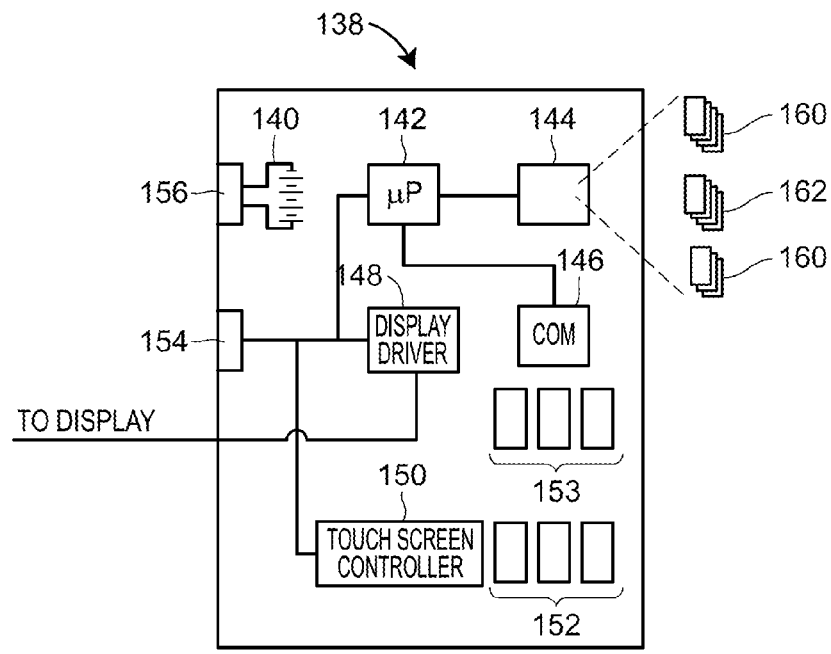
FIG. 35 depicts a block diagram of an electronics module associated with the attachable articles described herein.

FIG. 35 illustrates a block diagram of various electronic components, referred to herein as an electronics suite 138, that may be used in or disposed in the electronics module 19 of any of the attachable articles 10 described herein to drive the flexible display 18 of the dynamically flexible, attachable article or device 10. In particular, the electronics suite 138 illustrated in FIG. 35 includes a battery 140 that powers a number of other modules or electronic components including a microprocessor or other processor 142, a computer readable memory 144, which may be, for example, a flash memory or other suitable type of non-transitory, tangible, data storage medium, a communication module 146, a display driver 148, a touch screen controller 150 and a number of sensors 152 and other secondary devices 153. The sensors 152 may include any number of any number of types of sensors, such as strain gauges, gyroscopes, accelerometers, compression sensors, tensional strain sensors, positional sensors, motion or movement sensors, pressure sensors, vibration sensors, temperature sensors, orientation sensors, gravity sensors, light sensors, pulse rate monitors, and piezoelectric sensors, to name but a few. The secondary electronic devices 153 may include, for example, an alarm or noise creation device, a speaker, a microphone, a vibrator the operation of which causes the electronics module 19 to vibrate, etc. Although FIG. 35 illustrates the sensors 152 and the secondary electronic devices 153 as being integral with the electronics suite 138, in some cases, one or more of the sensors 152 and/or the secondary electronic devices 153 may be physically disposed at one or more other locations in the substrate 12 separate from the remainder of the electronics suite 138. In these cases, though, the separately disposed sensors 152 and/or secondary electronic devices 153 remain in communicative connection with the remainder of the electronics suite 138 (e.g., via a wired or wireless connection).

Similarly, although FIG. 35 illustrates the display driver 148 as being integral with the electronics suite 138, in some cases, the display driver 148 is physically disposed at another location separate from the remainder of the electronics suite 138. In an example, the display driver 148 is disposed in a location that is proximate to the electrodes or connectors of the pixel elements of the flexible electronic display 18, e.g., on the backplane of the flexible display 18 or at some other suitable location. The separately located display driver 148, though, remains in communicative connection with the remainder of the electronics suite 138 (e.g., via a wired or wireless connection) despite of the remote locations.

As will be understood, the memory 144, the communication module 146, the display driver 148 and the touch screen controller 150, as well as the sensors 152 and other secondary electronic devices 153, are communicatively connected to the processor 142 and may operate to perform various functions in conjunction with applications or other programs implemented by the processor 142. Still further, each of these elements is connected to and is powered by the battery 140 in any known or desired manner. Still further, the electronics suite 138 of FIG. 35 may include one or more communication ports, such as communication port 154 (e.g., a USB or other type of digital communication port) and a power or battery charger input port 156. In this case, the power input port 156 may be connected to the battery 140 and enable charging or recharging of the battery 140 using any known or desired recharging circuitry and methodology. Alternatively or in addition, the communications input port 154 (in the form of for example, a USB input port) may be connected to the battery 140 and provide power to the battery 140 for charging the battery 140, and the input port 154 may also be connected to the microprocessor 142, as well as to the communication circuit module 146, for performing wired-based communications via the input port 154. Of course, the communication input port 154, while being illustrated as a USB-type connection, could any other type of known wired or physical communication connection, including any desired serial or parallel digital communication port using any number of pins or wires, as is known in the art, an analog communication port, etc. Additionally or alternatively, the input port 154 may include a wireless input port for performing wireless communications.

In an embodiment, the power input port 156 may be a wireless input port for powering the article 10, and in this case, for example, may be part of a battery charger unit that operates to charge the battery 140 using, for example, an inductively coupled charging technique. If the battery charger unit is part of an inductively coupled charging system, it generally responds to electromagnetic waves produced by an exterior charging unit (not shown) to charge the battery 140 when the attachable article 10 is disposed near the external charging unit. In another case, the battery charger of the input port 156 may be a kinetic energy charger unit that converts motion of the device 10 (such as that associated with movement of an arm when the attachable electronic device 10 is used in conjunction with an armband) into electrical energy which is provided to charge the battery 140.

As will be understood, the processor 142, which may be a programmable, general-purpose processor or a specially programmed processor programmed using any desired type of hardware or firmware programming, generally coordinates and implements the operation of the display 18 and the associated electronic components as described in more detail herein. The computer readable memory 144 stores various applications, including for example the general operating system implemented by the processor 142, and various applications (illustrated as a set of applications 160 in FIG. 35) to be executed on the processor 142 to implement various different types of functionality via the device 10, some of which are described herein. The memory 144 may also store one or more data files 162, which may be, for example, image or video data files associated with various images to be displayed on the screen of the display 18 at various different times. Still further, the memory 144 may store application data that may be created by the various applications 160 or the microprocessor 142 as part of the operation of various applications 160 and to be used by those applications 160 either during runtime of the applications 160 or at other times. If desired, the microprocessor 142 or one of the secondary electronic components 153 may include or be a clock that tracks the current time, day, date, month, year, time zone, etc.

As an example, one or more of the applications 160 may implement various functionalities typically associated with standard computers or other types of electronic devices such as personal handheld electronic devices, including for example an e-mail application, an Internet or web-browsing application, an alarm clock application, a calendar application, a music-playing application such as an MP3 application, a video application, a digital picture slideshow application, a mapping application, an e-reading application which may provide books, notes, magazines or other types of articles, for reading by the user, etc. Still further, one or more of the applications 160 may operate on the processor 142 to turn the display 18 associated with the dynamically flexible, attachable device 10 into a slave display device that may be tied to or communicably coupled to an exterior master device that is generating content to be displayed via the flexible display 18. The master device, which may be a smart phone or a nearby computer device, may be wirelessly connected to the electronics suite 138 to provide content to be displayed on the flexible display 18 and will typically have more memory, and computing and processing power than the processor 142.

The communication module 146 of FIG. 35 may include or use any type of communication hardware/software/firmware that uses any desired types of communication techniques to enable the microprocessor 142 to communicate with exterior devices or sources. Of course, the communication module 146 could include multiple different types of communication hardware/software/firmware, including any kind of hardwire-based communication module or wireless-based communication module. As examples, the communication module 146 may be a wired or wireless Internet-based communication module that may provide wired or wireless-based, IP protocol communications between the dynamically flexible, attachable article or device 10 and other devices or a communication network such as a LAN or a WAN to which other devices and/or sensors are communicatively connected. Likewise, the communication module 46 may include a near field communications (NFC) module, a radio frequency identification (RFID) communications module for communicating with, sending messages to and/or receiving messages from RFID tags stored in other devices around or close to the device 10. In this case, the communications module 146 may decode signals received from RFID tags in response to pings by the RFID communication module 146 to identify the RFID tags or tag numbers (identifiers) associated with these devices. Likewise, the communication module 146 may be a near field communication (NFC) module or a Bluetooth communication module, which may perform near field communications or Bluetooth communications in any known or desired manner with nearby NFC or Bluetooth enabled devices, thereby enabling wireless communication between the device 10 and other closely situated or closely located electronic devices. Still further, the communications module 146 may include a USB or other type of wired communication module for decoding and encoding USB-based communication signals to be sent out and received via the USB communication port 154.

As illustrated in FIG. 35, the display driver 148 is coupled to the microprocessor 142 and to the display 18, and drives the display 18 to present different images to a user and thus implement functionality via the display 18. The display driver 148 may be associated with or use any type of display driver technology associated with the various different types of flexible displays that might be used, including, for example, e-ink or other bi-stable display drivers, organic light emitting diode (OLED) display drivers, etc. Of course, it will be understood that the display driver 148 is connected to the various pixel elements or pixels of the flexible display 18 to cause the pixel elements to change their visual appearance so as to present content image on the flexible display 18. Typically, but not necessarily, each pixel element is communicatively connected to two electrodes, lead lines, connecting lines, or connectors corresponding the (x, y) coordinates of the particular pixel element on the flexible display 18. Thus, the display driver 148 provides image content (e.g., by using electrical signals or other suitable signals) to a set of connecting lines corresponding to a width of the flexible display 18 or its display area (and, in some cases, physically emanating from a width edge or transverse side of the flexible display 18 to the driver 148), and the same display driver 148 may provide image content (e.g., by using electrical signals or other suitable signals) to another set of connecting lines corresponding to a length of the flexible display 18 (and, in some cases, physically emanating from a length edge or longitudinal side of the flexible display 18 to connect to the driver 148). In an example, the display driver 148 provides image content to a set of transverse connecting lines and/or to a set of longitudinal connecting lines so that image content is presented on the display area of the flexible display. In an example, the article 10 includes multiple display drivers 148, each of which provides image content to a respective set of connecting lines.

Returning to FIG. 35, the display driver 148 illuminates or causes the pixel elements to obtain or reach a color, a lighting level, an on-off state, etc., so as to drive the display 18 to present various images and other functionality as determined by the particular application 160 being executed on the microprocessor 142. In some cases, the display driver 148 may cause various images, such as one or more artistic renditions, patterns, etc., or other types of images stored in the memory 144 (such as one of the images 162) to be displayed on the flexible display 18. Such an image may be any type of graphic element in the form of artwork, an indication of an association of the user with a particular university or other organization, such as a logo, a mascot, an icon, etc. In the case of a static display, and particularly when the flexible display 18 is a bi-stable type of flexible display, such as an e-ink type of display, the display 18 might display a particular image or background image whenever the device 10 is in a sleep mode, and thus operates to present an image when the display driver 48 is not operating to actively drive the display 18.

Of course, the touch screen controller 150 is connected to a touch screen interface 26, if such an interface exists, and receives input signals from the touch screen interface 26. The controller 150 operates to decode these input signals to identify touch events that occur with respect to the touch screen interface 26. The touch screen interface 26 may be a capacitive touch screen interface or any other suitable type of touch screen interface disposed over the flexible display 18, and may be transparent in nature to thus enable the pixel elements of the display 18 to be viewable through the touch screen interface 26. Of course, other types of touch screen interfaces may be used instead or as well. In any event, the touch screen controller 150 operates to energize and control the touch screen interface 26, as well as to recognize and decode touch screen events to identify, for example, the location of each touch screen event, a type of a touch screen event, such as a tap or a swipe movement, etc. If desired, the touch screen controller 150 alone or in conjunction with the processor 142 may operate to determine or recognize gestures that are input via the touch screen interface 26, such gestures being, for example, a slide, a swipe, a multi-finger pinch or any other type of gesture that includes one or more finger movements coordinated with one another. Each such gesture may indicate an action to be taken on or via the device 10. Of course, the dynamically flexible, attachable article or device 10 may include other or different types of user input devices configured to detect user-generated gestures, such as interfaces that include buttons switches, roller balls, slide bars, pressure sensors, strain gauges, etc., disposed on, for example, the substrate 12. Such user interfaces may enable the user to perform more rudimentary functions, such as scrolling movements, on-off powering movements, mode switching, etc., that are traditionally entered via actuate-able buttons or switches. In one case, the processor may determine, based on input from the user via the touchscreen, such as with a set up program, a calibration program or a stored user preference, whether the device 10 is disposed on a left arm or a right arm of a user and thus determine the relative positioning or orientation of images to be displayed on the electronic display 18 so that they are best viewable by the user.

As previously discussed, the sensors 152 may include any of various different types of sensors. In an embodiment, the sensors 152 may include one or more gyroscopes which detect movement of or the orientation of the substrate 12, rapid shaking of the substrate 12, etc. One or more of these types of movements may be considered to be a particular type of input or user input, such as a gesture to reset the device 10, to change a mode of the device 10, etc. Likewise, the output of such gyroscopes can be used by the microprocessor 142 to determine the orientation or direction of the flexible display 18 to enable the microprocessor 142, or an application 160 executed on the microprocessor 142, to determine the proper orientation of the image to be displayed on the flexible display 18. In some instances, such motion detection and position detection devices might be located in the substrate 12 or in the electronics modules 19, to enable the device 10 to more accurately determine whether the device 10 is oriented around an arm or other circular member or whether it is instead laid out flat or oriented in some other manner. The microprocessor 142 or an application executed thereon may change functionality, behavior, and/or actions of the device 10 based on the detected orientation of the substrate 12.

In some cases, the sensors 152 include one or more pressure or force sensors and/or strain gauges which detect pressure, strain, or similar forces that are considered to be an input to cause the functionality, behavior, and/or actions of the device 10 to change, e.g., reset the device 10, change a mode of the device 10, change a presentation displayed on the flexible display 18 of the device 10, etc.

In some cases, the sensors 152 may include step counters or an impact-sensor, such as an accelerometer, which might be used to count the number of steps a user takes over a particular period time. Alternatively or in addition, the sensors 152 may include one or more temperature sensors, which may detect the ambient temperature, the temperature of the skin of the user when the device 10 is being worn, etc. The sensors 152 could also include a blood-pressure or heart-rate sensor device, which might check blood pressure or heart rate using known exterior blood-pressure or heart-rate sensor device technology.

As will be understood, the various different electronic devices or components disposed in or shown in the electronic suite 138 of FIG. 35 may be used in conjunction with one another in various different manners to provide a whole host of functionality for the dynamically flexible, attachable article or device 10, which might be beneficial in various different uses of that article. However, only some of these uses are described in detail herein.

In a general sense, the flexible display 18 of any or all of the embodiments described herein may be manufactured as any type of flexible display, such as an e-paper display, an organic light emitting diode (OLED) display, etc. and this flexible display, once manufactured, may then be formed, curved or bent in various manners. Generally speaking, flexible display 18 may be made of two flexible substrates including a backplane flexible substrate and frontplane flexible substrate that are placed back to back, next to one another, laminated onto each other, or prepared so that the frontplane is directly disposed on the backplane. In the case of e-paper, an additional layer of material such as an adhesive may be included in the frontplane and disposed between the backplane and the frontplane. In some cases, such as with the use of active-matrix OLEDs, electrophoretic displays (EPDs), e-paper, electronic ink displays, e-reader displays, liquid-crystal displays (LCDs), or other active-matrix type displays, the backplane includes a plurality of semiconductor devices or elements, e.g., an array of transistors and/or other elements, disposed thereon for driving or providing energization to individual lighting, transmitting, or reflective elements disposed in a similar array on the frontplane or on top of the transistors and/or other elements. The semiconductor devices or elements may be formed on the backplane in any known or desired manner, such as by etching, dye cut forming, printing, sputtering, spin-coating, spray coating, other deposition or patterning techniques, or combinations thereof, etc. Likewise, the light emitting, transmitting, or reflective elements may be formed as any desired types of light emitting, transmitting, or reflective elements using these same or different techniques, and the elements may include light emitting diodes (LEDs), OLEDs, e-paper, liquid crystal, etc. In the case of e-paper, for example, the frontplane and the backplane may be formed with black and white, oppositely charged particles suspended in a clear fluid which, when put in an electric field, will cause the black or the white particles to drift to the top of the display to create a white state, a black state, or an intermediate grey state. In any case, the substrate of the backplane and the frontplane may be formed of the same material or of a different flexible material, such as plastic or flexible glass, and these materials may have the same or different flexibility properties, as long as both materials are able to flex to the curvature needed for bending the electronic display 18.

More particularly, the flexible displays illustrated herein, may be manufactured as a flexible display, such as an e-paper display, an organic light emitting diode (OLED) display, etc. Generally speaking, the flexible displays may be constructed on two flexible substrates, or may be constructed on one flexible substrate but having at least two flexible substrates. The flexible substrates may include a backplane display area and frontplane display area placed back to back, next to one another, or laminated onto each other. The frontplane display area comprises an array of optic elements (e.g., electro-optic elements) provided on a first flexible substrate that are capable of displaying an image, while the backplane display area comprises an array of semiconductor devices or elements (e.g., transistor elements) provided on a second flexible substrate for driving or providing energization to the optic elements on the frontplane. Materials suitable for use as the flexible substrate for either the frontplane and/or the backplane include, but are not limited to, various plastic substrates such as polyimide, polyethylene terephthalate (PET), polycarbonate, polyethersulfone, polyether ether ketone (PEEK), and polyethylene naphthalate (PEN). Metallic foils or flexible glass also may be used.

Preferably, the backplane display area comprises an array of thin film transistors (TFTs) provided on a flexible, plastic substrate such as PET. The TFT array may include switching and/or driving TFTs, and additional elements such as storage capacitors, and interconnect wiring. An individual TFT element generally is made by successive deposition and patterning of conductor (i.e., source, drain, and gate electrodes), insulator (i.e., dielectric) and semiconductor thin film layers. The active semiconductor layer can be composed of either organic (small-molecule or polymeric semiconductors) or inorganic materials (such as amorphous silicon, low-temperature polycrystalline silicon, graphene, carbon nanotube, and metal oxide semiconductors).

The TFT array may preferably comprise organic TFTs (OTFTs) based upon an organic semiconductor described in at least one of U.S. Pat. No. 6,585,914; U.S. Pat. No. 6,608,323; U.S. Pat. No. 6,991,749; U.S. Pat. No. 7,374,702; U.S. Pat. No. 7,528,176; U.S. Pat. No. 7,569,693; U.S. Pat. No. 7,605,225; U.S. Pat. No. 7,671,202; U.S. Pat. No.

7,816,480; U.S. Pat. No. 7,842,198; U.S. Pat. No. 7,892,454; U.S. Pat. No. 7,893,265; U.S. Pat. No. 7,902,363; U.S. Pat. No. 7,947,837; U.S. Pat. No. 7,982,039; U.S. Pat. No. 8,022,214; U.S. Pat. No. 8,329,855; U.S. Pat. No. 8,404,844; U.S. Pat. No. 8,440,828; U.S. Patent Publication No. 2010/0252112; U.S. Patent Publication No. 2010/0283047; U.S. Patent Publication No. 2010/0326527; U.S. Patent Publication No. 2011/0120558; U.S. Patent Publication No. 2011/0136333; and U.S. Patent Publication No. 2013/0062598, the disclosure of each of which is incorporated by reference herein in its entirety for all purposes. While OTFTs may include metallic contacts and a dielectric layer composed of silicon oxide ($SiO_2$) or another inorganic oxide or nitride (such as $Al_2O_3$, $HfO_2$, $SiO_2$, or $Si_3N_4$), a dielectric layer composed of an electrically insulating polymer may be preferred. Exemplary polymeric dielectric materials include polyacrylates, polyimides, polyvinyl alcohol, polystyrene, polyester, polycarbonate, polyhaloethylene, epoxy resins, siloxane polymers, benzocyclobutene-based polymers. Other polymeric dielectrics are described in U.S. Pat. No. 7,605,394; U.S. Pat. No. 7,981,989; U.S. Pat. No. 8,093,588; U.S. Pat. No. 8,274,075; U.S. Pat. No. 8,338,555; U.S. Patent Publication No. 2011/0175089; U.S. Patent Publication No. 2011/0215334; and U.S. Patent Publication No. 2012/0068314. Conductive polymers such as poly(3,4-ethylenedioxythiophene) poly(styrenesulfonate) (PEDOT:PSS) may be used as alternative materials for metallic contacts in OTFTs.

Preferably, the TFT array may comprise metal oxide TFTs based upon a metal oxide semiconductor. For example, the metal oxide semiconductor can be selected from various mixed oxides including one or more of indium, zinc, tin, and gallium such as indium zinc oxide (IZO), zinc tin oxide (ZTO), indium gallium oxide (IGO), and indium gallium zinc oxide (IGZO). In a more preferred embodiment, the TFT array may comprise IGZO TFTs. While state-of-the art IGZO TFTs usually include thick layers of inorganic materials such as $SiO_2$, $SiO_x$, $Si_3N_4$, and $SiO_xN_y$ as dielectric and passivation layers, it is preferred that if the TFT array backplane comprises metal oxide TFTs, organic materials are used in at least some of the dielectric and passivation layers, such that the thickness of the remaining inorganic layer(s) may be reduced to allow maximum flexibility of the TFT array as whole. Metal oxide TFTs incorporating one or more organic layers are described in U.S. Pat. No. 8,017,458; U.S. Pat. No. 8,097,877; U.S. Pat. No. 8,395,150; and U.S. Patent Publication No. 2012/0223314, the disclosure of each of which is incorporated by reference herein in its entirety for all purposes.

In some scenarios, such as for an electrophoretic or e-reader display, the frontplane display area may be laminated, sealed to, or otherwise secured onto the backplane display area. The frontplane display area may be produced by forming a subassembly that comprises, in sequence, a flexible substrate, a conductive electrode layer, an electro-optic layer, and optionally, an adhesive layer to allow lamination to the backplane. In the case of an OLED display, the electro-optic layer is sandwiched between two electrode layers and is typically built on the TFT array. Generally, at least one of the two electrode layers is transparent, often composed of a transparent conductive oxide such as indium tin oxide (ITO). The electro-optic layer is composed of an organic material capable of emitting light when a voltage is applied across the two electrode layers. The organic light-emitting material may have a stacked structure including a plurality of different organic layers. In addition to one or more emissive layers, the stacked structure may include additional layers such as a hole-injection layer, a hole-transport layer, an electron-transport layer, a hole-blocking layer, and/or an electron-blocking layer to enhance device performance. Individual OLED elements may have different emitters (for example, a red emitter, a green emitter, or a blue emitter) in their emissive layer to provide a colored image. Exemplary OLED device structures and materials are described in U.S. Pat. Nos. 5,707,745, 5,844,363, 6,097,147, 6,303,238, and 8,334,545, the disclosure of each of which is incorporated by reference herein in its entirety for all purposes.

In the case of an e-paper display, the electro-optic layer may be composed of an encapsulated electrophoretic medium. The encapsulated electrophoretic medium generally comprises numerous small capsules, each of which itself comprises an internal phase containing electrophoretically-mobile (e.g., black and/or white) particles suspended in a liquid suspending medium, and a capsule wall surrounding the internal phase. Typically, the capsules are themselves held within a polymeric binder to form a coherent layer positioned between two electrode layers. Most commonly, one electrode layer has the form of a single continuous electrode, while the other electrode layer is patterned into a matrix of pixel electrodes, each of which defines one pixel of the display. Electronic charges are applied to the capsules to bring particles of a selected color to the surface. Electrophoretic media and related display device structures are described in, for example, U.S. Pat. No. 5,930,026; U.S. Pat. No. 6,831,769; U.S. Pat. No. 6,839,158; and U.S. Pat. No. 7,170,670, the disclosure of each of which is incorporated by reference herein in its entirety for all purposes. In addition to electrophoretic displays, other e-paper display technologies include electrowetting displays, and electrofluidic displays as described in, for example, U.S. Pat. No. 7,446,945 and U.S. Pat. No. 8,111,465, the disclosure of each of which is incorporated by reference herein in its entirety for all purposes.

To integrate the TFT array backplane with the frontplane for a completed display system, the bottom or pixel electrode of the frontplane is (connected) to the drain or source electrode of the switching TFT in an e-paper display, and to the driving TFT in an active matrix OLED (AMOLED) display.

Various organic layers on either the frontplane and/or the backplane may be formed on the flexible substrate by solution-phase deposition techniques such as spin-coating, slot coating, die coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Inorganic (e.g., metallic or metal oxide) layers usually are deposited by physical or chemical vapor deposition methods (e.g., sputtering), but may be solution-processed if a soluble precursor is available. The layers may be patterned into specific elements by photolithography, either by use of the intrinsic photosensitivity of the layers (e.g., certain polymeric layers) or by use of a photoresist (e.g., metallic, metal oxide, or small-molecule organic layers).

As will be understood, the dynamically flexible, attachable article or device 10 as described above can be configured and operated in many different manners to perform many different functions at the same or at different times. For example, the device 10 may operate to execute any number of different types of applications including, for example, calendar applications, e-mail applications, web-browsing applications, picture, image or video display applications, stop-watch or other timing applications, alarm clock or alarming applications, location based applications including for example mapping applications, navigational applications, etc. In some cases, various different applications or functionality may be performed simultaneously, and different sections or portions of the flexible display 18 may be used to display information associated with the different applications. For example, one portion of the flexible display 18 may be used to illustrate calendar information provided by a calendar application, another portion of the flexible display 18 may be used to illustrate e-mails associated with an e-mail application and a still further portion of the flexible display 18 may be used to display a clock or stop watch associated with a timing application. Still further, the applications 160 executed on the device 10 may be executed on and display information computed solely with the electronics suite 138 of the device 10. In another case, one or more applications 160 may be executed on the processor 142 of the device 10 to interface with and display information received from external computing devices, such as a mobile phone, a laptop computer, a desktop computer, etc. In this case, the device 10 may act as a slave display device or may operate in conjunction with information received from the external computing device to provide information, graphics, etc., to a user on the flexible display 18 of the device 10. The device 10 may communicate with external devices or an external network via any desired communication hardware, software and communications protocol, including any LAN or WAN based protocol, an NFC protocol, a Bluetooth protocol, an IP protocol, an RFID protocol, etc.

More generally, the user may be able to program or configure the device 10 to operate in any desired manner, including any desired default manner, based on the detected location, position, orientation, or movement of the device 10. In this case, a configuration application may be executed in a processor of a computer device to develop or configure the operation of the device 10, including the various operational modes of the device 10, the various default settings based on the mode of the device 10, the motions or actions or locations that may trigger particular modes of the device 10, inputs or gestures associated with each mode or application of the device 10 and what those inputs or gestures may mean in the context of the device 10, etc.

Figure 36:
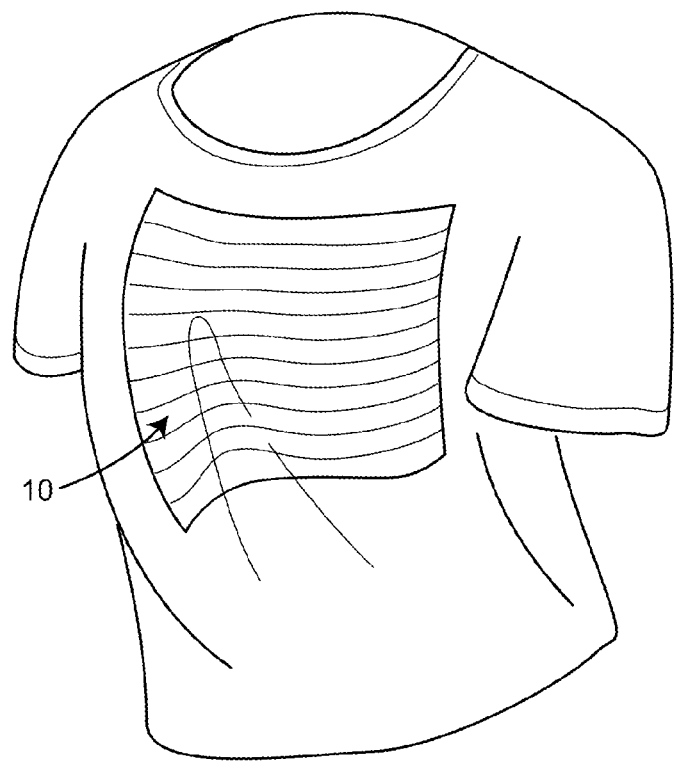
FIG. 36 depicts a flexible attachable display article attached to a piece of clothing in the form of a shirt.
Figure 37:
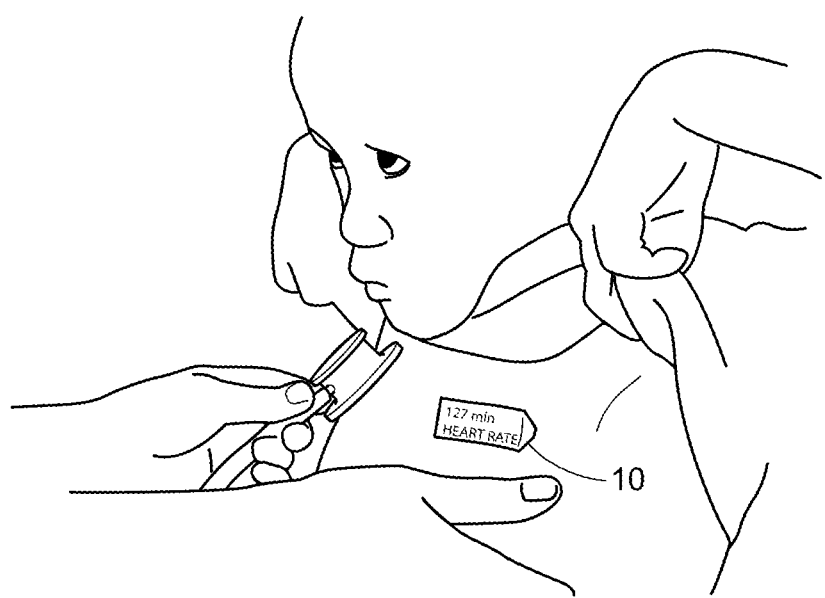
FIG. 37 depicts a flexible attachable display article mounted on a user's skin via low-grade adhesive.

Still further, while the flexible attachable article 10 has been described herein as being placed on or attached to a sleeve or other member that goes on a user's body, the attachable article 10 could be configured to be attached to other surfaces or structures. For example, FIG. 36 depicts a flexible attachable display article 10 attached to a piece of clothing in the form of a shirt. However, the article 10 could be sized appropriately and attached to other clothing articles like shoes, hats, coats, pants, etc., in any of the manners described herein. Likewise, as illustrated in FIG. 37, the flexible attachable display component 10 may be mounted directly on a user's skin using, for example, a low-grade adhesive that allows easy removal. Of course the article 10 can be attached to other surfaces as well using the attachment mechanisms described herein or other attachment mechanisms.

While certain structural features are described herein as being capable of being used by the flexible electronic display 18 and/or the substrate 12 to provide bending limiting motion, bending motion and protection structure, it will be noted that any other features, such as other support and bending limiting features, protection structure and other associated devices and/or configuration applications, uses, etc., described in U.S. Provisional Patent Application Ser. No. 61/920,705; U.S. Provisional Patent Application Ser. No. 61/938,107; U.S. Provisional Patent Application Ser. No. 61/946,412; U.S. Provisional Patent Application Ser. No. 61/969,531; U.S. patent application Ser. No. 14/188,440; and U.S. Patent Provisional Application Ser. No. 62/003,549, which are incorporated by reference herein, may be used in or with the display 18 and/or the substrate 12.

The following additional considerations apply to the foregoing discussion. Throughout this specification, plural instances may implement components, operations, or structures described as a single instance. Although individual operations of one or more routines or methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter of the present disclosure.

Additionally, certain embodiments are described herein as including logic or a number of components, modules, or mechanisms or units. Modules and units may constitute either software modules (e.g., code stored on a non-transitory machine-readable medium) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

A hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also include programmable logic or circuitry (e.g., as encompassed within a general-purpose processor or other programmable processor) that is temporarily configured by software to perform certain operations. It will be appreciated that the decision to implement a hardware module in dedicated and permanently configured circuitry or in temporarily configured circuitry (e.g., configured by software) may be driven by cost and time considerations.

Accordingly, the hardware terms used herein should be understood to encompass tangible entities, be that entities that are physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware and software modules can provide information to, and receive information from, other hardware and/or software modules. Accordingly, the described hardware modules may be regarded as being communicatively coupled. Where multiple of such hardware or software modules exist contemporaneously, communications may be achieved through signal transmission (e.g., over appropriate circuits, lines and buses) that connect the hardware or software modules. In embodiments in which multiple hardware modules or software are configured or instantiated at different times, communications between such hardware or software modules may be achieved, for example, through the storage and retrieval of information in memory structures to which the multiple hardware or software modules have access. For example, one hardware or software module may perform an operation and store the output of that operation in a memory device to which it is communicatively coupled. A further hardware or software module may then, at a later time, access the memory device to retrieve and process the stored output. Hardware and software modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, include processor-implemented modules.

Similarly, the methods or routines described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "application," an "algorithm" or a "routine" is a self-consistent sequence of operations or similar processing leading to a desired result. In this context, applications, algorithms, routines and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" is employed to describe elements and components of the embodiments herein. This is performed merely for convenience and to give a general sense of the description. This description should be read to include one or at least one and the singular also includes the plural unless it is obvious that it is meant otherwise.

Upon reading this disclosure, those of skill in the art will appreciate still additional alternative structural and functional designs for implementing display features via a flexible electronic display on a dynamically flexible, attachable article as disclosed herein. Thus, while particular embodiments and applications have been illustrated and described herein, it is to be understood that the disclosed embodiments are not limited to the precise construction and components disclosed herein. Various modifications, changes and variations, which will be apparent to those skilled in the art, may be made in the arrangement, operation and details of the methods and structure disclosed herein without departing from the spirit and scope defined in the claims.

The invention claimed is:

1. An article, comprising:
   a flexible electronic component configured for bending along a first dimension and along a second dimension different from the first dimension; and
   a flexible support coupled to the flexible electronic component, the flexible support including a bending limiting structure configured to constrain bending of the flexible electronic component along the first and second dimensions to a range within a bending tolerance of the flexible electronic component, wherein the flexible electronic component, when laid in a substantially flat position, defines a two-dimensional area in a reference plane, and wherein the bending limiting structure of the flexible support is configured to constrain bending of the flexible electronic component such that when the flexible electronic component is simultaneously bent along a first bending axis in the first dimension and a second bending axis in the second dimension, a first projection of the first bending axis onto the reference plane and a second projection of the second bending axis onto the reference plane do not intersect at a point located within the two-dimensional area of the reference plane, wherein the bending limiting structure comprises a first substrate and a second substrate movably coupled to the first substrate, a plurality of apertures formed in the first substrate, and a plurality of protrusions coupled to the second substrate and movably disposed within the plurality of apertures, respectively, wherein each aperture of the plurality of apertures comprises a slot, each of the slots defining a plurality of stop surfaces arranged to constrain movement of a respective one of the protrusions movably disposed therein, and wherein each slot is defined by two longitudinally extending portions and two transversely extending portions perpendicular to the longitudinally extending portions.

2. The article of claim 1, wherein the plurality of protrusions comprises a plurality of pins.

3. The article of claim 1, wherein one or more of the slots is further defined by four angled portions, each angled portion being disposed between one of the longitudinally extending portions and one of the transversely extending portions.

4. The article of claim 1, wherein a portion of the first substrate is locally fixedly attached to a portion of the second substrate at a fixation point.

5. The article of claim 1, wherein the flexible support comprises a plurality of defined bending regions.

6. The article of claim 5, wherein the flexible support comprises at least one rigid zone disposed between two or more of the defined bending regions.

7. The article of claim 5, wherein the defined bending regions are angled relative to one another.

8. An article, comprising:
a flexible electronic component configured for bending along a first dimension and along a second dimension different from the first dimension; and
a flexible support coupled to the flexible electronic component, the flexible support including a bending limiting structure configured to constrain bending of the flexible electronic component along the first and second dimensions to a range within a bending tolerance of the flexible electronic component, wherein the flexible electronic component, when laid in a substantially flat position, defines a two-dimensional area in a reference plane, and wherein the bending limiting structure of the flexible support is configured to constrain bending of the flexible electronic component such that when the flexible electronic component is simultaneously bent along a first bending axis in the first dimension and a second bending axis in the second dimension, a first projection of the first bending axis onto the reference plane and a second projection of the second bending axis onto the reference plane do not intersect at a point located within the two-dimensional area of the reference plane, wherein the bending limiting structure comprises a first substrate and a second substrate movably coupled to the first substrate, a plurality of apertures formed in the first substrate, and a plurality of protrusions coupled to the second substrate and movably disposed within the plurality of apertures, respectively, wherein each aperture of the plurality of apertures comprises a slot, each of the slots defining a plurality of stop surfaces arranged to constrain movement of a respective one of the protrusions movably disposed therein, and wherein one or more of the slots define four stop surfaces, the four stop surfaces including first and second stop surfaces arranged to constrain bending of the flexible electronic component in a transverse direction and third and fourth stop surfaces arranged to constrain bending of the flexible electronic component in a longitudinal direction.

9. The article of claim 8, wherein a portion of the first substrate is locally fixedly attached to a portion of the second substrate at a fixation point.

10. The article of claim 8, wherein the flexible support comprises a plurality of defined bending regions.

11. The article of claim 10, wherein the flexible support comprises at least one rigid zone disposed between two or more of the defined bending regions.

12. The article of claim 10, wherein the defined bending regions are angled relative to one another.

13. The article of claim 8, wherein the plurality of protrusions comprises a plurality of pins.

14. An article, comprising:
a flexible electronic component configured for bending along a first bending axis and a second bending axis different from the first bending axis;
a first substrate;
a second substrate movably coupled to the first substrate;
a plurality of slots formed in the first substrate; and
a plurality of protrusions coupled to the second substrate and movably disposed within a corresponding one of the plurality of slots, the plurality of slots defined to allow simultaneous bending of the flexible electronic component along the first bending axis and the second bending axis within a bending range, wherein each slot is defined by two longitudinally extending portions and two transversely extending portions perpendicular to the longitudinally extending portions.

15. The article of claim 14, wherein one or more of the slots is further defined by four angled portions, each angled portion being disposed between one of the longitudinally extending portions and one of the transversely extending portions.

16. The article of claim 14, wherein a portion of the first substrate is locally fixedly attached to a portion of the second substrate at a fixation point.

17. An article, comprising:
a flexible electronic component configured for bending along a first bending axis and a second bending axis different from the first bending axis;
a first substrate;
a second substrate movably coupled to the first substrate;
a plurality of slots formed in the first substrate; and
a plurality of protrusions coupled to the second substrate and movably disposed within a corresponding one of the plurality of slots, the plurality of slots defined to allow simultaneous bending of the flexible electronic component along the first bending axis and the second bending axis within a bending range, wherein one or more of the slots define four stop surfaces, the four stop surfaces including first and second stop surfaces arranged to constrain bending of the flexible electronic component in a transverse direction and third and fourth stop surfaces arranged to constrain bending of the flexible electronic component in a longitudinal direction.

18. The article of claim 17, wherein a portion of the first substrate is locally fixedly attached to a portion of the second substrate at a fixation point.

* * * * *